(12) United States Patent (10) Patent No.: US 7,687,822 B2
Nagai et al. (45) Date of Patent: Mar. 30, 2010

(54) LIGHT EMITTING APPARATUS

(75) Inventors: Youichi Nagai, Itami (JP); Makoto Kiyama, Itami (JP); Takao Nakamura, Itami (JP); Takashi Sakurada, Itami (JP); Katsushi Akita, Itami (JP); Koji Uematsu, Itami (JP); Ayako Ikeda, Itami (JP); Koji Katayama, Itami (JP); Susumu Yoshimoto, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 278 days.

(21) Appl. No.: 11/727,425

(22) Filed: Mar. 27, 2007

(65) Prior Publication Data

US 2008/0210959 A1 Sep. 4, 2008

Related U.S. Application Data

(62) Division of application No. 10/923,046, filed on Aug. 23, 2004, now Pat. No. 7,202,509.

(30) Foreign Application Priority Data

Aug. 26, 2003 (JP) ............................. 2003-301706
Dec. 25, 2003 (JP) ............................. 2003-429818

(51) Int. Cl.
*H01L 33/00* (2006.01)
(52) U.S. Cl. ........................... 257/99; 257/101; 257/102
(58) Field of Classification Search ........... 257/79–103, 257/E29.072, E29.081
See application file for complete search history.

(56) References Cited

U.S. PATENT DOCUMENTS 5,665,986 A 9/1997 Miura et al.

(Continued)

FOREIGN PATENT DOCUMENTS

CN 1137690 A 12/1996

(Continued)

OTHER PUBLICATIONS

Chinese Office Action, with English translation, issued in Chinese Patent Application No. CN 2004800098998, mailed Sep. 7, 2007.

(Continued)

*Primary Examiner*—Cuong Q Nguyen
(74) *Attorney, Agent, or Firm*—McDermott Will & Emery LLP

(57) ABSTRACT

In order to provide light emitting devices which have simple constructions and thus can be fabricated easily, and can stably provide high light emission efficiencies for a long time period, a light emitting device includes an n-type nitride semiconductor layer at a first main surface side of a nitride semiconductor substrate, a p-type nitride semiconductor layer placed more distantly from the nitride semiconductor substrate than the n-type nitride semiconductor layer at the first main surface side and a light emitting layer placed between the n-type nitride semiconductor layer and the p-type nitride semiconductor layer at the first main surface side. The nitride semiconductor substrate has a resistivity of 0.5 Ω·cm or less and the p-type nitride semiconductor layer side is down-mounted so that light is emitted from the second main surface of the nitride semiconductor substrate at the opposite side from the first main surface.

2 Claims, 29 Drawing Sheets

U.S. PATENT DOCUMENTS

| | | |
|---|---|---|
| 6,337,536 B1 | 1/2002 | Matsubara et al. |
| 6,509,651 B1 | 1/2003 | Matsubara et al. |
| 6,514,782 B1 | 2/2003 | Wierer, Jr. et al. |
| 6,614,821 B1 | 9/2003 | Jikutani et al. |
| 6,858,877 B2 * | 2/2005 | Kawaguchi et al. ............ 257/97 |
| 7,190,004 B2 * | 3/2007 | Nagai et al. .................. 257/102 |
| 7,456,442 B2 * | 11/2008 | Munns ........................ 257/190 |
| 2001/0032985 A1 | 10/2001 | Bhat et al. |
| 2002/0011599 A1 | 1/2002 | Motoki et al. |
| 2003/0207146 A1 | 11/2003 | Sasaki et al. |
| 2004/0012032 A1 | 1/2004 | Toda et al. |
| 2004/0041256 A1 | 3/2004 | Takehara et al. |
| 2004/0048068 A1 | 3/2004 | Yano et al. |
| 2004/0180470 A1 | 9/2004 | Romano et al. |
| 2004/0251471 A1 | 12/2004 | Dwilinski et al. |
| 2004/0261692 A1 | 12/2004 | Dwilinski et al. |
| 2005/0029539 A1 | 2/2005 | Toda et al. |
| 2005/0062060 A1 | 3/2005 | Nagai et al. |
| 2005/0087753 A1 | 4/2005 | D'Evelyn et al. |
| 2006/0157717 A1 | 7/2006 | Nagai et al. |

FOREIGN PATENT DOCUMENTS

| | | |
|---|---|---|
| CN | 1237795 A | 12/1999 |
| CN | 1400675 A | 3/2003 |
| JP | 54-55390 | 5/1979 |
| JP | 54-055390 | 5/1979 |
| JP | 05-251739 | 9/1993 |
| JP | 8-279627 | 10/1996 |
| JP | 10-74980 | 3/1998 |
| JP | 10-097200 | 4/1998 |
| JP | 10-097201 | 4/1998 |
| JP | 10-117016 | 5/1998 |
| JP | 10-223021 | 8/1998 |
| JP | 10-335701 | 12/1998 |
| JP | 11-54801 | 2/1999 |
| JP | 11-074558 | 3/1999 |
| JP | 11-186662 | 7/1999 |
| JP | 11-191533 | 7/1999 |
| JP | 11-220176 | 8/1999 |
| JP | 11-233893 | 8/1999 |
| JP | 11-317546 | 11/1999 |
| JP | 2000-012900 A | 1/2000 |
| JP | 2000-044400 A | 2/2000 |
| JP | 2000-049374 | 2/2000 |
| JP | 2000-49374 | 2/2000 |
| JP | 2000-077713 | 3/2000 |
| JP | 2000-223743 A | 8/2000 |
| JP | 2000-223751 A | 8/2000 |
| JP | 2000-286457 | 10/2000 |
| JP | 2001-060719 A | 3/2001 |
| JP | 2001-237458 | 8/2001 |
| JP | 2001-326425 A | 11/2001 |
| JP | 2000-026394 A | 1/2002 |
| JP | 2002-16311 | 1/2002 |
| JP | 2002-016311 A | 1/2002 |
| JP | 2002-026394 A | 1/2002 |
| JP | 2002-319705 | 10/2002 |
| JP | 2002-353516 | 12/2002 |
| JP | 2003-8083 | 1/2003 |
| JP | 2003-46124 | 2/2003 |
| JP | 2003-046124 A | 2/2003 |
| JP | 2003-69075 | 3/2003 |
| JP | 2003-069075 A | 3/2003 |
| JP | 2003-086843 A | 3/2003 |
| JP | 2003-101081 A | 4/2003 |
| JP | 2003-110152 | 4/2003 |
| JP | 2003-110152 A | 4/2003 |
| JP | 2003-124115 A | 4/2003 |
| JP | 2003-165799 A | 6/2003 |
| JP | 2003-183100 A | 7/2003 |
| JP | 2003-218401 A | 7/2003 |
| JP | 2005-210053 | 8/2005 |
| WO | WO 03/043150 A1 | 5/2003 |

OTHER PUBLICATIONS

SEI World, vol. 298, p. 3 (With Partial English Translation).
SEI World, vol. 308, p. 3 (With Partial English Translation).
Chinese Office Action, w/ English translation thereof, issued in Chinese Patent Application No. CN 200410098298.0 dated Dec. 28, 2007.

* cited by examiner

DISTANCE r IN THE RADIAL DIRECTION
FROM THE CENTER OF ACTIVE LAYER (MQW)(mm)
(CURRENT SPREAD DISTANCE)

L₁=8mm

EXEMPLARY OFF ANGLE DISTRIBUTION
IN GaN SUBSTRATE (20mm × 20mm)

PITCH 3 μm

TOTAL REFLECTIVITY 86%

TOTAL REFLECTIVITY 67%

40% REFLECTION AT Ni/Au

LIGHT EMITTING APPARATUS

RELATED APPLICATIONS

This application is a divisional of U.S. patent application Ser. No. 10/923,046, filed Aug. 23, 2004 now U.S. Pat. No. 7,202,509, which claims priority from Japanese Patent Application Nos. JP 2003-301706 filed Aug. 26, 2003 and JP 2003-429818 filed Dec. 25, 2003 the contents of which are hereby incorporated by reference.

BACKGROUND OF THE INVENTION

1. Field of the Invention

The present invention relates to light emitting apparatuses and more particularly to light emitting apparatuses formed from nitride semiconductors. A light emitting apparatus of the present invention refers to a semiconductor device or semiconductor chip mainly constituted by a nitride semiconductor substrate and semiconductor layers laminated thereon in some cases and also refers to a device including a semiconductor chip mounted on a mounting component and sealed with resin in some cases. Also, it may refer to the both in some cases. Further, a semiconductor chip is called a chip in some cases. Further, a substrate and epitaxial layers formed thereon in a chip are simply called a substrate in some cases.

2. Description of the Background Art

Currently, white light emitting diodes (LEDs) have been widely employed for illumination of compact electronic equipment such as portable information terminals and have the potentiality to be utilized for illumination for larger spaces or larger areas in the future. In order to utilize LEDs for illumination for larger spaces or larger areas, it is required to increase the light outputs of LEDs. Therefore, there is a need to enable flowing large currents through the electrodes of LEDs and overcome a problem of temperature increases caused by heat generation.

FIG. 59 illustrates the construction of a GaN-based LED which has been currently proposed (Japanese Patent Laying-Open No. 2003-8083). In this GaN-based LED, an n-type GaN layer 102 is provided on a sapphire substrate 101 and a quantum-well construction 103 is formed between n-type GaN layer 102 and a p-type GaN layer 104. Light emission occurs at quantum-well construction 103. On p-type GaN layer 104, a p-electrode 105 is formed to be in ohmic contact and on n-type GaN layer 102 an n-electrode 106 is formed to be in ohmic contact.

These p-electrode 105 and n-electrode 106 are connected to a mounting component 109 through solder balls 107, 108. The mounting component (sub-mount component) is formed from an Si substrate and provided with circuits for protection against surge voltages from the outside. Namely, in order to prevent large forward voltages or reverse voltages from being applied to the light emitting apparatus, the electrical power branching circuit for protecting the light emitting apparatus is constituted by Zener diodes, etc., placing emphasis on that main factors of circuit failure for semiconductor of a nitride of Ga, Al, In or other group III element are surge voltages such as transient voltage and static discharge. Protection against surge voltages will be described in detail later.

The above GaN-based LED is characterized in that (a1) p-type GaN layer 104 is down-mounted and (a2) n-electrode layer 106 is formed on n-type GaN layer 102 so that light is emitted from the backside of sapphire substrate 101. The construction of the GaN-based LED is significantly complicated as can be seen in FIG. 59. The reason that (a2) the n-electrode layer is formed on n-type GaN layer 102, which is the cause of such a complicated construction, is that sapphire substrate 101 is an insulator and the n-electrode can not be provided on the sapphire substrate.

As well as the above light emitting apparatus employing a sapphire substrate, there has been often suggested that circuits for protection against transient voltages and static discharge are provided in light emitting apparatuses employing GaAs-based, GaP-based, or GaN-based compound semiconductors for use in light emitting apparatus (Japanese Patent Laying-Open Nos. 2000-286457, 11-54801 and 11-220176). Particularly, in the case of GaN-based compound semiconductors, the breakdown strengths in the reverse direction are about 50 V and thus are low, and also the breakdown strengths for the forward voltage are only about 150 V. Therefore, there has been importance attached to providing an electrical power branching circuit for the above protection. Namely, the above GaN-based chip, etc., is formed on the Si substrate of the sub-mount and on the Si substrate the protection circuit including Zener diodes is constituted. It can be said that suggestions of many protection circuits as above are the proof of that main factors of circuit failure for semiconductor of a nitride of Ga, Al, In or other group III element are surge voltages such as transient voltage and static discharge.

Besides the light emitting apparatus provided with the above protection circuits, there have been known examples of forming a GaN-based light emitting apparatus on a conductive SiC substrate. Namely, LEDs constructed to emit light from a p-type GaN layer using a laminate construction of (n-electrode on the SiC substrate backside/SiC substrate/n-type GaN layer/quantum-well laminate construction (light emitting layer)/p-type GaN layer/p-electrode) have been also widely utilized.

In the case of GaN-based LEDs using a sapphire substrate illustrated in FIG. 59, the construction is complicated and the fabrication cast will be unavoidably increased. In order to develop the demand in large space illumination applications, LEDs are required to be cheap, and thus the aforementioned construction is not desirable. Furthermore, since p-electrode 105 and n-electrode 106 are placed on the down-mounted surface side, the areas of the electrodes, particularly the area of the p-electrode, is restricted. In order to enable flowing large currents to achieve high outputs, it is desired that the p-electrode has particularly a larger area. However, with the construction illustrated in FIG. 59, the area of the p-electrode is restricted and accordingly the light output is restricted. Further, in discharging heat generated in association with currents, providing two electrodes on one side is not desirable.

Furthermore, there is large resistance to currents flowing in the direction parallel to the substrate through n-type GaN layer 102, which causes heat generation and an increase of the driving voltage and, therefore, an increase of the power consumption. Particularly, if the thickness of the n-type GaN layer is reduced in order to shorten the film forming processes, the yield of exposure of the n-type GaN film will be significantly degraded, besides the above problem of heat generation and power consumption increases.

Further, as can be said in general for light emitting devices including the above light emitting device employing a sapphire substrate, since the heat radiating area is restricted and also the heat resistance (temperature increase caused by unit introduced energy per unit area) is large, the injection current per light emitting apparatus can not be increased. Particularly, in the case of using a sapphire substrate, since the area of the p-electrode is restricted, it is common to heat-design the apparatus with little margin.

Further, in the case of GaN-based LEDs using a sapphire substrate, since the heat radiating area is restricted, in order to reduce the electrical resistance as much as possible to reduce heat generation, it becomes necessary to employ a construction in which the p-electrode and the n-electrode are complicated in a comb shape to widen the contact area. Processing of such a comb-shaped electrode is not easy and the fabrication cost will be certainly increased.

As previously described, the design of heat conditions is basically important for light emitting apparatuses and when an attempt is made to obtain high outputs, there will be restriction due to heat conditions as above. Therefore, in order to alleviate this as much as possible, a complicated electrode shape must be employed.

Further, there are the following problems. In the case where a GaN-based light emitting apparatus formed on a sapphire substrate is down-mounted so that the back side of the sapphire substrate forms the light emitting surface, light with an incident angle greater than a predetermined angle experiences total internal reflection at the interface between the GaN layers which generate and propagate light and the sapphire substrate, and thus the light will not be emitted to the outside, since the refractive index of sapphire is about 1.8 and the refractive index of GaN is about 2.4. Namely, lights with incident angles $\theta \geq \sin^{-1}(1.8/2.4) \approx 4.2°$ will remain within the GaN layers and will not be emitted to the outside. Consequently, the light emission efficiency at the main surface of the sapphire substrate will be degraded. Although the problem of the light emission efficiency is important, there are still other problems. The light experienced the above total internal reflection propagates through the GaN layers and is emitted from the side portions of the GaN layers. Since the ratio of the light which experiences the above total internal reflection is significantly large and also the GaN layers are thin, the energy density of light emitted from the side portions becomes large. The sealing resin placed at the side portions of the GaN layers and irradiated with the light is damaged and this causes a problem of shortening the life of the light emitting apparatus.

In the case of a GaN-based LED having a construction of (SiC substrate backside n-electrode/SiC substrate/n-type GaN layer/quantum-well laminate construction (light emitting layer)/p-type GaN layer/p-electrode) for extracting light from the p-layers side, the light absorption ratio at the p-electrode is large and thus high light outputs can not be emitted to the outside efficiently. When an attempt is made to reduce the coverage ratio of the p-electrode and namely increase the opening ratio to increase the amount of light emission, currents can not be flowed through the entire p-type GaN layer because of the high electrical resistance of the p-type GaN layer. Consequently, light emission can not be activated through the entire quantum-well construction, and thus the light emission output is decreased. Further, the electrical resistance will be increased and this will induce a problem of heat generation and power supply capacity. Also, if the thickness of the p-type GaN layer is increased in order to flow currents uniformly through the entire p-type GaN layer, the light absorption at the p-type GaN layer becomes large and the output will be restricted.

SUMMARY OF THE INVENTION

It is an object of the present invention to provide light emitting apparatuses which have simple constructions and thus can be fabricated easily, and can stably provide high light emission efficiencies for a long time period.

A light emitting apparatus according to the present invention is a light emitting apparatus including a nitride semiconductor substrate, an n-type nitride semiconductor layer at a first main surface side of the nitride semiconductor substrate, a p-type nitride semiconductor layer placed more distantly from the nitride semiconductor substrate than the n-type nitride semiconductor layer at the first main surface side and a light emitting layer placed between the n-type nitride semiconductor layer and the p-type nitride semiconductor layer at the first main surface side. In this light emitting apparatus, the nitride semiconductor substrate has a resistivity of 0.5 Ω·cm or less and the p-type nitride semiconductor layer side is down-mounted so that light is emitted from the second main surface of the nitride semiconductor substrate at the opposite side from the first main surface.

With this construction, the n-type electrode is provided on the backside (second main surface) of the nitride semiconductor substrate with a low electrical resistance. Therefore, even when the n-electrode is provided with a low coverage ratio or high opening ratio, currents can be flowed through the entire nitride semiconductor substrate. Thus, the light absorption ratio at the emitting surface becomes lower and the light emission efficiency may be increased. Further, it goes without saying that light emission may occur at the side surfaces as well as at the second main surface. The same holds for the following light emitting apparatuses.

Further, the p-type nitride semiconductor layer side having a high electrical resistance does not form a light emitting surface and therefore the p-type electrode layer may be formed on the entire surface of the p-type nitride semiconductor layer. This construction is advantageous in flowing large currents and suppressing heat generation and in discharging generated heat by conduction. Namely, restrictions caused by heat requirements may be drastically alleviated. Thus, there is no need to form a comb-shaped electrode in which the n-electrode and the p-electrode are complicated in order to reduce the electrical resistance.

Since the GaN substrate has an excellent conductivity, there is no need to provide a protection circuit against surge voltages and the breakdown strength may be made significantly higher.

Further, complicated process steps are not performed and the fabrication cost may be easily reduced.

Further, the nitride semiconductor "substrate" refers to a thick plate member which may be independently portable and has a proper thickness and is differentiated from "films" or "layers" which are not independently and easily portable with their shapes kept. The same holds for a GaN substrate and AlN substrate which will be described later.

Another light emitting apparatus of the present invention is a light emitting apparatus including a GaN substrate which is a nitride semiconductor substrate, an n-type $Al_xGa_{1-x}N$ layer (x is in the range of from 0 to 1) which is an n-type nitride semiconductor layer at a first main surface side of the GaN substrate, a p-type $Al_xGa_{1-x}N$ layer (x is in the range of from 0 to 1) placed more distantly from the GaN substrate than the n-type $Al_xGa_{1-x}N$ layer at the first main surface side, and a light emitting layer placed between the n-type $Al_xGa_{1-x}N$ layer and the p-type $Al_xGa_{1-x}N$ layer at the first main surface side. In this light emitting apparatus, the GaN substrate has a dislocation density of $10^8/cm^2$ or less, and the p-type $Al_xGa_{1-x}N$ layer side is down-mounted so that light is emitted from the second main surface of the nitride semiconductor substrate at the opposite side from the first main surface.

This construction is predicated on that the above GaN substrate of the present invention has a conductivity and the electrical resistance may be easily reduced. In addition to the effects of the aforementioned light emitting apparatus, since the GaN substrate has a dislocation density of $10^8/cm^2$ or less and the crystallinity is high and also the opening ratio is high, the light output from the second main surface may be increased. Further, light is emitted from the side surfaces.

Further, the continuousness of the refractive index is maintained and the problem of the aforementioned total internal reflection will not occur.

A further light emitting apparatus of the present invention is a light emitting apparatus including a conductive AlN substrate which is a nitride semiconductor substrate, an n-type $Al_xGa_{1-x}N$ layer ($0 \leq x \leq 1$) which is an n-type nitride semiconductor layer at a first main surface side of the AlN substrate, a p-type $Al_xGa_{1-x}N$ layer ($0 \leq x \leq 1$) placed more distantly from the AlN substrate than the n-type $Al_xGa_{1-x}N$ layer at the first main surface side, and a light emitting layer placed between the n-type $Al_xGa_{1-x}N$ layer and the p-type $Al_xGa_{1-x}N$ layer at the first main surface side. The above AlN substrate has a heat conductivity of 100 W/(m·K) or higher, and the p-type $Al_xGa_{1-x}N$ layer side is down-mounted so that light is emitted from the second main surface of the AlN substrate at the opposite side from the first main surface.

AlN has a significantly high heat conductivity and thus is excellent in heat dissipation ability. Therefore, it is possible to suppress temperature increases in the light emitting apparatus by transferring heat from the above p-type $Al_xGa_{1-x}N$ layer to the lead frame, etc. Further, the above AlN substrate also dissipates heat, which contributes to suppression of temperature increases. Further, this construction is predicated on that the AlN substrate is a conductive AlN substrate into which impurities have been implanted to provide a conductivity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Either GaN substrates with a dislocation density equal to or less than $10^8/cm^2$ or AlN substrates with a thermal conductivity equal to or higher than 100 W/(m·K) satisfy the condition of the above nitride semiconductor substrate that the resistivity is equal to or lower than 0.5 Ω·cm. The selective embodiments of the light emitting device of the present invention including the aforementioned nitride semiconductor substrates are applicable as other selective embodiments of the light emitting devices of the present invention employing a GaN substrate or an AlN substrate as the semiconductor substrate by employing, as the substrate, a GaN substrate or an AlN substrate, which are one of nitride semiconductor substrate.

Then, embodiments of the present invention will be described using drawings.

First Embodiment

Figure 1:
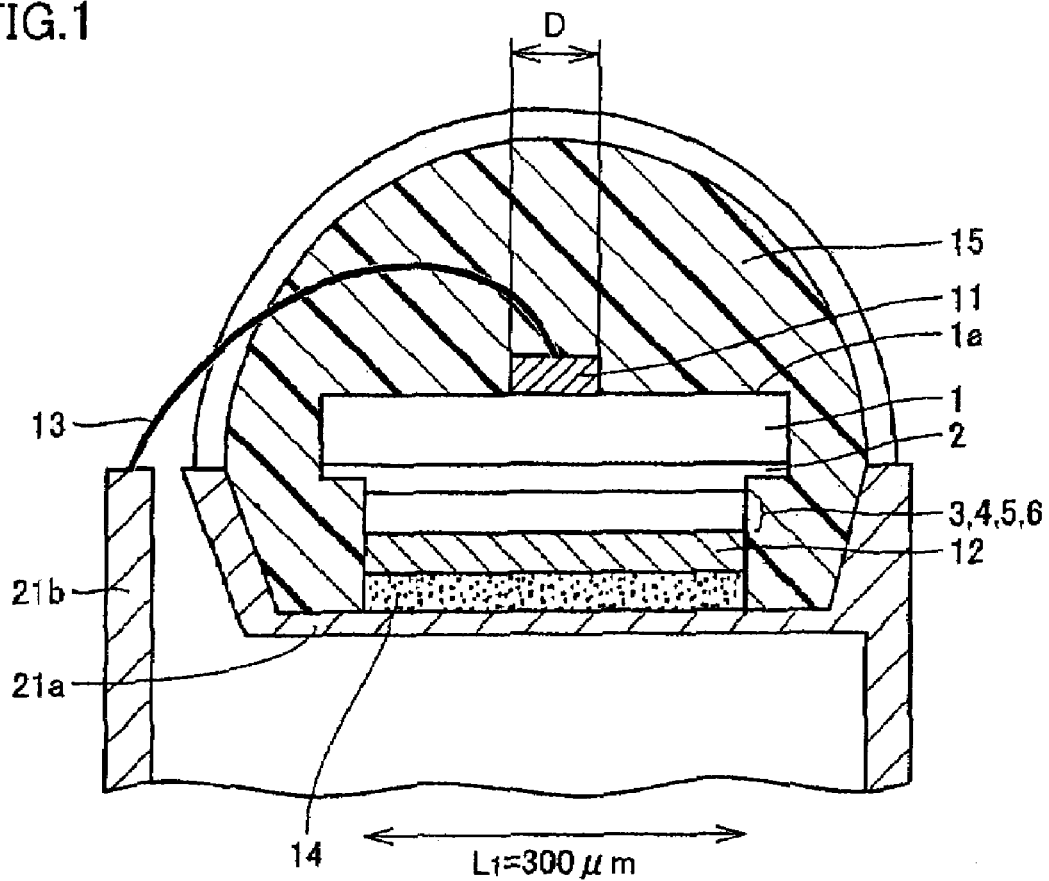
FIG. 1 is an illustration showing an LED of Inventive Example A according to a first embodiment of the present invention.

First, a comparison will be made between a sapphire substrate and a GaN substrate, which is a nitride semiconductor. substrate. FIG. 1 is an illustration showing an LED of an Inventive Example A according to a first embodiment of the present invention. There has been formed a laminate construction including a light emitting layer, which will be described later, on a first main surface side of a GaN substrate 1 and a p-electrode 12 has been formed thereon. This embodiment has a characteristic that this p-electrode 12 is down-mounted to a lead frame mount portion 21a with a conductive adhesive 14.

A second main surface 1a of GaN substrate 1 is the surface which emits light generated at the light emitting layer and an n-electrode 11 is provided on this surface. This n-electrode 11 is formed not to cover the entire surface of the second main surface. It is important to make the ratio of the portion that has not been covered with n-electrode 11 larger. When the opening ratio is made larger, the amount of light shielded by the n-electrode will decrease and therefore the emission efficiency of light emitted outside will be increased.

Figure 2:
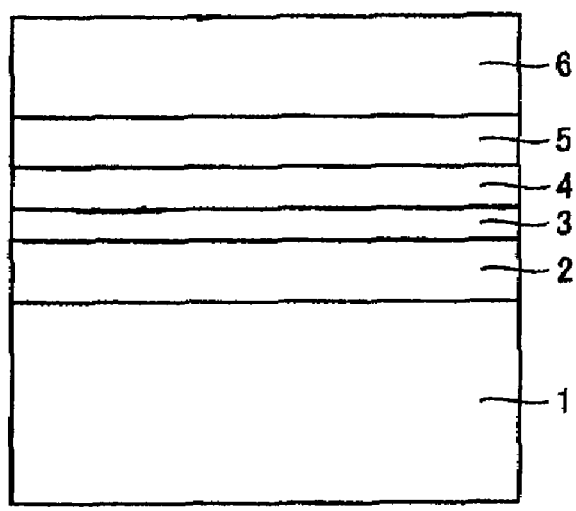
FIG. 2 is an illustration showing the laminate construction including a light emitting layer of the LED of FIG. 1.

N-electrode 11 is electrically connected to a lead portion 21b of a lead frame through a wire 13. Wire 13 and the aforementioned laminate construction are sealed with an epoxy resin 15. The laminate construction from GaN substrate 1 to p-electrode 12, of the aforementioned construction, is enlarged in FIG. 2. In FIG. 2, the laminate construction of FIG. 1 is shown upside down.

Referring to FIG. 2, an n-type GaN epitaxial layer 2 is placed on GaN substrate 1 and an n-type $Al_xGa_{1-x}N$ layer 3 is formed thereon. Further, there is formed thereon a quantum well (MQW) 4 consisting of $Al_xGa_{1-x}N$ layers and $Al_xIn_yGa_{1-x-y}N$ layers. A p-type $Al_xGa_{1-x}N$ layer 5 is placed such that quantum well 4 is sandwiched by p-type $Al_xGa_{1-x}N$ layer 5 and n-type $Al_xGa_{1-x}N$ layer 3, and a p-type GaN layer 6 is placed thereon. In the aforementioned construction, quantum well 4 causes light emission. Further, as illustrated in FIG. 1, a p-electrode 12 is formed to cover the entire surface of p-type GaN layer 6 and is down-mounted. Next, a fabricating method of the LED of Inventive Example A will be described.

(a1) A GaN off-substrate angled by 0.5° with respect to the c-plane was employed. This substrate has a resistivity of 0.01 Ω·cm, a dislocation density of 1 E7/cm² and a thickness of 400 μm.

(a2) The following laminate construction was fabricated on the Ga surface, which is a first surface, of the GaN substrate by MOCVD (Metal Organic Chemical Vapor Deposition). (Si-doped n-type GaN layer/a Si-doped n-type $Al_{0.2}Ga_{0.8}N$ layer being a clad layer/MQW (Multi-Quantum Well) which consists of three layers, each being a two-layers construction comprised of a GaN layer and an $In_{0.15}Ga_{0.85}N$ layer/a Mg-doped p-type $Al_{0.2}Ga_{0.8}N$ layer being a clad layer/a Mg-doped p-type GaN layer).

(a3) The light emission wavelength was 450 nm and the internal quantum efficiency was 50%, which was calculated by, for convenience, comparing the PL (Photo Luminescence) intensity at the low temperature 4.2 K and the PL intensity at a room temperature of 298 K.

(a4) This wafer was activated to lower the resistance of the Mg-doped p-type layer. The Mg-doped p-type AlGaN layer and the Mg-doped p-type GaN layer had carrier concentrations of $5E17/cm^3$ and $1E18/cm^3$, respectively, which were determined by hall measurement.

Figure 3:
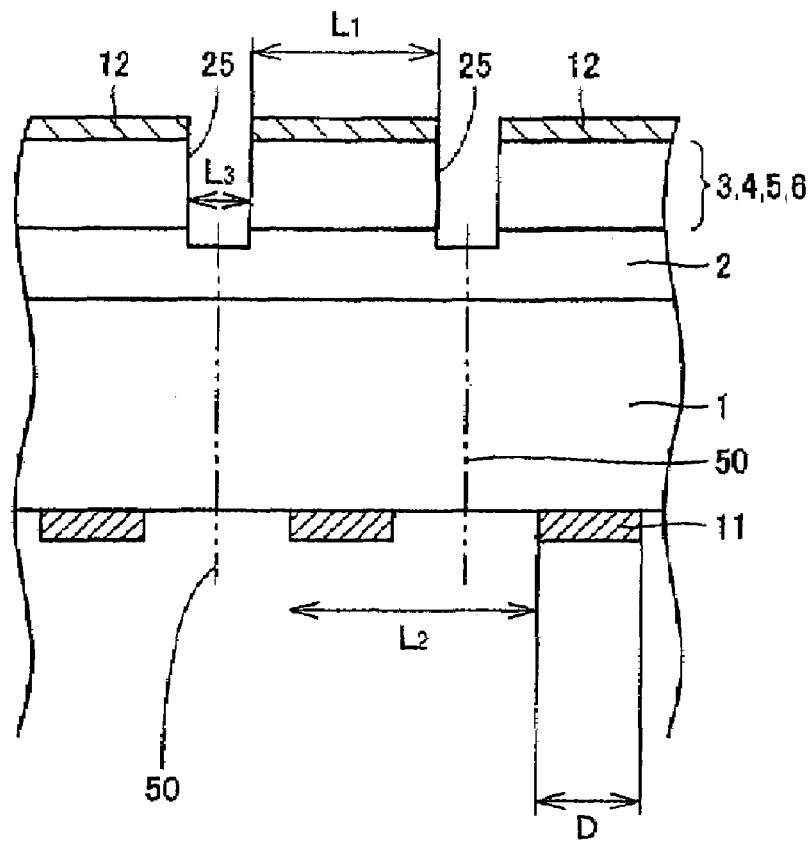
FIG. 3 is an illustration showing the state of a wafer when taking chips of a laminate construction out of the wafer.

(a5) This wafer was etched by photolithography technique and RIE (Reactive Ion Etching) from the Mg-doped p-type layers side to the Si-doped n-type layers. By this etching, device separation slots 25 were formed to achieve device separation as illustrated in FIG. 3. The device separation slot had a width L3 of 100 μm.

Figure 4:
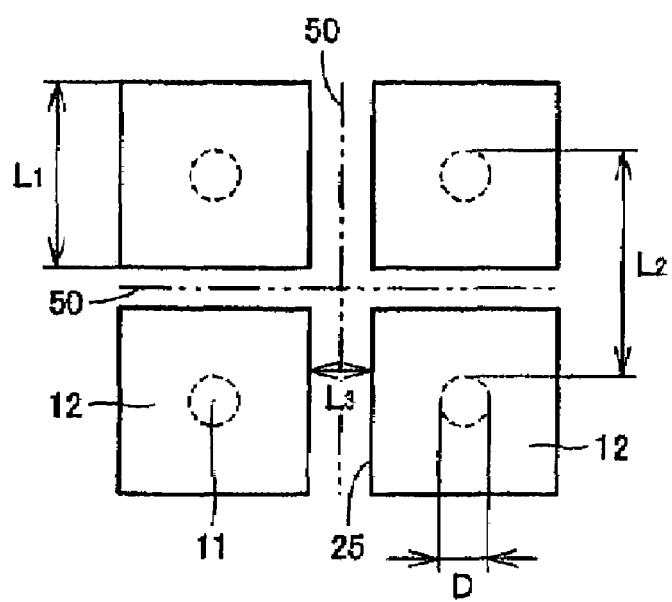
FIG. 4 is an illustration showing the placement of the electrodes of FIG. 3.

(a6) On the N-surface at the back side of the GaN substrate, which was the second main surface, n-electrodes with a diameter(D) of 100 μm were formed at the centers of the chips with a pitch of 400 μm by photolithography technique, vapor deposition and lift-off method (see FIGS. 3 and 4). As the n-electrodes, a laminate construction consisting, from the bottom side, of (a Ti layer 20 nm/an Al layer 100 nm/a Ti layer 20 nm/an Au layer 200 nm) was formed in contact with the GaN substrate. This was heated in the atmosphere of nitrogen ($N_2$) to lower the contact resistance to below $1E-5\ \Omega \cdot cm^2$.

(a7) As the p-electrode, an Ni layer with a thickness of 4 nm was formed in contact with the p-type GaN layer and an Au layer with a thickness of 4 nm is formed on the entire surface thereof (see FIGS. 3 and 4). This was heat-treated in the atmosphere of inert gas to change the contact resistance to $5E-4\ \Omega \cdot cm^2$.

(a8) Subsequently, as illustrated in FIGS. 3 and 4, the above construction was scribed to form chip boundaries 50 as the side walls. The chipped constructions were made to be light emitting devices. A chipped light emitting device had a light emitting surface with a shape of 300 μm square (a square with a side length of 300 μm) and had a light emitting layer with a shape of 300 μm square. Namely, as illustrated in FIG. 4, L1=300 μm and L2=400 μm. Further, the width L3 of the device separation slot=100 μm and the diameter D of the n electrode=100 μm.

(a9) Referring to FIG. 1, the above chip was mounted on the mount portion 21a of a lead frame such that the p-type GaN layer side of the above chip was in contact with the mount portion 21a to form a light emitting device. The light emitting device and the mount were secured to each other and conduction was established therebetween by a conductive adhesive 14 applied to the mount portion.

(a10) In order to facilitate heat radiation from the light emitting device, the light emitting device was mounted to the mount portion such that the entire surface of the p-type GaN layer of the light emitting device was in contact with the mount portion. Further, as the adhesive, an Ag-based adhesive with high heat conductivity was selected, and as the lead frame, a CuW-based lead frame with high conductivity was selected. Consequently, the resultant heat resistance was 8° C./W.

(a11) Further, conduction was established between the n-electrode and the lead portion of the lead frame by wire bonding, and then the light emitting device was sealed with an epoxy resin to make the light emitting device to be a lamp.

Figure 5:
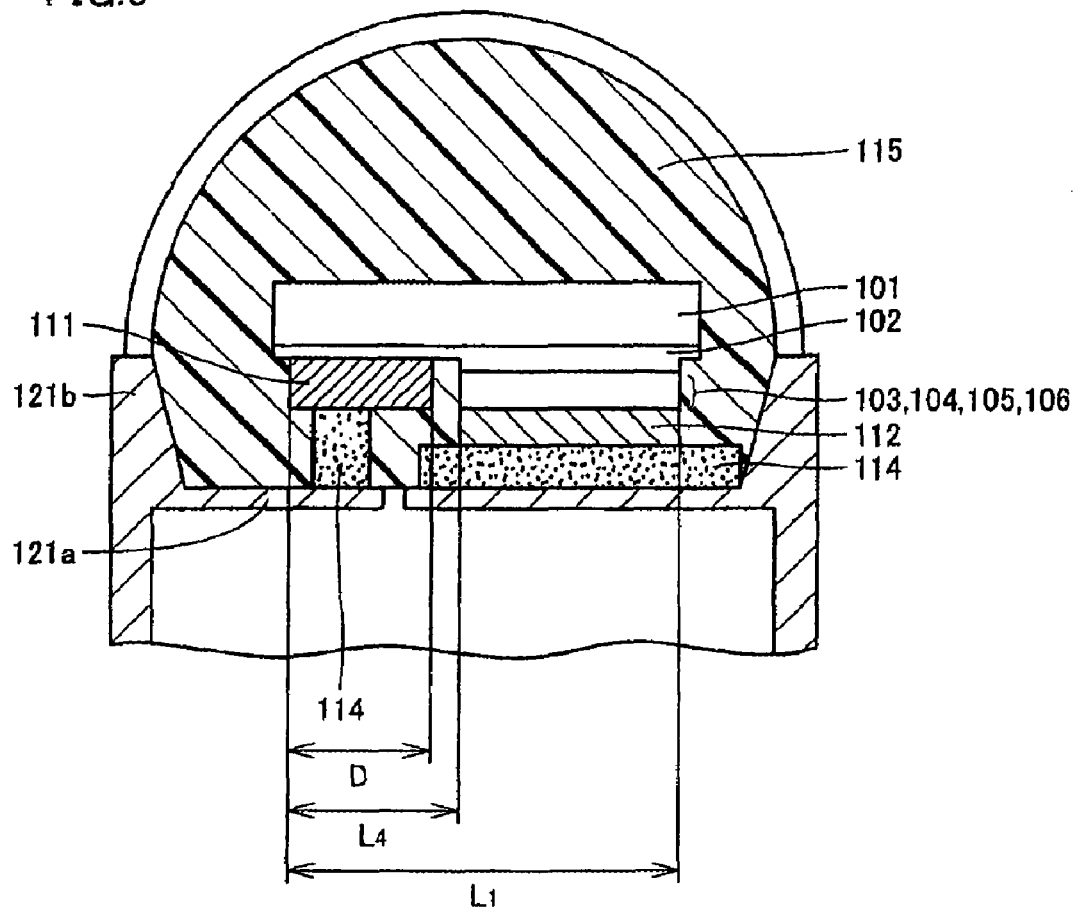
FIG. 5 is an illustration showing Comparative Example B.

Next, a Comparative Example B will be briefly described. In FIG. 5, a p-electrode 112 is down-mounted on the lead frame mount portion by conductive adhesive 114. Further, the n electrode is connected to a lead frame mount portion 121a separated from the lead mount portion to which the p-electrode is connected. A laminate construction (FIG. 6) including a light emitting layer is formed thereon and is contacted with a predetermined area of n-type GaN layer 102. An n-type GaN layer 102 is formed on a sapphire substrate 101 and an n-electrode 111 is formed on the area outside of the area with which the aforementioned laminate construction is contacted. The n-electrode 111 is electrically connected to a lead frame mount portion 121a or a lead frame lead portion 121b through a wire or conductive adhesive. Light emitted from the light emitting layer is emitted outside through sapphire substrate 101. An epoxy resin 115 is encapsulated to cover the aforementioned laminate construction including the sapphire substrate.

(b1) A sapphire insulating off-substrate angled by 0.2° with respect to the c-plane was employed. The sapphire substrate had a thickness of 400 μm.

(b2) to (b4) The same processes as (a2) to (a4) in Inventive Example A were applied to the sapphire substrate.

Figure 7:
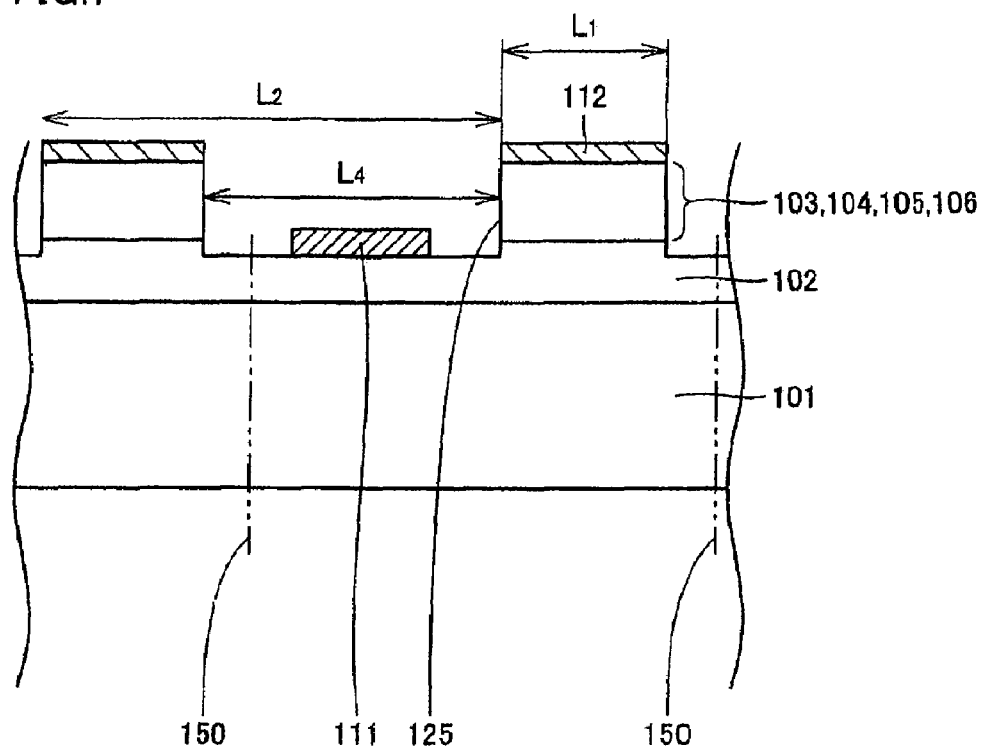
FIG. 7 is an illustration showing the state of a wafer when taking chips having the laminate construction of Comparative Example B out of the wafer.
Figure 8:
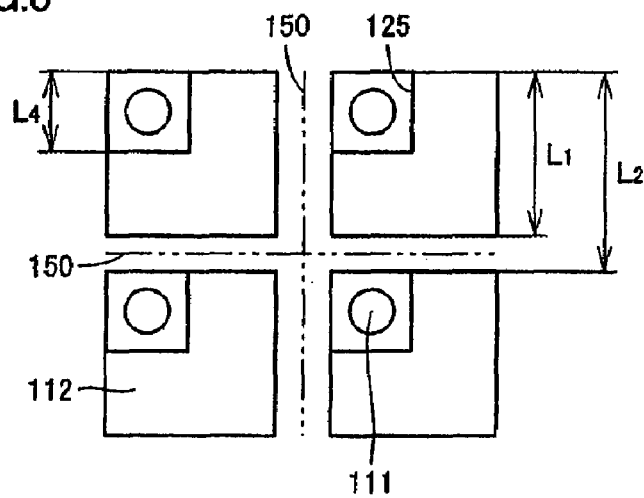
FIG. 8 is an illustration showing the placement of the electrodes of FIG. 7.

(b5) In the case of Comparative Example B, the sapphire substrate is an insulator and therefore the n-electrode must be formed on the grown-films side, similarly to the p-electrode. Therefore, this wafer was etched from the Mg-doped p-type layers side to the Si-doped n-type layers using Cl-based gas by photolithography technique and RIE to expose the n-type GaN layer for forming the n-electrode. Then, the same device separation as that of Inventive Example A was performed (FIGS. 7 and 8). The shape of the device was 300 μm square and the exposed area of the n-type GaN layer therein was 150 μm square per device. Namely, the square step of the exposed area had a side length L4 of 150 μm.

(b6) On the exposed n-type GaN layer, an n-electrode with a diameter of 100 μm was formed by photolithography technique, vapor deposition, and lift-off method. The thickness, the heat treatment and the contact resistance were the same as those of Inventive Example A.

(b7) A p-electrode was placed on the p-type GaN layer in which the n-type GaN exposed area 150 μm square had been removed from the device of 300 μm square. The thickness, the heat treatment and the contact resistance were the same as those of Inventive Example A.

(b8), (b9) The same processes as the corresponding processes of Inventive Example A were performed.

(b10) Similarly to Inventive Example A, in order to facilitate the heat radiation from the light emitting device, the light emitting device was mounted on the mount portion such that the entire surface of the p-type GaN layer of the light emitting device was in contact therewith. In FIG. 5, the contact area between p-type GaN layer 106 and p-electrode 112 was set to 0.0675 $mm^2$. The heat radiation of the light emitting device occurs in quantum layer 104 and p-type GaN layer 106 and therefore this heat radiation is mainly determined by the area of p-electrode 112. In the case of FIG. 5, n-electrode 111 is also connected to mount portion 121a of the lead frame by conductive adhesive 114, but the heat radiation area is substantially the aforementioned contact area 0.0675 $mm^2$. In Inventive Example A, the contact area between p-type GaN layer 6 and p-electrode 12 was 0.09 $mm^2$. The adhesive and the material of the lead frame were the same as those of the Inventive Example A. In Comparative Example B, in reflecting the aforementioned construction, the heat resistance was 10.4° C./W, which was 1.3 times that of Inventive Example A, and therefore was degraded.

(b11) The same process as the corresponding process of Inventive Example A was performed.

(Experiments and Results)

Figure 9:
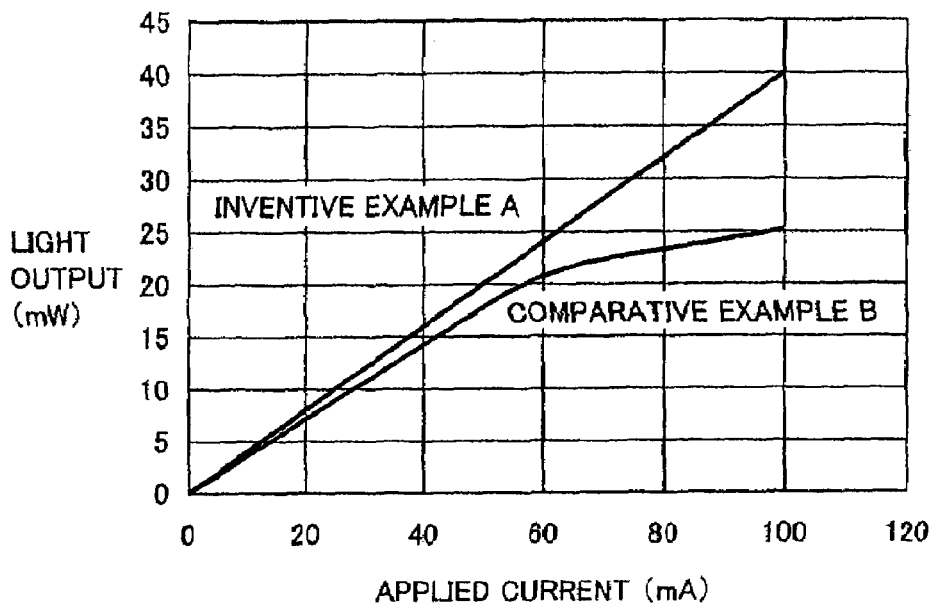
FIG. 9 is an illustration showing the relation between the applied current and the light output for Inventive Example A and Comparative Example B.
Figure 10:
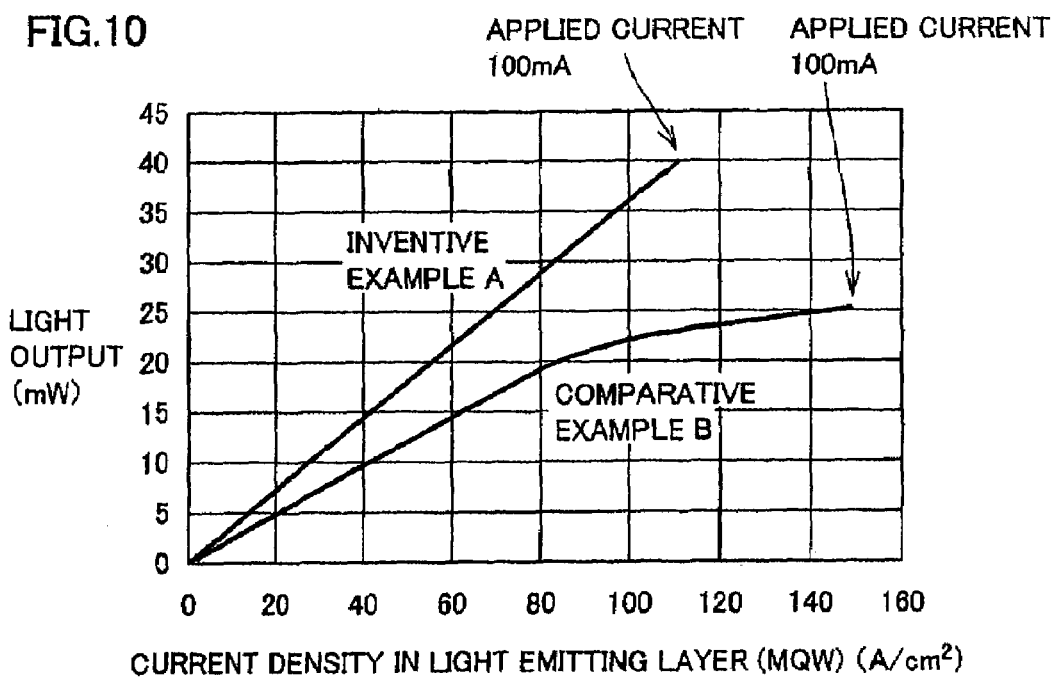
FIG. 10 is an illustration showing the relation between the current density in the light emitting layer and the light output for Inventive Example A and Comparative Example B.

Inventive Example A and Comparative Example B were mounted within an integrating sphere and then predetermined currents were applied to them. The values of output lights which were focused and output from a detector were compared. The result is shown in FIG. 9. In FIG. 9, under relatively ideal conditions where currents are injected without leaking and there are relatively little non-radiation recombination and low chip-temperature rise due to heat radiation, the light output value increases in proportion to the increase of the applied current. For example, for injection of 20 mA, Inventive Example A generated an output of 8 mW, while Comparative Example B generated an output of 7.2 mW.

Inventive Example A was mainly constructed by a GaN epitaxial film/GaN substrate, while Comparative Example B was mainly constructed by a GaN epitaxial film/sapphire substrate. The sapphire substrate had a refractive index of about 1.8, and this was significantly smaller than the refractive index 2.4 of GaN. Therefore, in Comparative Example B, light was generated in the GaN epitaxial film and propagated, and than the light was prone to total internal reflection at the interface between the GaN epitaxial film and the sapphire substrate. For this reason, the output of Comparative Example B was lower than that of Inventive Example A.

However, when the current was increased five-fold and 100 mA was applied to Inventive Example A and Comparative Example B, Inventive Example A generated five times the output, or 40 mA, while Comparative Example B generated only 25.2 mW (see FIG. 9). At this time, the current density in the MQW light emitting portion was 110 A/cm$^2$ in Inventive Example A and 150 A/cm$^2$ in Comparative Example B. Namely, the current density in the MQW light emitting portion of Inventive Example A was larger than that of the Comparative Example B.

This means that in Inventive Example A the heat radiating area was sufficiently large for radiated heat and the n-electrode was provided on the second main surface side of the substrate so that there was no area in which the current density became significantly large. On the other hand, in Comparative Example B the heat radiating area was smaller than that of Inventive Example A and further the n-electrode was formed on the exposed n-type GaN layer, and therefore the current density of the current flowing through the n-type GaN layer in the direction parallel to the layer significantly increased. As a result, in the Comparative Example B, heat radiation further increased.

Further, in Inventive Example A, unlike in Comparative Example B, the n-electrode and the p-electrode are placed at opposite positions and therefore there is no possibility of electrical short-circuits. Therefore, it is possible to prevent increases of additional fabrication cost such as for providing a film for electrically insulating between the p-electrode and n-electrode for preventing electrical short-circuits in Comparative Example B in which the electrodes exist at the same side.

Further, test results about the electrostatic withstand voltages of Inventive Example A and Comparative Example B will be described. The tests were performed by generating electric discharge between the light emitting device and an electrostatically charged condenser placed oppositely. At this time, Comparative Example B was broken at an electrostatic voltage of about 100 V. On the other hand, Inventive Example A was not broken until about 8000 V. It was proven that Inventive Example A had an electrostatic withstand voltage which was 80 times that of Comparative Example B.

Further, in Inventive Example A, the GaN-based light emitting device is formed on the GaN substrate. Therefore, even though the GaN-based light emitting chip is down-mounted so that light is emitted from the back side of the GaN substrate, there is no refractive index difference between them. Thus, light propagates from the GaN-based light emitting chip to the GaN substrate without experiencing total internal reflection. Therefore, as compared with constructions in which a sapphire substrate is employed to form a GaN-based light emitting device, the light output from the GaN substrate main surface may be increased. Further, there will be no extremely-concentrated light emission from the sides of the GaN layer and therefore the sealing resin will not be subjected to damage. Thus, the life time will not be restricted by the sealing resin.

As the inventive example, there has been merely described an example of the light emission wavelength 450 nm, and the same effects may be obtained by different light emission wavelengths and layer constructions. Also, it goes without saying that the equivalent effects may be obtained by employing an $Al_xGa_{1-x}N$ substrate (wherein x is greater than 0 and is equal to or less than 1) instead of the GaN substrate, provided that the substrate has equivalent characteristics.

Second Embodiment

Figure 11:
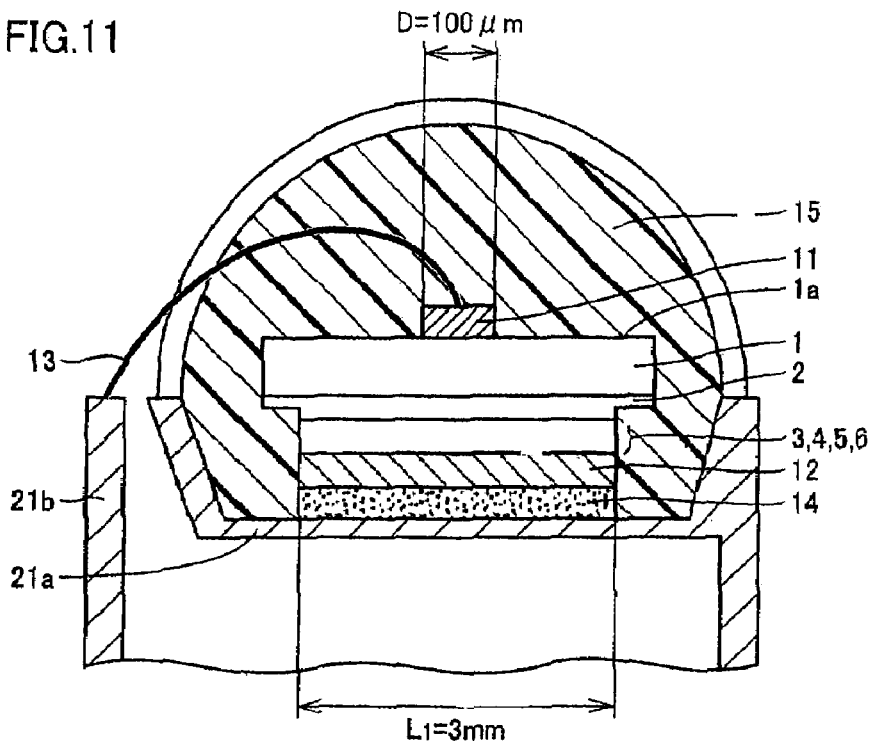
FIG. 11 is an illustration showing an LED of Inventive Example C according to a second embodiment of the present invention.

In a second embodiment of the present invention, Inventive Example C having an increased area will be described. Inventive Example C has the same construction as that of Inventive Example A illustrated in FIG. 1. However, while the dimension L1 is 0.3 mm (300 μm) in Inventive Example A, L1 is 3 mm or tenth and therefore the area is 100 times in Inventive Example C, as illustrated in FIG. 11. First, the fabricating method of Inventive Example C is as follows.

(Inventive Example C)

(c1) to (c5) The same processes as the corresponding processes of Inventive Example A were performed, but a larger GaN substrate was employed.

(c6) On the second main surface at the back side of the GaN substrate, n-electrodes with a diameter of 100 μm are formed with a pitch of 3.1 mm by a photolithography technique, vapor deposition and lift-off method. As the n electrodes, a laminate construction consisting, from the bottom side, of (a Ti layer 20 nm/an Al layer 100 nm/a Ti layer 20 nm/an Au layer 200 nm) was formed in contact with the back side of the above GaN substrate. This was heated in an inert atmosphere to reduce the contact resistance to below 1E-5 Ω·cm$^2$.

(c7) The same process as the corresponding process of Inventive Example A was performed.

(c8) Subsequently, the construction was scribed to make it to be desired shapes and the chipped constructions were made to be light emitting devices. The chipped light emitting devices had a size of 3 mm square.

(c9) to (c11) The same processes as the corresponding processes of Inventive Example A were performed. Then, Modification Example C1 in which the placement of the n-electrode is changed from that of Inventive Example C was fabricated as follows.

(Inventive Example C1)

Figure 12:
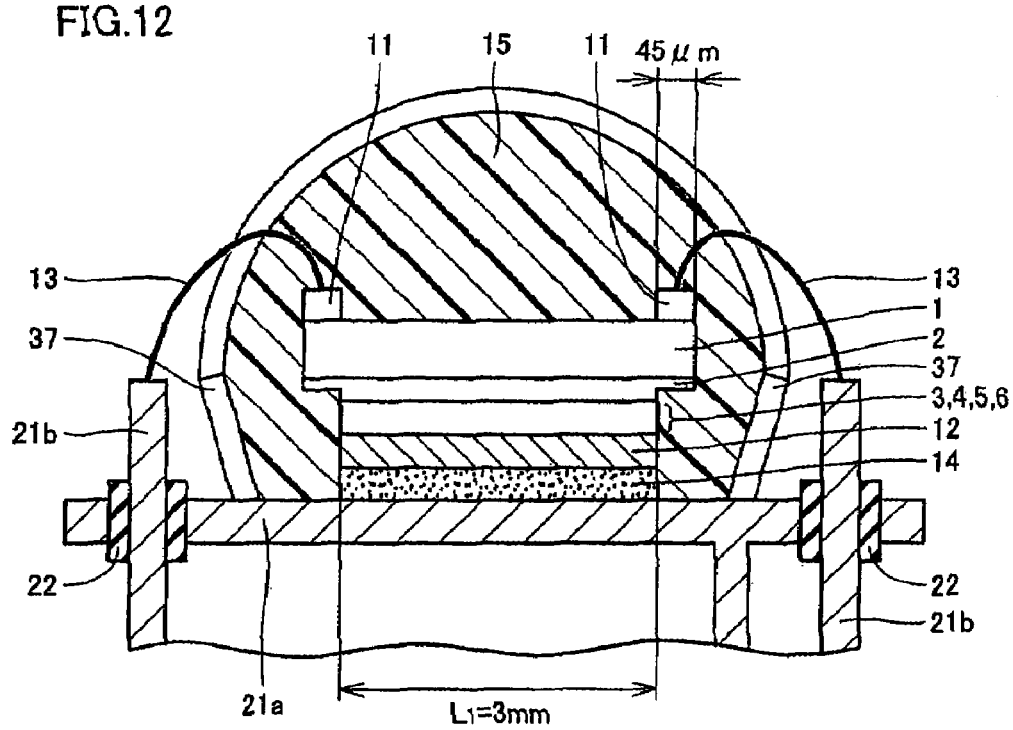
FIG. 12 is an illustration showing an LED of Inventive Example C1 according to the second embodiment of the present invention.
Figure 13:
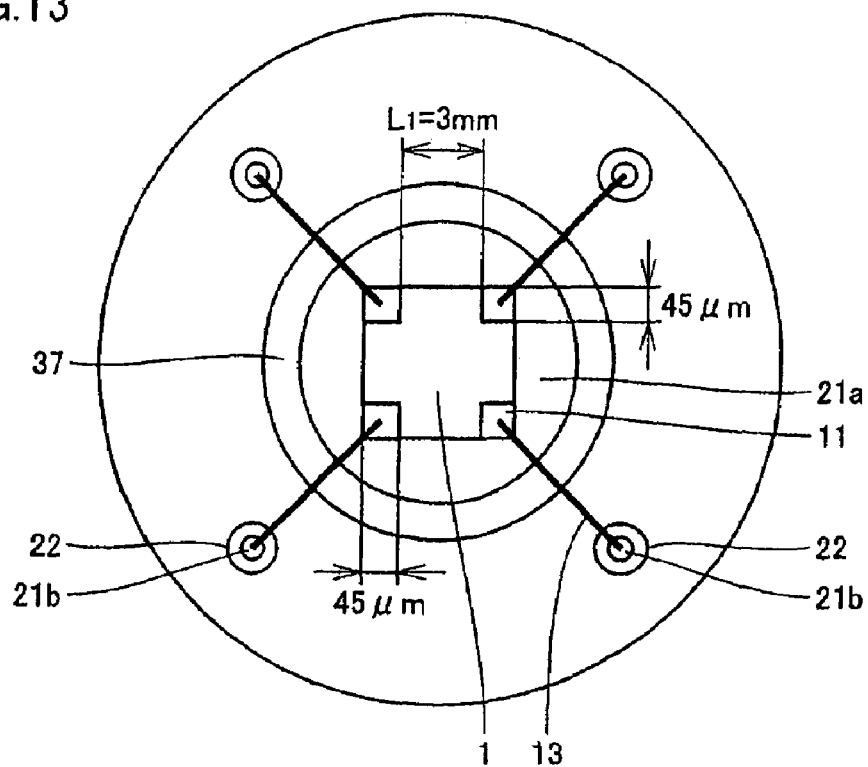
FIG. 13 is a plan view of the LED of Inventive Example C1 of FIG. 12.

FIGS. 12 and 13 are illustrations showing Inventive Example C1 which is an modification of Inventive Example C. Inventive Example C1 is characterized in that n-electrodes 11 are placed at the four corners of the GaN substrate. Further, for mounting the semiconductor chip, a reflective cup 37 is placed in the lead frame such that it surrounds the semiconductor chip.

In fabricating Inventive Example C1, the same processes as the corresponding processes of Inventive Example A were performed. However, four Au wires were employed as the bonding wires and the diameter of the cross sections of the Au wires was 25 µm. Each of the electrodes placed at the four corners has a shape of 45 µm square.

Then, Comparative Example D will be described. Comparative Example D has the same construction as that illustrated in FIG. 5. However, L1 was 300 µm (0.3 mm) in Comparative Example B, L1 is 3 mm and thus tenth in Comparative Example D. The size L4 of the portion of the n-type GaN layer for forming an n-electrode is 150 µm, which is the same as that of Comparative Example B of FIG. 5. The fabrication method of Comparative Example D is as follows.

(Comparative Example D)

(d1) A larger insulating sapphire off-substrate angled by 0.2° with respect to the c-plane was employed. This substrate had a thickness of 400 µm.

(d2) to (d4) The same processes as the corresponding processes of Inventive Example A were performed.

(d5) In Comparative Example D, the sapphire substrate is an insulator and therefore the n electrode must be formed on the grown-films side similarly to the p-electrode. Therefore, this wafer was etched from the Mg-doped p-type layers side to the Si-doped n-type layers by photolithography technique and RIE using Cl-based gas to expose the n-type GaN layer for forming the n-electrode. Then, the same device separation as that in Inventive Example A of was performed. The device had a size of 3 mm square and thus had a larger size. The dimension of the exposed area of the n-type GaN layer was 150 µm square per device.

(d6) On the exposed n-type GaN substrate, n-electrodes with a diameter of 100 µm were formed by photolithography technique, vapor deposition and lift-off method. The thickness, the heat treatment and the contact resistance were the same as those of Inventive Example A.

(d7) P-electrodes were placed on the p-type GaN layer in which device separation slots and the exposed areas of 150 µm square of the n-type GaN layer for placing n-electrode had been removed from the device area of 3.1 mm square. The thickness, the heat treatment and the contact resistance were the same as those of Inventive Example A.

(d8) to (d11) The same processes as the corresponding processes of Inventive Example A were performed.

Figure 14:
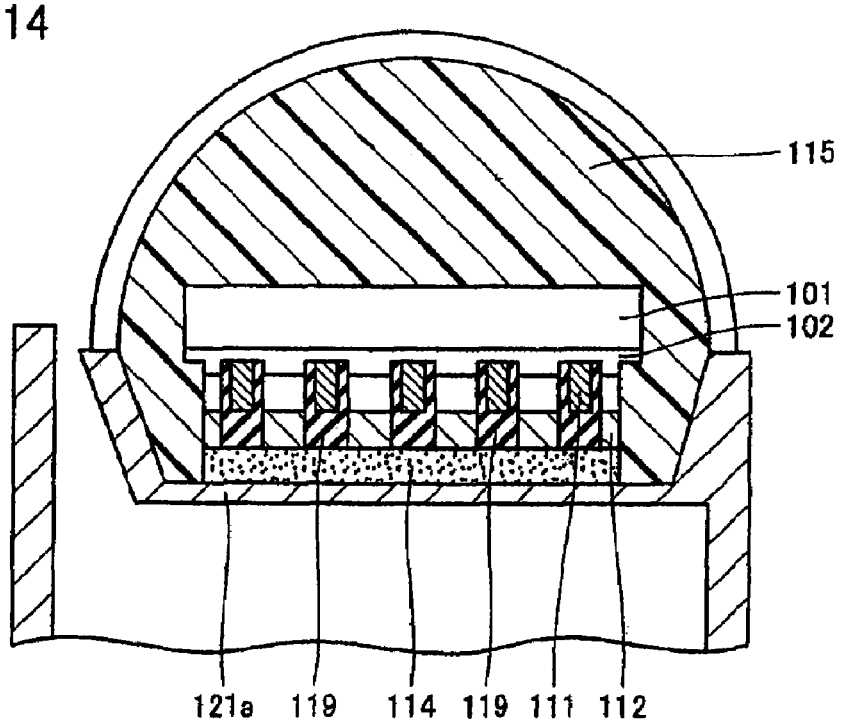
FIG. 14 is an illustration showing an LED of Comparative Example E.

Substantially, Comparative Example E will be described. Comparative Example E is the same as Comparative Examples B and D in that a sapphire substrate is employed and p-electrode 112 and n-electrode 111 are both formed on the down mounting side as illustrated in FIG. 14. Comparative Example E is, however, different from them in that as clearly illustrated in the plan view in FIG. 15, p-electrode 112 has a comb-shape, n-electrodes 111 are placed between the teeth of the comb, and an insulator is placed between p-electrode 112 and n-electrodes 111. This is intended for uniformizing the current flowing through the p-electrode and the n-electrode to prevent formation of areas in which the current density becomes extremely large. The fabrication method of this Comparative Example E is as follows.

(Comparative Example E)

Figure 15:
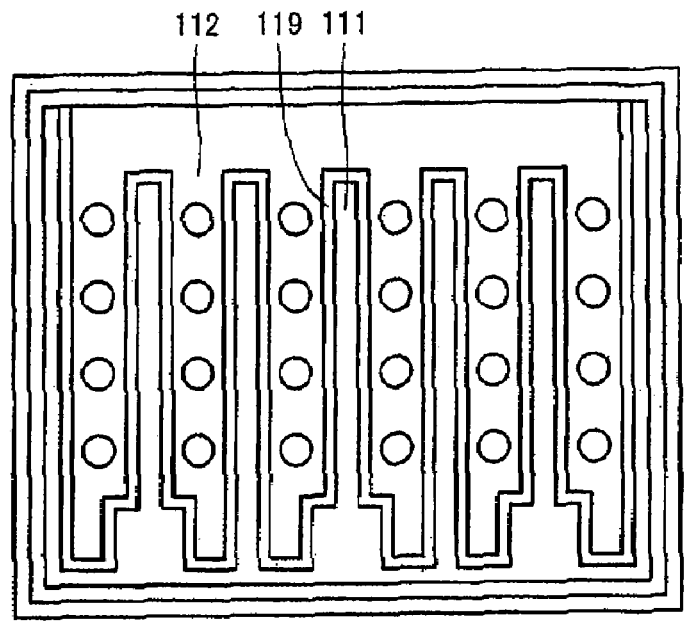
FIG. 15 is a plan view of the LED of Comparative Example E of FIG. 14.

With the same fabrication method as that of Comparative Example D, as n-electrodes 111, five comb electrodes with a width of 0.1 mm was formed with a pitch of 0.5 mm (FIGS. 14 and 15). The p-electrode was formed at the remaining area of n-type GaN layer 102 such that n-electrodes 111 and p-electrode 112 were spaced by 0.1 mm from each other. Further, an insulator 119 for surface protection was formed at the gaps between the n-electrodes and the p-electrode in order to prevent the respective electrodes from being electrically short-circuited. Further, in order to prevent short-circuits, a conductive adhesive 114 was provided on the area of mount portion 121a of the lead frame which corresponded to the position of the respective electrodes. The chip was mounted to the lead frame while displacement of the chip and the lead frame in the lateral direction, the longitudinal direction and the rotation direction were controlled.

(Experiments and Results)

Inventive Example C and Comparative Example D were mounted within an integrating sphere and then predetermined currents were applied to them. The values of output lights which were focused and output from a detector were compared. For example, when a current of 20 mA was applied, Inventive Example C generated an output of 8 mW, while Comparative Example D generated an output of 7.2 mW. On the other hand, when a current of 2 A (2000 mA) was applied, Inventive Example C generated 100 times the output, namely 800 mW. However, Comparative Example C was broken.

Therefore, under the condition where Comparative Example D was not sealed with resin, electric currents were applied to Comparative Example D and the temperature of the device was measured by a thermoviewer. As a result, it was proven that abnormal heat generation occurred at the area in which currents intensively flowed through the n-type GaN layer in the direction parallel to the layer from the n-electrode toward the MQW light emitting portion and consequently Comparative Example D was broken.

Thus, in contrast to Comparative Example D, there was fabricated a light emitting device having a construction in which currents flowing through the n-type GaN layer in the direction parallel to the layer from the n-electrode toward the MQW light emitting portion were distributed. This was Comparative Example E. Comparative Example E generated an output of 7.2 mW for an applied current of 20 mA, and an output of 720 mW for an applied current of 2 A. Thus, Comparative Example E generated outputs which were 0.9 time that of Inventive Example C.

Thus, in order to obtain performance near that of Inventive Example C, significantly-complicated constructions and processes are required as compared with Inventive Example C, and therefore the fabrication cost increases.

Then, for Inventive Example C and Comparative Examples D and E, electrostatic withstand voltage tests were performed. The tests were performed, as previously described, by generating electric discharge between the light emitting device and an electrostatically charged condenser placed oppositely. Then, Comparative Examples D and E were broken at an electrostatic voltage of 100 V. On the other hand, Inventive Example C was not broken until about 8000 V. Namely, the inventive example offered a significantly high electrostatic withstand voltage, which was approximately 80 times that of the comparative examples.

Inventive Example C1 had an opening ratio much greater than 50% and almost 100%. Further, since n-electrodes are placed at the corners of the GaN substrate, they are much less prone to become obstruction of light emission, as compared with the case where they are placed at the center. As illustrated in FIG. 12, the n electrodes are placed outside of the active layer, in a plan view, the n electrodes will never affect the light emission. As a result, Inventive Example C1 can achieve higher outputs than Inventive Example C.

Third Embodiment

Figure 16:
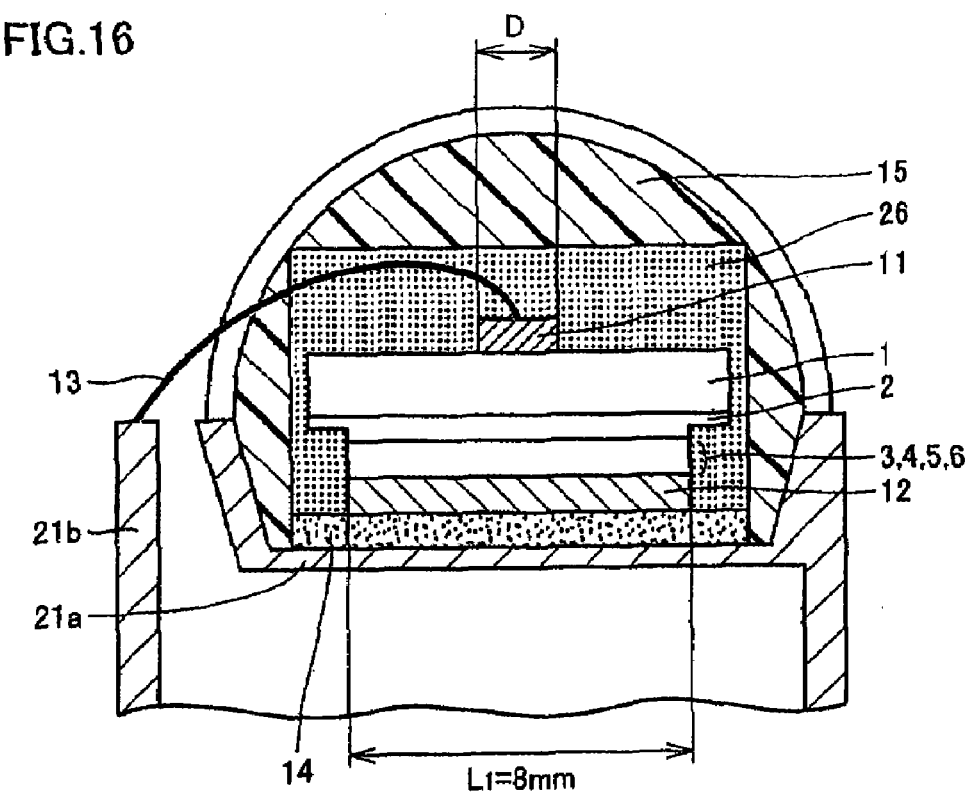
FIG. 16 is an illustration showing an LED of Inventive Example F according to a third embodiment of the present invention.

In a third embodiment of the present invention, influences of the opening ratio at the light emitting surface and the electrical resistance of the GaN substrate on the light output were determined. The adjustment of the opening ratio was performed by varying the substrate area, the p-electrode size and the n-electrode size. As a test sample, an LED having the construction illustrated in FIG. 1 was employed. However, some of the tests were performed for a test sample provided with a fluorescence material 26 to be formed as a white LED as illustrated in FIG. 16. The test samples were three samples, namely Inventive Example F and Comparative Examples G, H each including a GaN substrate having a resistivity deviated from the range of the present invention. For each sample F, G and H, an LED including no fluorescence material and sealed with epoxy resin as illustrated in FIG. 1 and a white LED equipped with a fluorescence material illustrated in FIG. 16 were fabricated. The opening ratio was defined as follows: {(area of p-electrode−area of n-electrode/area of p-electrode}×100(%).

In Inventive Example F, L1=8 mm, D=100 μm, and the opening ratio is almost 100%. Also, in Comparative Example G, L1=0.49 mm, D=100 μm and the opening ratio is 97%. In Comparative Example H, L1=8 mm, D=7.51 mm and the opening ratio is 31%. The fabrication methods of the aforementioned Inventive Example F, Comparative Examples G and H will be described.

(Inventive Example F)

(f1) to (f5) The same processes as the corresponding processes of Inventive Example A were performed.

Figure 17:
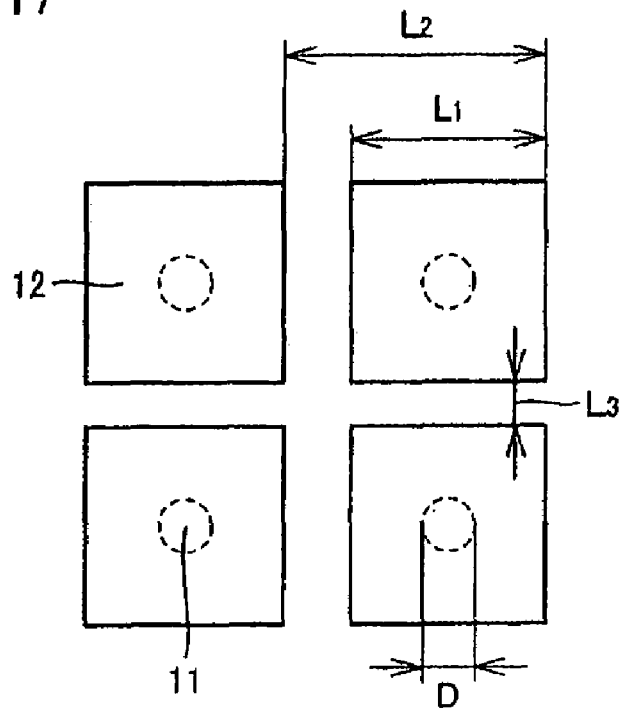
FIG. 17 is an illustration showing the placement of the electrodes when taking chips having the laminate construction of Inventive Example F out of the wafer.

(f6) Subsequently, as illustrated in FIG. 17, the construction was scribed to be desired shapes and the chip-shaped constructions formed light emitting devices. The resultant light emitting devices had a size of 8 mm square.

(f7) to (f11) The same processes as the corresponding processes of Inventive Example A were performed.

(f12) In addition to the above (f11), a white-emitting lamp was fabricated by mounting a fluorescence material on the n-electrode side of the light emitting device which had been mounted on the mount of the lead frame in (f10) and then sealing the light emitting device with an epoxy resin. For this, a fluorescence material which generated 180 lm for 1 watt of light output with 450 nm was employed.

(Comparative Example G)

(g1) An n-type GaN off-substrate angled by 0.5° with respect to the c-plane was employed. A GaN off-substrate having a resistivity of 0.6 Ω·cm, which was higher than the range of the present invention of 0.5 92 cm or less, was selected. The GaN substrate had a dislocation density of $1E7/cm^2$ and a thickness of 400 μm.

(g2) to (g5) The same processes as the corresponding processes of Inventive Example A were performed.

(g6) Subsequently, the construction was scribed into desired shapes and the chipped constructions formed light emitting devices. The resultant light emitting device had a size of 0.49 mm square.

(g7) to (g12) The same processes as the corresponding processes of Inventive Example F were performed.

(Comparative Example H)

(h1) An n-type GaN off-substrate angled by 0.5° with respect to the c-plane was employed. A GaN off-substrate having a resistivity of 0.6 μΩ·cm, which was higher than the range of the present invention of 0.5 Ω·cm or less, was selected. The GaN substrate had a dislocation density of $1E7/cm^2$ and a thickness of 400 μm.

(h2) to (h5) The same processes as the corresponding processes of Inventive Example F were performed.

(h6) Subsequently, the construction was scribed into a desired shape and the chipped constructions formed light emitting devices. The resultant light emitting device had a size of 8 mm square.

(h7) to (h12) The same processes as the corresponding processes of Inventive Example F were performed.

(Experiments and Results)

Figure 18:
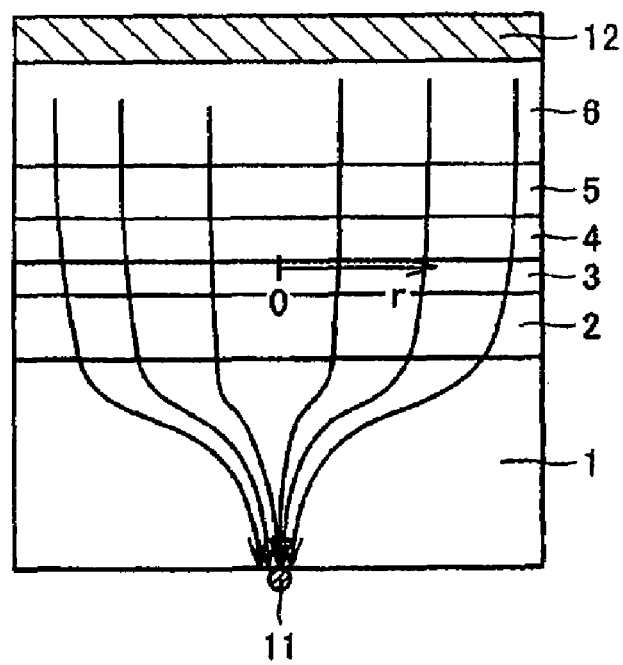
FIG. 18 is an illustration schematically showing the current flows in an LED chip by calculation simulation.
Figure 19:
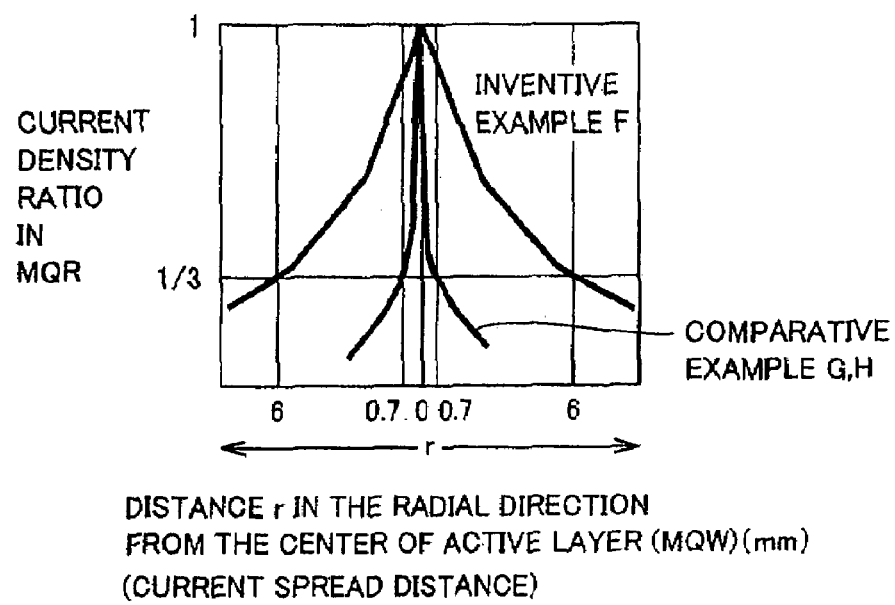
FIG. 19 is an illustration schematically showing the current density ratio in the light emitting layer of the LED according to the third embodiment.

(1) For Inventive Example F and Comparative Examples G and H, the current distribution in the area in which currents spread relatively uniformly from the n-electrode toward the MQW layer was calculated by simulations. The results of the simulations were reflected on the device designs of Inventive Example F and Comparative Examples G and H. FIG. 18 illustrates a conceptual illustration of the spread of currents. FIG. 19 is an illustration showing the current density ratio at the distance r, wherein r is the radial distance from the center of the MQW light emitting layer 4. The current density at the center of the n-electrode is defined as 1. (i) The result of Inventive Example F: the current density was at a maximum directly under the n-electrode and decreased with increasing distance from the n-electrode. Also, the range in which the current density exceeded ⅓ of that directly under the n-electrode was a range with a diameter of 12 mm centered directly under the n-electrode. Based on the result, the size of the light emitting device was set to 8 mm square which was included therein. On the N-surface, which was the second main surface, of the GaN substrate, n electrodes with a diameter of 100 μm were formed at the centers of chips with a pitch of 8.1 mm by photolithography technique, vapor deposition and lift-off method. In this case, the ratio of the area of the N-surface of the GaN substrate at which no n-electrode existed, namely the opening ratio, was substantially 100% per device. The thickness, the heat treatment and the contact resistance were the same as those of Inventive Example A. (ii) The result of Inventive Example G: the range in which the current density exceeded ⅓ of that directly under the n-electrode was a range with a diameter of 0.7 mm centered directly under the n-electrode. Therefore, the diameter of the n-electrode was set to 100 μm in agreement with Inventive Example E, and the chip size was set to 0.49 mm square, which was included in the diameter of 0.7 mm. On the N-surface of the GaN substrate, n-electrodes with a diameter of 100 μm was formed at the centers of chips with a pitch of 0.5 mm by photolithography technique, vapor deposition and lift-off method. In this case, the opening ratio was about 97% per device. The thickness, the heat treatment and the contact resistance were the same as those of Inventive Examples A to E. (iii) In Comparative Example H, the chip size was set to 8 mm square in agreement with Inventive Example E. The GaN substrate had the same electrical resistivity as that of Comparative Example G and the diameter of the spread of currents would be 0.7 mm. Therefore, in order to flow currents through the 8 mm square uniformly (⅓ or more of the current density directly under the n-electrode), the n-electrode was required to have a diameter of 7.51 mm. Thus, on the second main surface (light emitting surface), n-electrodes with a diameter of 7.51 mm were formed with a pitch of 8.1 mm by photolithography technique, vapor deposition and lift-off method and the width of the scribing was set to 0.1 mm. In this case, the opening ratio was about 31% per device.

Figure 20:
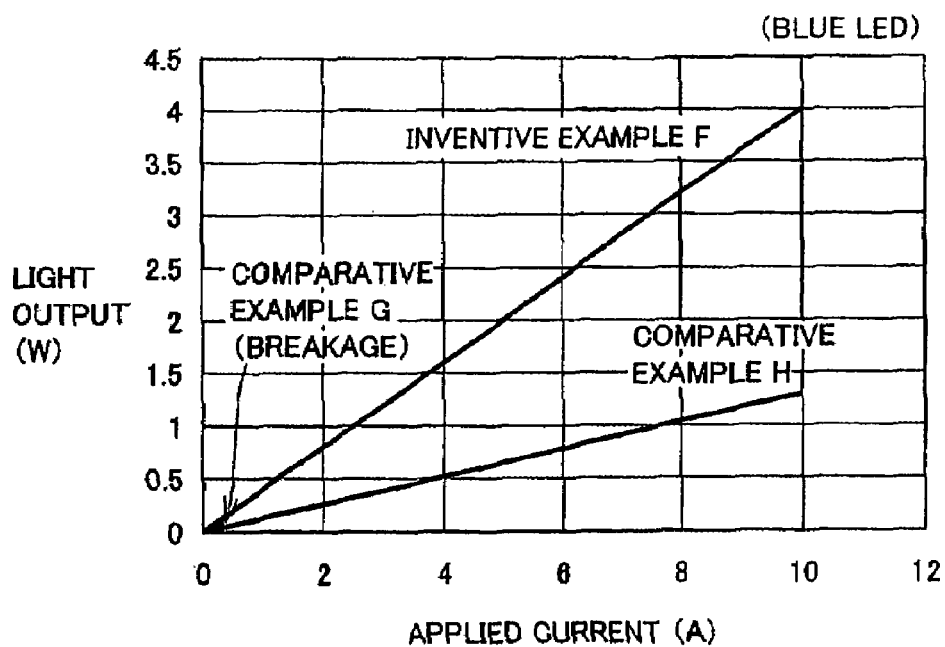
FIG. 20 is an illustration showing the applied current and the light output of the LED (no fluorescence material) according to the third embodiment.
Figure 21:
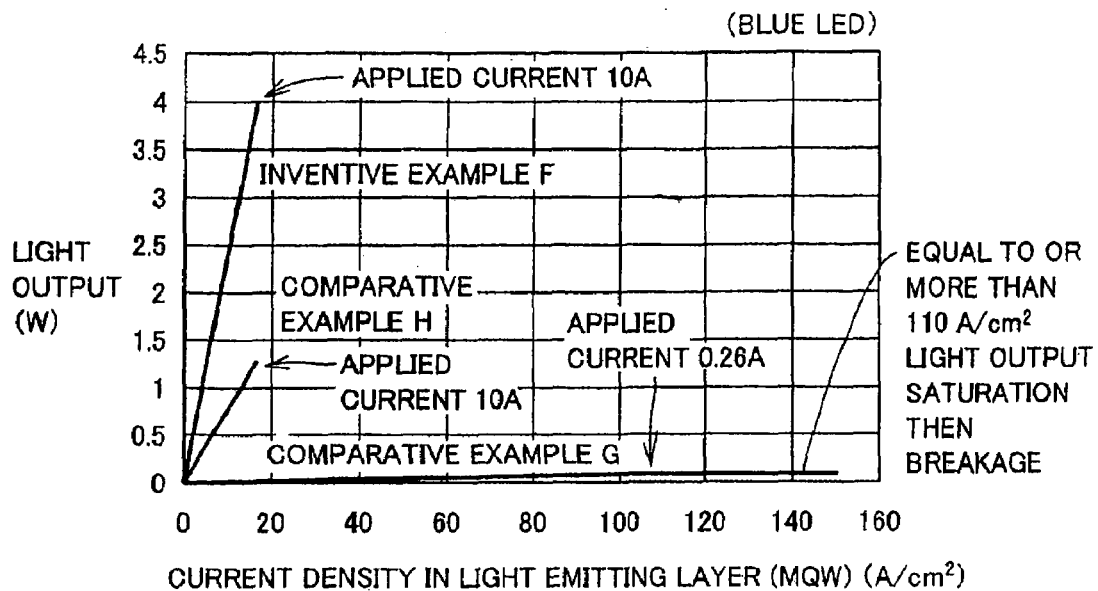
FIG. 21 is an illustration showing the current density in the light output and the light output of the LED (no fluorescence material) according to the third embodiment.

(2) Inventive Example F and Comparative Examples G and H equipped with no fluorescence material were mounted within an integrating sphere and then predetermined currents were applied to them. The values of output lights which were focused and then output from a detector were compared. The results are shown in FIGS. 20 and 21.

When applying a current of 20 mA, Inventive Example F and Comparative Examples G and H generated outputs of 8 mW, 7.8 mW and 2.5 mW respectively, which were consistent with the area ratio of the area at which the electrode was not formed. Inventive Example F generated the highest light output. Comparative Example G generated a light output which was not high as that of Inventive Example F, but relatively high. Then, when 500 times the current, or 10 A, was applied to them, Inventive Example F and Comparative Example H generated outputs of 4 mW and 1.3 mW respectively, which were consistent with the area in which the electrode was not formed.

The output of Comparative Example G increased in proportion to the applied current to 0.1 W at an applied current of 0.26 A and thus at a current density in the light emitting portion of 110 A/cm$^2$. However, from then on, the output reached saturation with increasing temperature caused by heat generation and Comparative Example G was broken by an applied current of 10 A.

Figure 22:
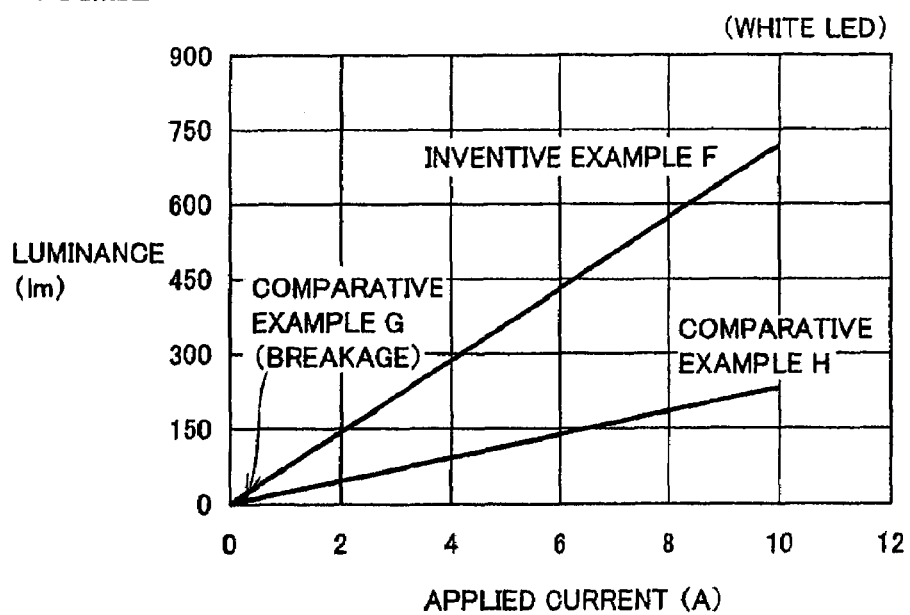
FIG. 22 is an illustration showing the relation between the applied current and the light output of the LED (including fluorescence material: white) according to the third embodiment.
Figure 23:
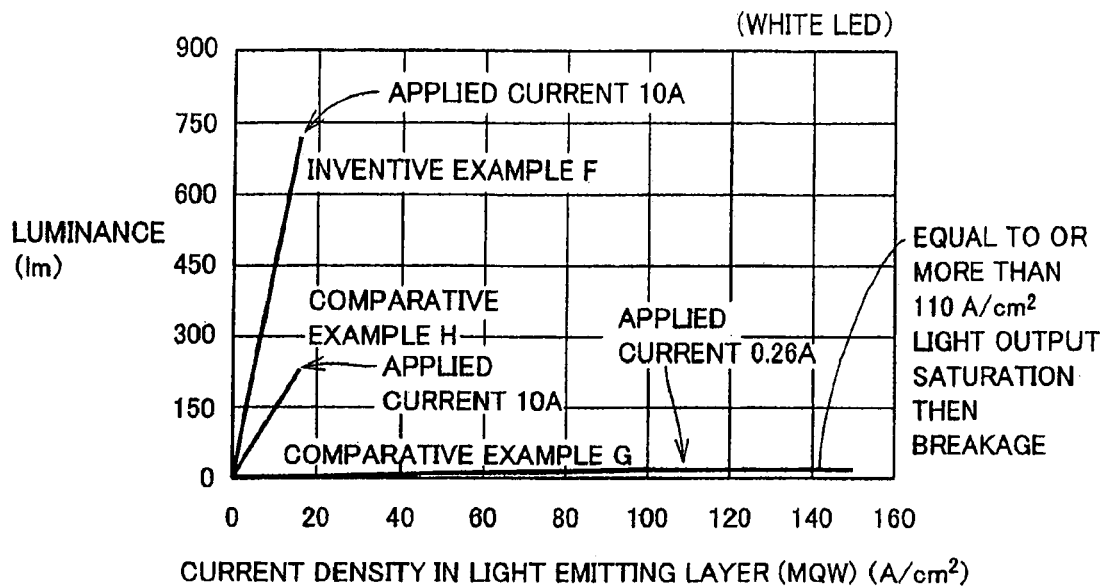
FIG. 23 is an illustration showing the current density in the light emitting layer and the light output of the LED (including fluorescence material) according to the third embodiment.

FIGS. 22 and 23 illustrate the results of luminance measurements for the aforementioned three types of test samples. FIG. 22 is an illustration showing the relation between the applied current and the resultant luminance for the white-emitting LEDs equipped with a fluorescence material. FIG. 23 is similarly an illustration showing the relation between the current and the luminance. The same fluorescence material was employed in Inventive Example F and Comparative Example H, but the luminance varied depending on the area ratio of the area at which the electrode was not placed. Thus, when the applied current was 10 A, the luminances of Inventive Example F and Comparative Example H were 720 lm/chip and 234 lm/chip respectively. The Comparative Example had a thermal limit of 18 lm/chip at an applied current of 0.26 A and was broken by an applied current of 10 A. According to FIGS. 22 and 23, only Inventive Example F generated high luminances at high currents.

Further, in the present embodiment, the applied current is 10 mA at a maximum since if the current is increased above that, then the Joule heat density at the n-electrode will become excessive and consequently significant heat generation will occur.

By increasing the size of the n-electrode or by sufficiently reducing the contact resistance, the same effects may be achieved for currents up to a maximum current of 70 A, which is corresponding to an current density of 10 A/cm$^2$.

(Inventive Examples F-2 and F-3)

Figure 24:
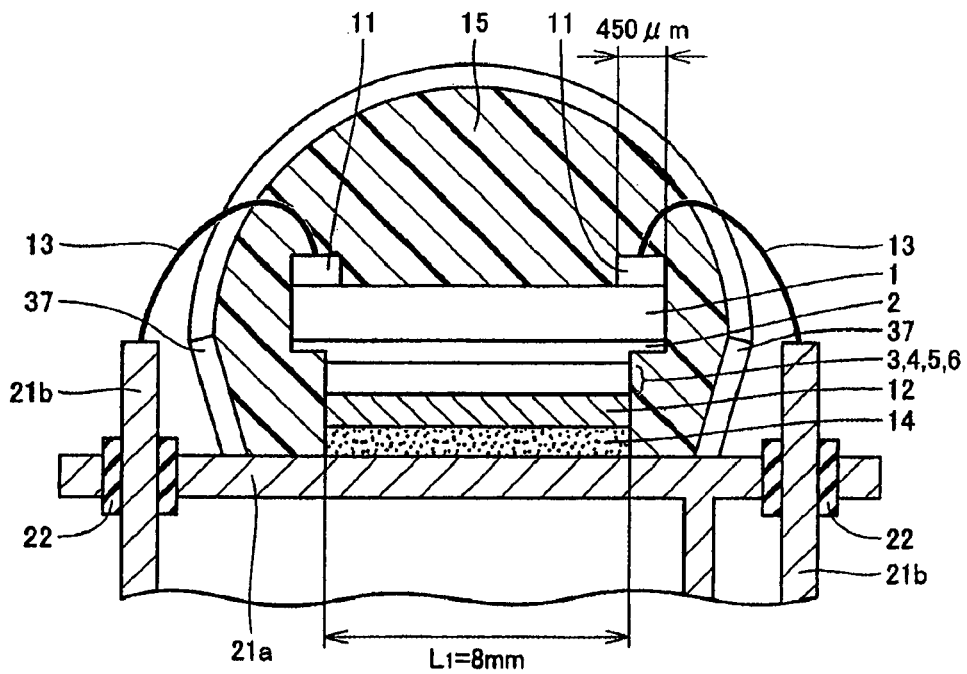
FIG. 24 is an illustration showing Modification Example F-3 of the LED according to the third embodiment.
Figure 25:
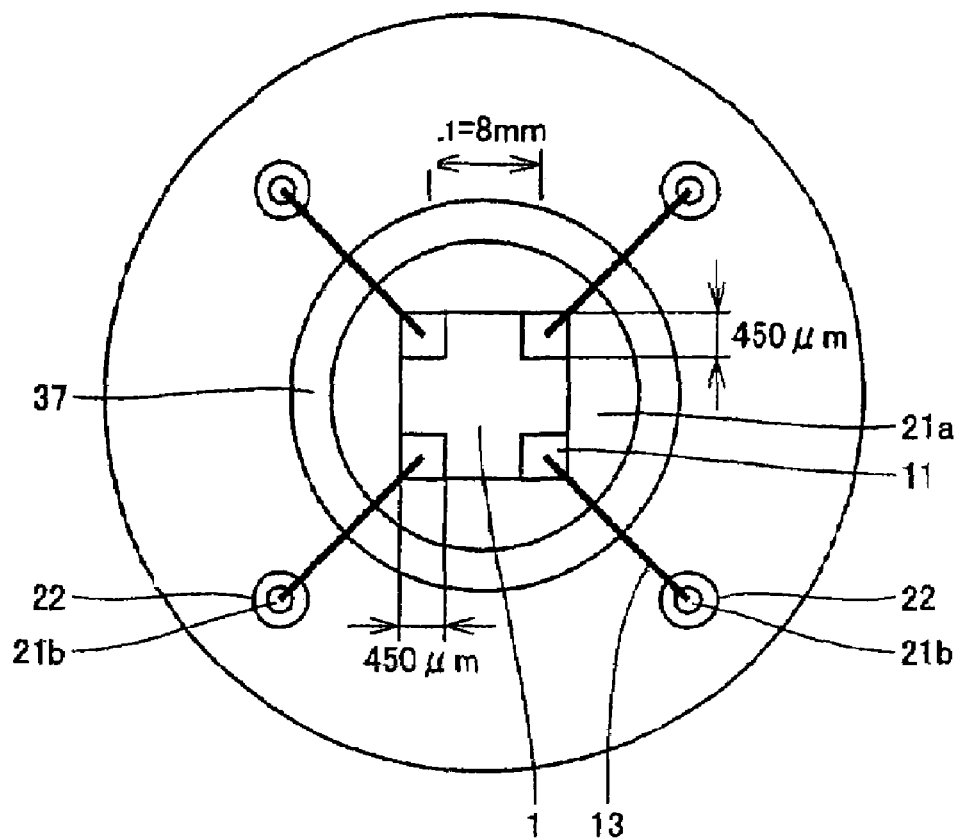
FIG. 25 is an illustration showing the LED of FIG. 24.

The same processes as those of the Inventive Example F were performed. In Inventive Example F-2, an n-electrode with a diameter D of 1 mm (an area of 0.785 mm$^2$) was placed at the center of a GaN substrate. In Inventive Example F-3, n-electrodes of 450 μm square were placed at the four corners of a GaN substrate (FIGS. 24 and 25). As illustrated in FIG. 24 and FIG. 25, the n-electrodes placed at the four corners were each electrically connected to the lead frame by bonding wires. The bonding wires were Au wires and had a cross section with a diameter of 300 μm. In this case, both the examples had an opening ratio of about 100%. Further, similarly to Inventive Example C1, a reflection cup 37 which was a cup-shaped reflective body was placed.

Similarly to Inventive Example F, the example having no fluorescence material was mounted within an integrating sphere and then predetermined currents were applied to them to cause light emission. The value of output light which was focused and output from a detector was measured. An output of 8 mW was generated for an applied current of 20 mA, and an output of 4 W was generated for an applied current of 500 times the current or 10 A. An output of 28 W was generated for an applied current of 70 A.

Further, in the case of a while-emitting LED provided with a fluorescence material, a luminance of 5040 lm/chip was obtained.

Equivalent outputs can be obtained by placing a plurality of light emitting devices which have small sizes and require relatively low applied currents. However, in order to ensure placement accuracy of the device placement or prevent electrical short-circuits, a constant distance is required between devices, which may significantly increase the entire size or may significantly increase the cost in the case of establishing conduction of each device. According to the present invention, these problems may be avoided and higher light emission output may be obtained with completely the same number of fabricating process as that of conventional processes, a substantially equivalent cost and a required minimum size.

The same effects may be achieved even when an $Al_xGa_{1-x}N$ substrate (x is greater than 0 and is equal to or less than 1) is employed instead of a GaN substrate provided that the substrate has the same characteristics and even when the light emission wavelength and layer construction are changed.

As illustrated in FIGS. 24 and 25, by electrically connecting the n-electrodes placed at the comets of the GaN substrate and the lead frame through four Au wires with a semi diameter of 150 μm, the electrodes and the wires will not be obstruction of light emission, and consequently the light output may be further increased.

Fourth Embodiment

In a fourth embodiment of the present invention, the influence of the GaN substrate thickness on the light output will be described. By using three test samples which are Inventive Examples I, J and K having the same construction as that of the LED illustrated in FIG. 1, the light absorption of the GaN substrates was determined. The fabrication method of the test samples will be described.

(Inventive Example I)

(i1) An n-type GaN off-substrate angled by 0.5° with respect to the c-plane was employed. This GaN substrate had a resistivity of 0.01 Ω·cm and a dislocation density of 1E7/cm$^2$. This GaN substrate had a thickness of 100 μm.

(i2) The following layers were formed in order on the first main surface of the GaN substrate by MOCVD. Namely, a laminate construction (a GaN buffer layer/a Si-doped n-type GaN layer/a Si-doped n-type $Al_{0.2}Ga_{0.8}N$ layer being a clad layer/a MQW layer consisting of three layers each being a two-layers construction comprised of a GaN layer and an $In_{0.05}Ga_{0.95}N$ layer/a Mg-doped p-type $Al_{0.2}Ga_{0.8}N$ layer being a clad layer/a Mg-doped p-type GaN layer) was formed.

(i3) The light emission wavelength was 380 nm. The internal quantum efficiency was 50%, which was calculated for convenience by comparing the PL intensity at a low temperature of 4.2 K and the PL intensity at a room temperature of 298 K.

(i4) to (i5) The same processes as the corresponding processes of Inventive Example A were performed.

(i6) The area in which currents spread relatively uniformly from a dot-shaped n-electrode toward the MQW layer was calculated by simulations. As a result, the current density was at a maximum directly under the n-electrode and decreased with increasing distance from the n-electrode. Also, the range in which the current density exceeded 1/3 of that directly under the n-electrode was a range with a diameter of 3 mm centered directly under the n-electrode, and therefore the size of the light emitting device was set to 1.6 mm square which may be included therein. On the N surface of the GaN substrate, n-electrodes with a diameter of 100 μm were formed with a pitch of 1.7 mm by photolithography technique, vapor deposition and lift-off method. In this case, the ratio of the area of Ga surface of the GaN substrate at which the n-electrode was not formed, namely the opening ratio, was substantially 100% per device. The thickness, the heat treatment and the contact resistance were the same as those of Inventive Example A.

(i7) The same process as the corresponding processes of Inventive Example A was performed.

(i8) Then, the construction was scribed into desired shapes and the chipped constructions formed light emitting devices. The resultant light emitting device had a size of 1.6 mm square.

(i9) to (i11) The same processes as the corresponding processes of Inventive Example A were performed.

(Inventive Example J)

(j1) An $Al_xGa_{1-x}N$ off-substrate angled by 0.5° with respect to the c-plane was employed. The resistivity was 0.01 Ω·cm and the dislocation density was $1E7/cm^2$. The thickness of the n-type $Al_xGa_{1-x}N$ off-substrate was 100 μm. Three types (the Al atom ratios x were 0.2, 0.5 and 1) of substrates were employed.

(j2) The following laminate construction was fabricated on the first surface of the $Al_xGa_{1-x}N$ surface by MOCVD. (A Si-doped n-type clad $Al_{0.2}Ga_{0.8}N$ layer being a clad layer/a MQW layer consisting of three layers each being a two-layers construction comprised of a GaN layer and an $In_{0.05}Ga_{0.95}N$ layer/an Mg-doped p-type $Al_{0.2}Ga_{0.8}N$ layer being a clad layer/an Mg-doped p-type GaN layer) was formed in order.

(j3)–(j5) The same processes as the corresponding processes of the Inventive Example I were performed.

(j6) On the second main surface of the $Al_xGa_{1-x}N$ substrate, n-electrodes with a diameter of 100 μm were formed with a pitch of 400 μm by photolithography technique, vapor deposition and lift-off method. The n electrodes were constructed by forming a laminate construction consisting, from the bottom, of (a Ti layer 20 nm/an Al layer 100 nm/a Ti layer 20 nm/a Au layer 200 nm) was formed in contact with the second main surface of the $Al_xGa_{1-x}N$ substrate. This was heated in an inert atmosphere to reduce the contact resistance to below $1E-4$ Ω·cm².

(j7) to (j11) The same processes as the corresponding processes of Inventive Example A were performed.

(Comparative Example K)

(k1) An n-type GaN off-substrate angled by 0.5° with respect to the c-plane was employed. This substrate had a resistivity of 0.01 Ω·cm and a dislocation density of $1E7/cm^2$. This GaN substrate had a thickness of 1 mm (1000 μm).

(k2) to (k5) The same processes as the corresponding processes of Inventive Example I were performed.

(k6) The size of the light emitting device (chip) was set to 1.6 mm square, which was the same as that of Inventive Example G.

On the second main surface of the GaN substrate, n-electrodes with a diameter of 100 μm were formed with a pitch of 1.7 mm by photolithography technique, vapor deposition and lift-off method. In this case, the ratio of the area of the second main surface (light emitting surface) of the GaN substrate at which the n-electrode was not formed, namely the opening ratio, was substantially 100% per device. The thickness, the heat treatment and the contact resistance were the same as those of Inventive Example I.

(k7) to (k11) The same processes as the corresponding processes of Inventive Example I were performed.

(Experiments and Results)

Figure 26:
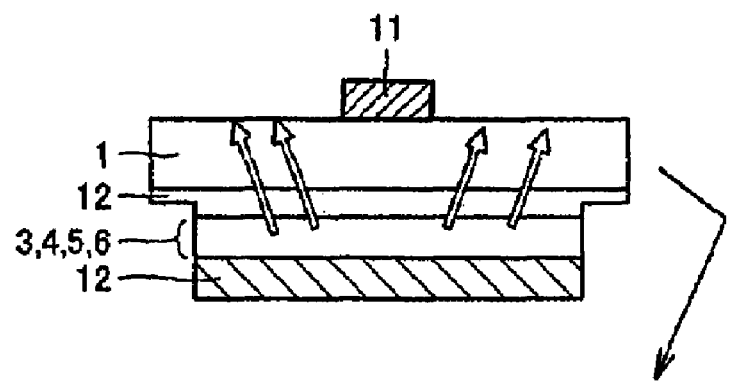
FIG. 26 is an illustration showing the general outline of the transmittance measurement test of the LED according to a fourth embodiment.
Figure 27:
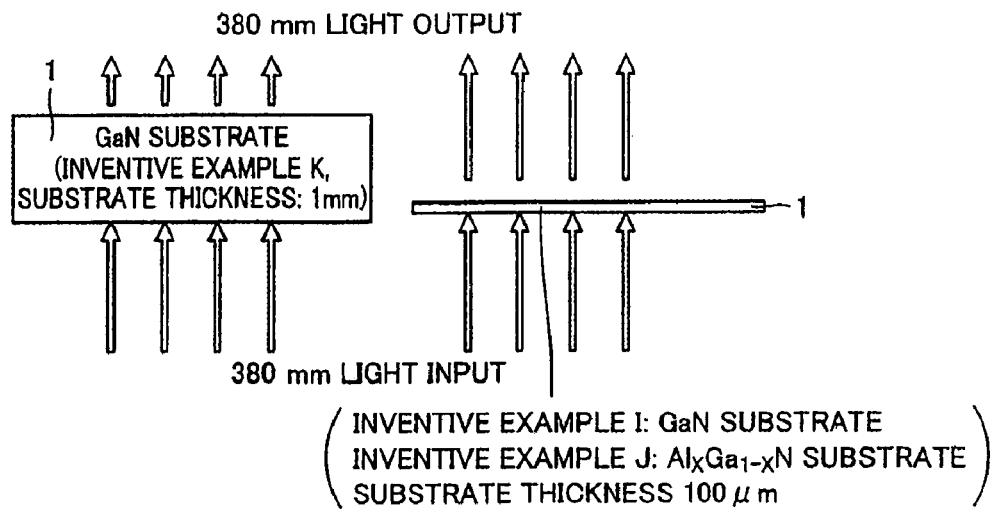
FIG. 27 is an illustration showing the state in which light passes through the substrate in the transmittance measurement test illustrated in FIG. 26.
Figure 28:
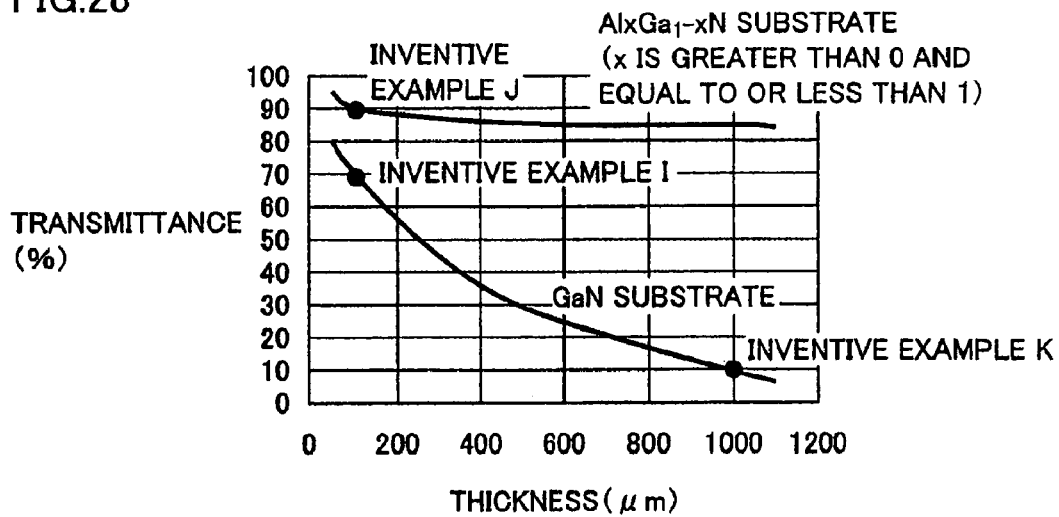
FIG. 28 is an illustration showing the influence of the thickness of the substrate on the transmittance.
Figure 29:
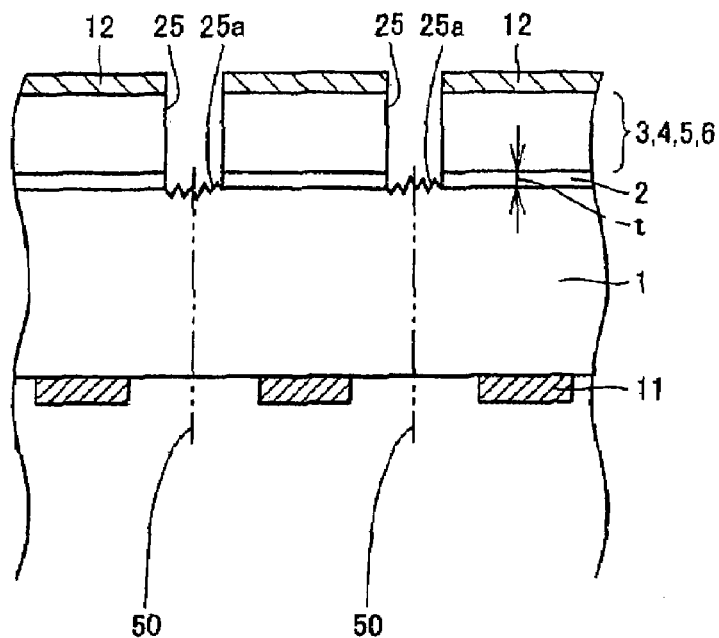
FIG. 29 is an illustration showing the state after etching for device separation in order to take LEDs of Inventive Example L out of a wafer according to a fifth embodiment.
Figure 30:
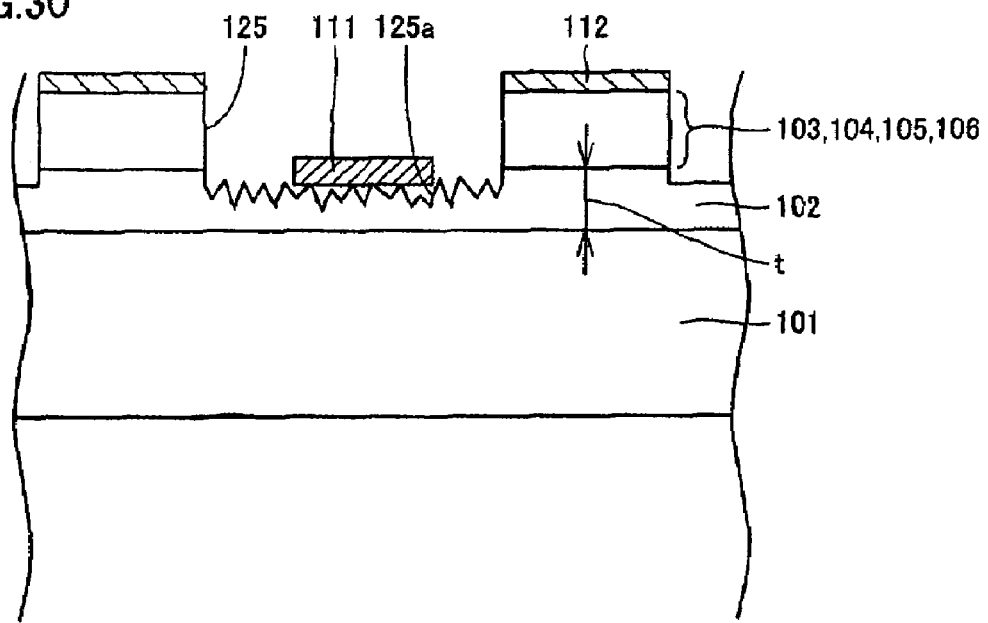
FIG. 30 is an illustration showing the state when etching for device separation in order to take LEDs of Comparative Example M out of a wafer and forming an n-electrode on the bottom of an etching slot according to the fifth embodiment.

Substrates 1 of Inventive Example I, J and Comparative Example K having different thicknesses were prepared and the transmittances of the examples for incident light with a wavelength of 380 nm were measured. FIGS. 26 and 27 illustrate the general outline of the light transmittance measurement tests. Inventive Examples I and J had a thickness of 100 μm, while Inventive Example K had a greater thickness of 1 mm (1000 μm). FIG. 28 illustrates the test results.

Referring to FIG. 28, the transmittances of Inventive Example I and J and Comparative Example K were 70%, 90% and 10%, respectively. As Inventive Example J, three types of substrates having Al atom ratios x of 0.2, 0.5 and 1 were fabricated and all of them had a transmittance of 90%.

Inventive Examples I, J and Comparative Example K equipped with a fluorescence material to be formed as white LEDs were mounted within an integrating sphere and then predetermined currents were applied to them. The values of output lights which were focused and output from a detector were compared. When a current of 20 mA was applied, Inventive Examples I and J and Comparative Example K generated outputs of 4.2 mW, 5.4 mW (all the aforementioned three types) and 0.6 mA, respectively. This difference was due to the transmittance difference among the substrates. GaN substrates have significantly-low transmittances with respect to lights with wavelengths smaller than 400 nm and in such a case an $Al_xGa_{1-x}N$ substrate may be employed as the present invention to generate higher light emission.

Also, by decreasing the thickness of the GaN substrate, higher light emission may be achieved. If the thickness is too small, the spread range of currents from the n-electrode to the MQW will become too small and if the thickness is too large the emission efficiency will be degraded as previously described. Thus, the thickness is preferably in the range of from 50 μm to 500 μm. Further, by using a thin GaN substrate with a thickness of about 100 μm as the inventive example, the fabrication cost of the GaN substrate may be reduced, which enables fabrication of a low cost light emitting device. It goes without saying that the cost may be reduced by decreasing the substrate thickness independently of the light emission wavelength.

Fifth Embodiment

In a fifth embodiment of the present invention, the fabrication yield of the thickness of the n-type GaN layer which is formed on a substrate will be described. Test samples employed were three samples, which were Inventive Example L having the same construction as that of Inventive Example A employing a GaN substrate and Comparative Examples M, N having the same construction as that of Comparative Example B employing a sapphire substrate.

(Inventive Example L)

(l1) The same processes as the corresponding processes of Inventive Example A were performed.

(l2) The following laminate construction was formed by MOCVD (see FIG. 2). (a GaN substrate/a GaN buffer layer/a Si-doped n-type GaN layer 2/a Si-doped n-type $Al_{0.2}Ga_{0.8}N$ layer being a clad layer/a MQW layer consisting of three layers each being a two-layers construction comprised of a GaN layer and an $In_{0.1}Ga_{0.9}N$ layer/an Mg-doped p-type $Al_{0.2}Ga_{0.8}N$ layer being a clad layer/an Mg-doped p-type GaN layer) was formed. Referring to FIG. 2, the thickness t of Si-doped n-type GaN layer 2 was set to 100 nm.

(l3) to (l13) The same processes as the corresponding processes of Inventive Example A were performed.

Here, when etched slots 25 for device separation were formed, the etched slot bottoms 25a were not completely flat and had some projections and depressions. In the case of Inventive Example L, even if the center portion reached the GaN substrate or buffer layer, it was not required to form an electrode etc. at this portion and therefore some changes in the depth or bottom flatness of this portion less affected the fabrication yield.

(Comparative Example M)

(m1) The same process as the corresponding process of Inventive Example B was performed.

Figure 6:
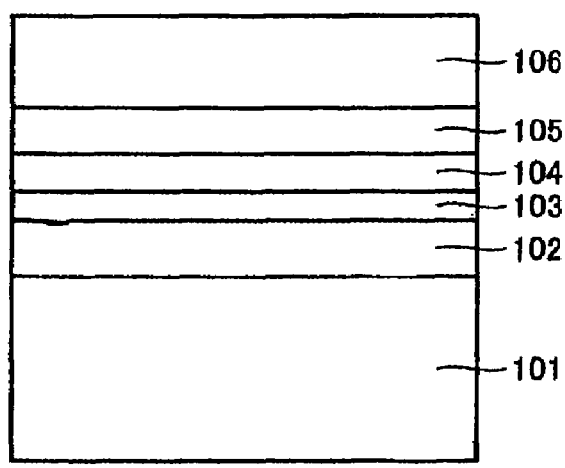
FIG. 6 is an illustration showing the laminate construction including a light emitting layer of the LED of Comparative Example B.

(m2) The following laminate construction was fabricated on a sapphire substrate by MOCVD (see FIG. 6). (A sapphire substrate/a GaN buffer layer/a Si-doped n-type GaN layer/Si-doped n-type $Al_{0.2}Ga_{0.8}N$ layer being a clad layer/a MQW layer consisting of three layers each consisting of a two-layers construction of a GaN layer and an $In_{0.15}Ga_{0.85}N$ layer/Mg-doped p-type $Al_{0.02}Ga_{0.8}N$ layer/a Mg-doped p-type GaN layer) was formed. Referring to FIG. 6, the thickness of Si-doped n-type GaN layer 102 was 3 μm.

(m3) to (m11) The same processes as the corresponding processes of the Inventive Example B were performed. Here, when etched slots 125 for device separation were formed, the etched slot bottoms 125a were not completely flat and had some projections and depressions. However, in the case of Comparative Example M, Si-doped n-type GaN layer 102 had the large thickness of 3 μm, and therefore the center portion did not reach the buffer layer and the sapphire layer. As a result, some changes in the depth or the bottom flatness of this portion less affected the fabrication yield.

(Comparative Example N)

(n1) The same process as the corresponding process of Inventive Example B was performed.

(n2) The following laminate construction was fabricated on a sapphire substrate by MOCVD (see FIG. 6). (a GaN buffer layer/a Si-doped n-type GaN layer/Si-doped n-type $Al_{0.2}Ga_{0.8}N$ layer being a clad layer/a MQW layer consisting of three layers each consisting of a two-layers construction of a GaN layer and an $In_{0.15}Ga_{0.85}N$ layer/Mg-doped p-type $Al_{0.2}Ga_{0.8}N$ layer/a Mg-doped p-type GaN layer) was formed. Referring to FIG. 6, the thickness of Si-doped n-type GaN layer 102 was 100 μm.

(n3) to (n4) The same processes as the corresponding processes of Inventive Example B were performed.

(n5) In the case of Comparative Example N, a GaN-based multi-layer film with a different lattice constant from that of sapphire was formed on the sapphire substrate, and therefore when the thickness of the n-type GaN layer was 100 μm and thus too small, a multi-layer film with a high quality could not be obtained and the light emission output was extremely low.

Figure 31:
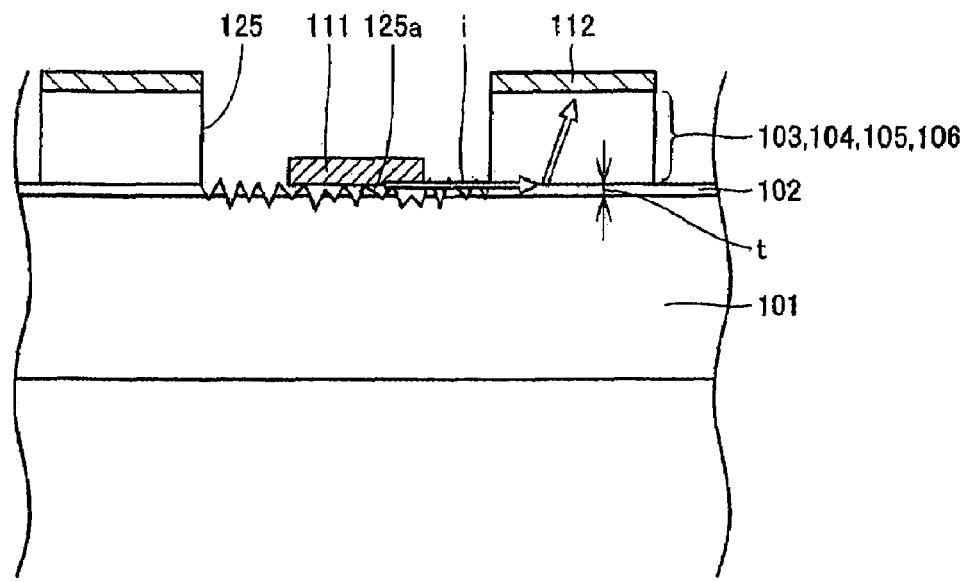
FIG. 31 is an illustration showing the state when etching for device separation in order to take LEDs of Comparative Example N out of a wafer and forming an n-electrode on the bottom of an etching slot according to the fifth embodiment.

Further, in the case of Comparative Example N, the sapphire substrate was an insulator and therefore it was necessary to form the n-electrode on the grown-films side similarly to the p-electrode. Therefore, an attempt was made to expose the n-type GaN layer for forming the n-electrode by etching this wafer from the Mg-doped p-type layers side to the Si-doped n-type GaN layer by photolithography technique and RIE using Cl-based gas. However, as illustrated in FIG. 31, in Comparative Example N, the thickness of the Si-doped n-type GaN layer was 100 μm (0.1 μm) and thus small, it was impossible to uniformly expose the n-type GaN layer in the wafer. Therefore, there appeared in the exposed surface the n-type $Al_xGa_{1-x}$ layer or the GaN buffer layer depending on the area. Wet etching using thermal phosphoric acid, etc. was also attempted, any etchants provided the same results.

(Results of Experiments)

The light outputs were determined in the same manner as the first embodiment, and as a result, Inventive Example L generated an output of 8 mW for an applied current of 20 mA. On the other hand, Comparative Example M generated an output of 7.2 mW for the same applied current. Further, in the construction of Inventive Example L, even though the thickness of the n-type GaN layer was decreased from 3 μm to 10 nm, equivalent output was obtained. Further, the n-electrode may be provided on the N-surface of the conductive GaN substrate, and therefore it was unnecessary to expose the Si-doped n-type GaN layer.

The film thickness of the light emitting device grown on the substrate is, depending on the wavelength or output to be generated, generally 6 μm or less, and the thickness of the Si-doped n-type GaN layer which occupies most of it may be decreased from 3 μm to 100 nm according to the inventive example. As a result, with the inventive example, the cost of film growth may be drastically decreased.

As described with respect to the process (n5) of the test sample of Comparative Example N, if the n-type GaN layer is made thinner to 100 nm (0.1 μm), the yield of the n-type GaN layer exposure will be drastically degraded, which is not practical. Also, even if uniform exposure is realized by future technology advances, since the thickness of the layer is too small, the current density of currents flowing through the n-type GaN layer in the direction parallel to the layer significantly increases and consequently heat generation becomes significant, which prevents practical light outputs from being obtained, as Comparative Example B in the first embodiment (see FIG. 31). Of course, it goes without saying that the same effects may be achieved even when a fluorescence material is employed to form a white-emitting LED or the light emitting wavelength was changed.

Sixth Embodiment

In a sixth embodiment of the present invention, the influence of the dislocation density of the GaN substrate on the light output will be described. Test samples employed were two samples which were Inventive Example O with a dislocation density of $1E6/cm^2$ and Comparative Example P with a dislocation density of $1E9/cm^2$. Inventive Example O and Comparative Example P had the same construction as that of Inventive Example A.

(Inventive Example O)

(o1) An n-type GaN off-substrate angled by 0.5° with respect to the c-plane was employed. This substrate had a resistivity of 0.01 Ω·cm and a dislocation density of $1E6/cm^2$. This GaN substrate had a thickness of 400 μm.

(o2) to (o11) The same processes as the corresponding processes of Inventive Example A were performed.

(Comparative Example P)

(p1) An n-type GaN off-substrate angled by 0.5° with respect to the c-plane was employed. This substrate had a resistivity of 0.01 Ω·cm and a dislocation density of $1E9/cm^2$.

This GaN substrate had a thickness of 400 μm, which was the same as that of Inventive Example O.

(p2) to (p11) The same processes as the corresponding processes of Inventive Example A were performed.

(Results of Experiments)

The light outputs were determined as the same manner as the first embodiment. As a result, Inventive Example O and Comparative Example P both generated an output of 8 mW for an applied current of 20 mA and generated outputs of 40 mW and 30 mW respectively for an applied current of 100 mA. Thus, Inventive Example O may generate a higher light emission output as compared with Comparative Example P.

Inventive Example O and Comparative Example P had the same resistivity and thickness and therefore cause equivalent heat generation and heat radiation. In order to verify that the aforementioned light output difference was not due to influences of heat, a pulse current with a duty ratio of 1%, an applied time of 1 μs and a cycle time of 100 μs was applied and comparison was made. This test results were equivalent to the aforementioned results and thus Inventive Example O and Comparative Example P generated outputs of 40 mW and 30 mW, respectively, for an applied current 100 mA.

Therefore, although the mechanism was not made apparent, a light emission output difference was generated at a high current density due to the dislocation density difference and not influences of heat. The inventors have verifies that the same effects may be obtained when the light emitting wavelength or the layer construction are changed or a fluorescence material is provided to form a white LED.

Seventh Embodiment

In a seventh embodiment of the present invention, the influence of non-mirror-surface finishing of the surface and the end face on the light output will be described. Test samples employed were Inventive Examples Q and R. Inventive Example Q was an LED illustrated in FIG. 32 in which the surface and the end face had been non-mirror-surface finished. Inventive Example R was an LED illustrated in FIG. 33 which had not been non-mirror-surface finished.

(Inventive Example Q)

(q1) to (q7) The same processes as the corresponding processes of Inventive Example F were performed.

(Process steps to be inserted between q7 and q8) The N-surface of the GaN substrate and the device end face were made to be non-mirror-surfaces. The method for making them to be non-mirror surfaces was performed by dry etching such as RIE or wet etching. Besides this non-mirror-surface finishing method using etching, a method which mechanically polishes may be utilized. In the present embodiment, a method which performs wet etching using a KOH solution as the etchant was employed. A KOH solution of 4 mol/l was sufficiently agitated with the temperature maintained at 40° C. and then the wafer was dipped within the stirrer for 30 minutes to non-mirror-surface finish the N-surface of the GaN substrate and the device end face.

(q8) to (q11) The same processes as the corresponding processes of Inventive Example F were performed.

(Comparative Example R)

This was the same as Inventive Example F.

(Results of Experiments)

Figure 32:
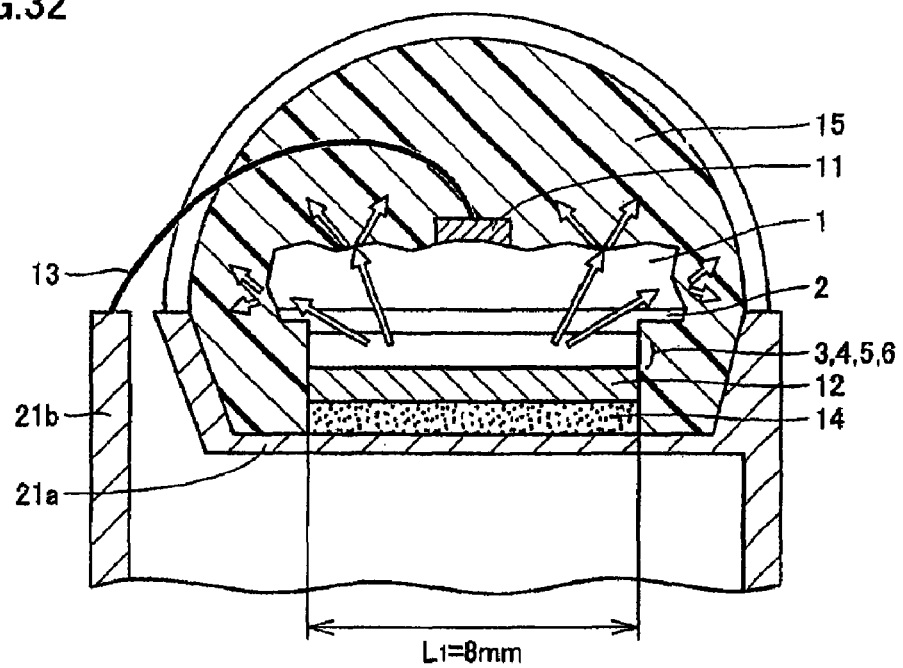
FIG. 32 is an illustration showing an LED of Inventive Example Q according to a seventh embodiment.
Figure 33:
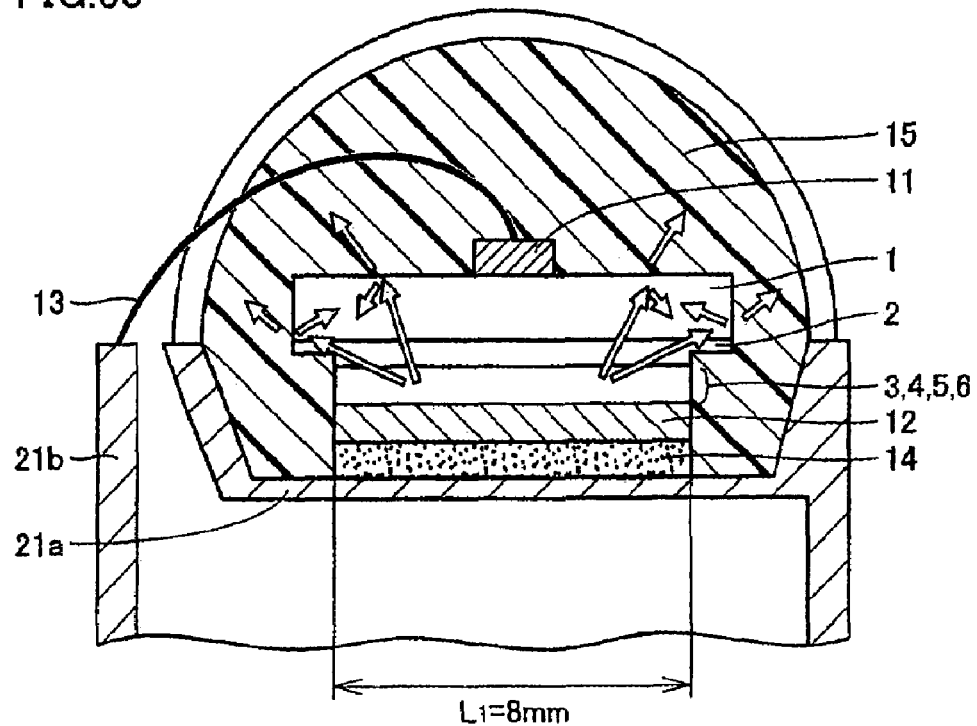
FIG. 33 is an illustration showing an LED of Inventive Example R according to the seventh embodiment.

The light output was determined as the same manner as the first embodiment. As a result, Inventive Example Q and Comparative Example R, respectively, generated outputs of 4.8 W and 4 W for an applied current of 10 A. Further, in the case Inventive Example Q and Comparative Example R were equipped with a fluorescence material to be formed as a white LED, Inventive Example Q generated an output of 1150 lm and Comparative Example R generated an output of 960 lm. Namely, Inventive Example Q generated a higher light emission output. It goes without saying that the same effects may be obtained even when the light emission wavelength is changed. This is because when the surface and the end face of the substrate and the n-type GaN layer are in a mirror-surface state, as illustrated in FIG. 33, total internal reflection is prone to occur at the surface of the GaN having a high refractive index, and therefore light is less prone to being passed therethrough. On the other hand, as illustrated in FIG. 32, when non-mirror-surface finishing is applied, the efficiency of light emission to the outside may be increased.

Further, the inventors have found from experiments that when KOH solution is employed for non-mirror-surface finishing, equivalent effects may be obtained by performing the non-mirror-surface finishing using KOH solution with a concentration within the range of 0.1 to 8 mol/l and a temperature within range of 20 to 80° C.

Eighth Embodiment

In an eighth embodiment of the present invention, influence of the reflectivity of the p-type electrode on the light output will be described. Test samples employed were five samples which were Inventive Examples S, T, U, V and W.

(Inventive Example S)

(s1) to (s6) The same processes as the corresponding processes of Inventive Example F were performed.

(s7) The p-electrode was fabricated by the following method. An Ni layer with a thickness of 4 nm and an Au layer with a thickness of 4 nm were formed from the bottom layer in contact with the p-type GaN layer. Then, it was heat-treated in an inert atmosphere. Then, an Ag layer with a thickness of 100 nm was formed on the above Au layer. The p-electrode fabricated in the aforementioned method had a contact resistance of 5E-4 $\Omega \cdot cm^2$.

Further, of the aforementioned p-electrode, (an Ni layer with a thickness of 4 nm/an Au layer with a thickness of 4 nm) formed in order from the bottom layer in contact with a glass plate was subjected to the same heat treatment and the transmittance was determined. As a result, the transmittance with respect to 450 nm-incident light from the Ni layer side was 70%. Further, an Ag layer with a thickness of 100 nm was formed on a glass plate and the reflectivity was determined. As a result, a reflectivity of 88% was obtained with respect to 450 nm-incident light. Then, (an Ni layer with a thickness of 4 nm/an Au layer with a thickness of 4 nm/an Ag layer with a thickness of 100 nm) was formed on a glass substrate with the Ni layer at the bottom and the same heat treatment was applied. Then, the transmittance was determined. As a result, a reflectivity of 44% was obtained with respect to 450 nm-incident light. This reflectivity corresponds to the reflectivity when 450 nm-incident light passes through the (Ni layer with a thickness of 4 nm/Au electrode layer with a thickness of 4 nm) with a transmittance of 70%, then is reflected at the Ag layer with a reflectivity of 88% and then passes thorough (the Ni layer with a thickness of 4 nm and the Au electrode layer with a thickness of 4 nm), again, with a transmittance of 70%.

(s8) to (s11) The same processes as the corresponding processes of Inventive Example F were performed.

(Inventive Example T)

(t1) to (t6) The same processes as the corresponding processes of Inventive Example F were performed.

(t7) The p-electrode was fabricated by the following method. An Ni layer with a thickness of 4 nm and an Au layer with a thickness of 4 nm were formed in order from the bottom side on the p-type GaN layer. Then, it was heat-treated in an inert atmosphere. Then, an Al layer with a thickness of 100 nm and an Au layer with a thickness of 100 nm were formed on the aforementioned Au layer. The p-electrode fabricated in the aforementioned method had a contact resistance of 5E-4 $\Omega \cdot cm^2$.

Further, of this electrode, a laminate construction of (an Ni layer with a thickness of 4 nm/an Au layer with a thickness of 4 nm) was formed on a glass plate and the same heat treatment was applied to this construction. Then, the transmittance was determined and as a result the transmittance was 70% with respect to 450 nm-incident light from the Ni layer side. Also, an Al layer with a thickness of 100 nm was formed on a glass plate and the reflectivity was determined. As a result, the reflectivity was 84% with respect to 450 nm-incident light. Also, a laminate construction of (an Ni layer with a thickness of 4 nm/an Au layer with a thickness of 4 nm/an Al layer with a thickness of 100 nm) was formed in order from the bottom on a glass substrate and the same heat treatment was applied. Then, the transmittance was determined and as a result, a reflectivity of 42% was obtained with respect to 450 nm-incident light. This reflectivity corresponds to the reflectivity calculated for the case where 450 nm-incident light passes through the (Ni layer with a thickness of 4 nm/Au electrode layer with a thickness of 4 nm) with a transmittance of 70%, then is reflected at the Au layer with a reflectivity of 42% and then passes thorough the (Ni layer with a thickness of 4 nm/Au electrode layer with a thickness of 4 nm), again, with a transmittance of 70%.

(t8) to (t11) The same processes as the corresponding processes of Inventive Example F were performed.

(Inventive Example U)

(u1) to (u6) The same processes as the corresponding processes of Inventive Example F were performed.

(u7) As the p-electrode, Rh which was an ohmic electrode with respect to the p-type GaN layer and had a high reflectivity and a thickness of 100 nm was formed on the entire surface of the p-type GaN layer. The contact resistance was 5e-4 $\Omega \cdot cm^2$. Further, this electrode Rh was formed on a glass plate and the transmittance was determined. As a result, the transmittance was 60% with respect to 450 nm-incident light.

(u8) to (u11) The same processes as the corresponding processes of Inventive Example F were performed.

(Inventive Example V)

(v1) to (v7) The same processes as the corresponding processes of Inventive Example S were performed.

(Process steps to be inserted between v7 and v8) The same processes as those inserted between q7 and q8 of Inventive Example Q were performed.

(v8) to (v11) The same processes as the corresponding processes of Inventive Example S were performed.

(Inventive Example W)

Inventive Example W was the same as Inventive Example F.

(Results of Experiments)

Figure 34:
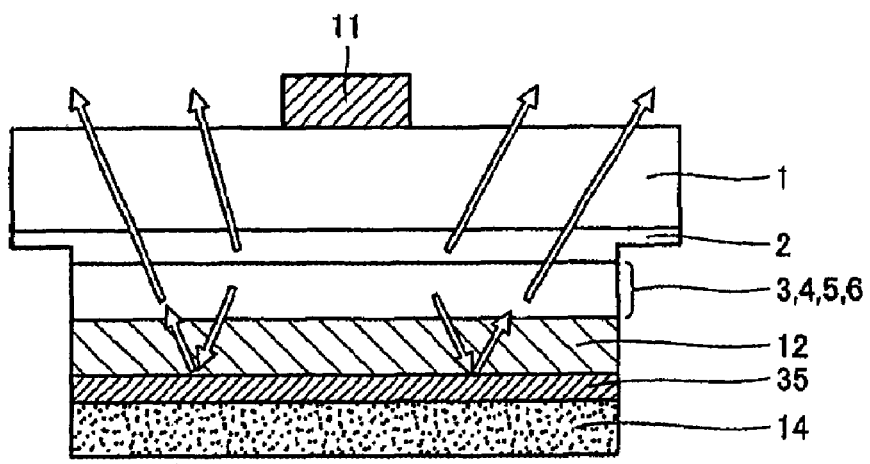
FIG. 34 is an illustration showing an LED of Inventive Examples S and T according to an eighth embodiment.
Figure 35:
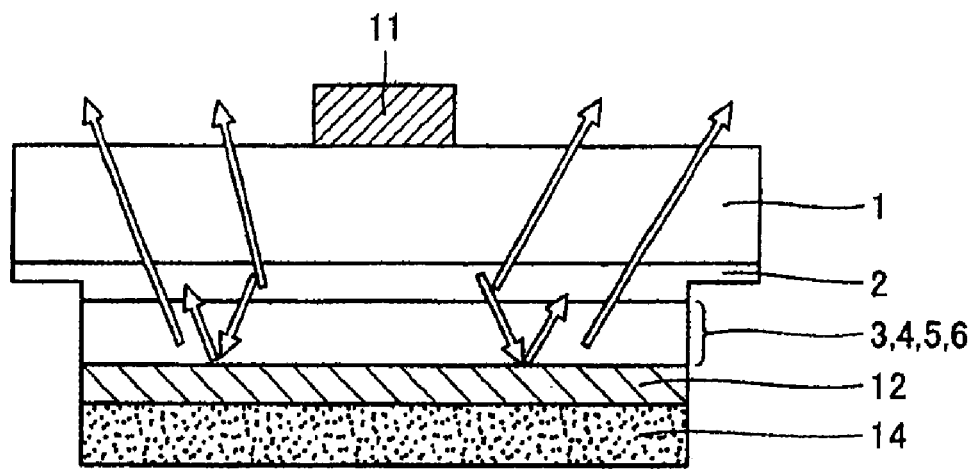
FIG. 35 is an illustration showing an LED of Inventive Example U according to the eighth embodiment.
Figure 36:
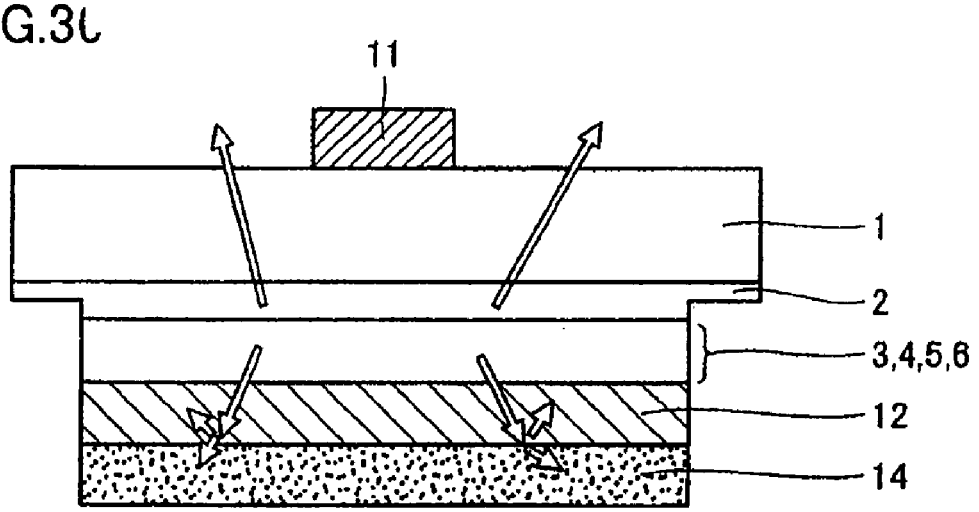
FIG. 36 is an illustration showing an LED of Inventive Example W according to the eighth embodiment.

The light outputs were determined in the same manner as the first embodiment. As a result, Inventive Examples S, T, U, V and W generated outputs of 4.8 mW, 4.8 mW, 5.2 mW, 5.8 mW and 4 W for an applied current of 10 A. A diagram of reflections at the mounting sides of Inventive Examples S, T is illustrated in FIG. 34, a diagram of reflections at the mounting side of Inventive Example U is illustrated in FIG. 35 and a diagram of reflections at the mounting side of Inventive Example W is illustrated in FIG. 36. In Inventive Examples S, T, a high reflective layer 35 is placed between p-electrode 12 and conductive adhesive 14, while in Inventive Example U, p-electrode 12 itself was a high reflectivity material, and in Inventive Example V, non-mirror-surface finishing had been applied. Further, in Inventive Example W, any consideration was not given to reflections at the mounting side.

When Inventive Examples S, T, U and V were provided with a fluorescence material to be formed as white LEDs, they generated outputs of 864 lm, 864 lm, 936 lm and 1044 lm, respectively, for an applied current of 10A. According to these results, by forming the p-electrode from a high reflectivity material or by placing a high reflectivity material between the p-electrode and the conductive adhesive, efficient light utilization is enabled and accordingly the light output may be increased. Namely, by introducing Ag, Al or Rh reflective film into the p-electrode itself or between the p-electrode and conductive adhesive, the light emission output was further increased. Further, as Inventive Example V, by forming the N-surface of the GaN substrate and the end face as non-mirror surfaces, the light emission output could be further increased.

Although the degree of effects can not be flatly described because when the light emission wavelength is changed the reflectivity of the Ag layer or Al layer and the absorption index of the Ni layer are changed, the effects may be obtained for any wavelength. Also, instead of Rh, an element with an equivalent or more work function and an equivalent or more reflectivity may be employed to achieve equivalent or more effects.

Ninth Embodiment

In a ninth embodiment of the present invention, the relation between the oxygen concentration and resistivity of the GaN substrate and the light transmittance was grasped. It is characterized in that based on the relation, there was established the relation between optimal GaN substrate thicknesses and oxygen concentrations for predetermined light emission areas, in a light emitting device which was p-down-mounted, namely using a GaN substrate as the light emitting surface. As described above, in the case of p-down-mounting, the light emitting surface is the GaN substrate, and therefore the oxygen concentration which significantly affects the resistivity and the light transmittance is particularly important.

Figure 37:
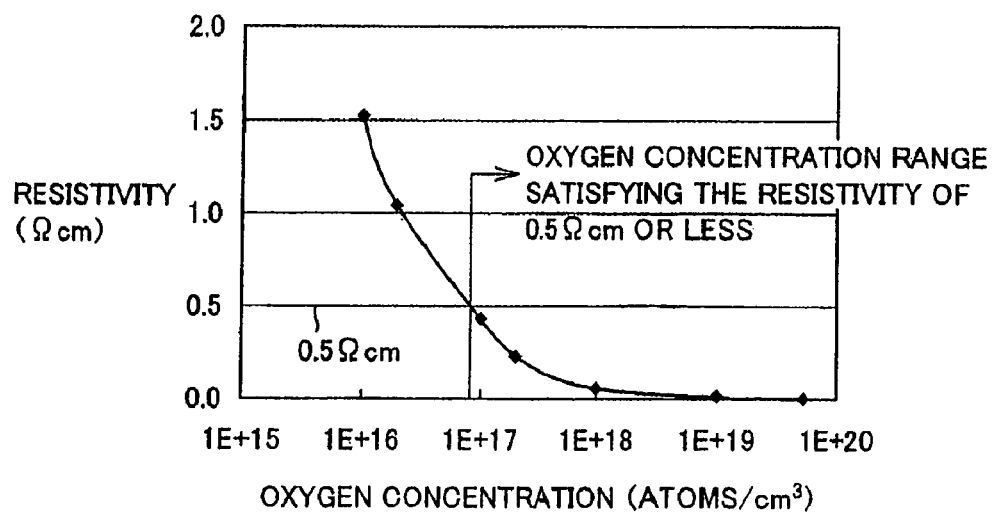
FIG. 37 is an illustration showing the influence of the oxygen concentration on the resistivity of the GaN substrate according to a ninth embodiment.
Figure 38:
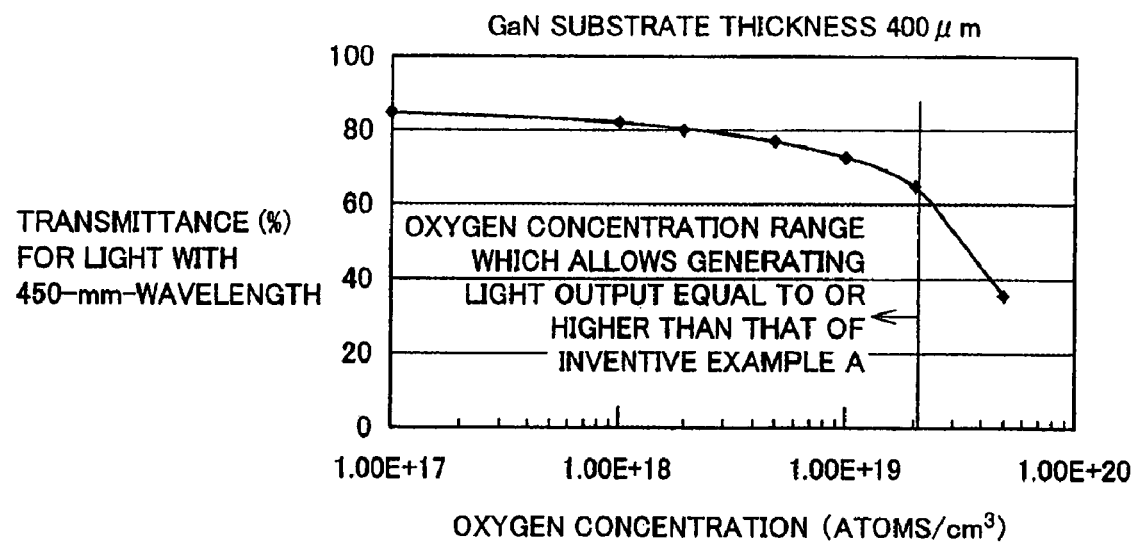
FIG. 38 is an illustration showing the influence of the oxygen concentration on the transmittance of the GaN substrate with respect to light (450 nm wavelength) according to the ninth embodiment.

FIG. 37 is an illustration showing the influence of the oxygen concentration on the resistivity of the GaN substrate. According to FIG. 37, resistivities equal to or lower than 0.5 $\Omega \cdot cm$ may be realized by setting the oxygen concentration to $1E17/cm^3$ or higher. FIG. 38 is an illustration showing the influence of the oxygen concentration on the transmittance for light with a wavelength of 450 nm in the case of a —GaN substrate of 400 μm. From the same figure, it can be seen that when the oxygen concentration exceeds $2E19/cm^3$, the transmittance for light with a wavelength of 450 nm drastically decreases. From FIGS. 37 and 38, increasing the oxygen concentration is effective in decreasing the resistivity of the GaN substrate and widening the light emitting surface, but decreases the light transmittance. Therefore, how to set the oxygen concentration, the GaN substrate thickness and the light emitting plan surface size of a GaN surface used in a light emitting device down-mounted is significantly important.

Figure 39:
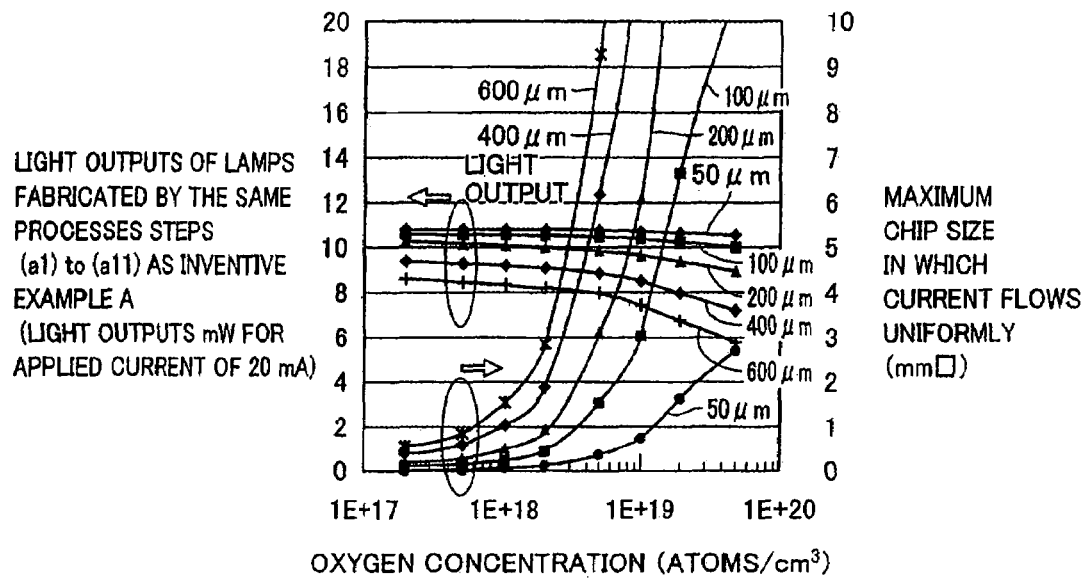
FIG. 39 is an illustration showing the light outputs of light emitting devices and plan surface sizes in which currents flow uniformly, wherein the light emitting devices were fabricated from GaN substrates having varying thicknesses and oxygen concentrations.

FIG. 39 is an illustration showing the results of determination of the light outputs and the plan surface sizes of lamps in which currents uniformly flows, wherein the lamps were fabricated from GaN substrates having varying thicknesses and oxygen concentrations in Inventive Example A. With respect to the light outputs of the lamps, the larger the thickness and also the higher the oxygen concentration, the lower the light output. Also, with respect to the maximum plan surface size in which current flows uniformly, the larger the thickness and also the higher the oxygen concentration, the larger the plan surface size.

According to FIG. 39, when the plan surface size in which current flows uniformly is to be a square with a side length of 4 mm (a side length of 5 mm), for example, in order to obtain a light output of about 8 mW or more with the size of Inventive Example A and an applied current of 20 mA, the oxygen concentration may be set to equal to or greater than $6E18/cm^3$ for a GaN substrate with a thickness of 200 μm (equal to or greater than $8E18/cm^3$ for a square with a side length of 5 mm) to ensure a light output of 8 mW or more with the size of Inventive Example A and an applied current of 20 mA, and also achieve uniform light emission. Namely, when the current density is made consistent with the applied current of 20 mA for the size of Inventive Example A having a square shape with a side length of 300 μm, it corresponds to an applied current of 3.6 A (5.6A) for a square with a side length of 4 mm (a side length of 5 mm) and therefore by applying 3.6 A (5.6 A), a light output of 1.4 W (2.3 W) or more may be ensured in proportion to the applied current and uniform light emission may be achieved.

Also, for a GaN substrate with a thickness of 400 μm and for the same target performance as the aforementioned thickness 200 μm, the oxygen concentration may be set to $3E18/cm^3$ or more for a square with a side length of 4 mm ($4E18/cm^3$ or more for a square with a side length of 5 mm). However, in the case of a thickness of 400 μm, the oxygen concentration must be set to below $2E19/cm^3$ in order to obtain an light output of about 8 mW or more with the size of Inventive Example A when applying 20 mA.

Further, in the case of a GaN substrate with a thickness of 600 μm, the limit value of the oxygen concentration which causes the light output to be 8 mW or more for the size of Inventive Example A and the applied current of 20 mA is only slightly higher than $2.5 E18/cm^3$ which causes currents to flow uniformly in a square area with a side length of 4 mm. Therefore, there is only narrow oxygen concentration range which satisfies the aforementioned two conditions. On the other hand, the oxygen concentration which causes currents to flow uniformly in the square area with a side length of 3 mm is about $2E18/cm^3$ and therefore the oxygen concentration permissible range becomes slightly larger as compared with a square with a side length of 4 mm.

Further, according to FIG. 39, in the case where the thickness of the GaN substrate is in the range of 200 μm to 400 μm, there is a sufficiently large oxygen concentration permissible range which enables flowing currents uniformly through a square with a side length of 10 mm and obtaining an output of about 8 mW or more with the size of the Inventive Example A when applying 20 mA. In the case of a thickness of 200 μm, this may be enabled by oxygen concentrations equal to or greater than $2E19/cm^3$. Also, for a thickness of 400 μm, this may be enabled by oxygen concentrations equal to or greater than $8E18/cm^3$.

Next, concrete embodiments will be described. In the embodiments, the following test samples were employed.

(Inventive Example S1)

A GaN substrate with a thickness of 400 μm which had been n-typed with an oxygen concentration of $1E19/cm^3$. The resistivity of this GaN substrate was 0.007 Ω·cm and the transmittance for light with a wavelength of 450 nm was 72%. When constructing a light emitting device using the aforementioned GaN substrate, the portions other than the aforementioned were in the same conditions as that of Inventive Example A. Namely, the plan surface size of the GaN substrate was set such that the light emitting surface had a square shape with a side length of 0.3 mm (see (a1) in the first embodiment). (a2) The following laminate construction was formed on the Ga surface, which was a first main surface, of the GaN substrate by MOCVD. This had a laminate construction of (a Si-doped n-type GaN layer/a Si-doped n-type $Al_{0.2}Ga_{0.8}N$ layer being a clad layer/MQW consisting of three layers each being of a two-layers construction comprised of a GaN layer and an $In_{0.15}Ga_{0.85}N$ layer/an Mg-doped p-type $Al_{0.2}Ga_{0.8}N$ layer being a clad layer/an Mg-doped p-type GaN layer).

(Comparative Example T1)

A GaN substrate which had a thickness of 400 μm and had been n-typed with an oxygen concentration of $5E19/cm^3$ was employed. The resistivity of the GaN substrate was 0.002 Ω·cm and the transmittance for light with a wavelength of 450 nm was 35%. The conditions other than the aforementioned conditions were the same as those of Inventive Example S1.

(Comparative Example T2)

A GaN substrate which had a thickness of 400 μm and had been n-typed with an oxygen concentration of $2E16/cm^3$ was employed. The resistivity of this GaN substrate was 1.0 Ω·cm and the transmittance for light with a wavelength of 450 nm was 90%. The conditions other than the aforementioned conditions were the same as those of Inventive Example S1.

(Experiments and Results)

P-down mounted light emitting devices of the aforementioned test samples were constructed and a current of 20 mA was applied to them. Inventive Example S1 generated a light output of 8 mW. On the other hand, Comparative Examples T1. generated only 4 mW and Comparative Example T2 generated a light output of only 5 mW. It may be said that the light output of 4 mW of Comparative Example T1 was an output commensurate with the transmittance of the GaN substrate. The state of light emission at the second main surface side of the GaN substrate, which was the light emitting surface, of Comparative Example T2 was observed, and as a result, light emission intensity differences were found within the surface. Namely, the light emission intensity was extremely high around the n-electrode and the light emission intensity drastically decreased with increasing distance from the n-electrode. This was because currents flowing thorough the n-electrode did not sufficiently spread within the surface of the light emitting device because of the large resistivity of the GaN substrate. Therefore, light emission occurred only around the p-electrode where currents concentrated. As a result, the light emission output from the entire light emitting device of Comparative Example T2 was lower than that of Inventive Example S1.

Tenth Embodiment

A tenth embodiment of the present invention is characterized in that the density of dislocation bundle in the GaN substrate of a p-down-mounted light emitting device is restricted to increase the light output. In forming the GaN substrate, in order to improve the crystallinity of most areas of the GaN substrate, dislocations which unavoidably generate are concentrated and dislocation bundles are distributed discretely to increase the crystallinity of most areas therebetween in the GaN substrate. It has been proven that since the GaN substrate is placed at the light emitting side in a p-down-mounted light emitting device, if the density of dislocation bundles exceeds a predetermined value (a dislocation bundle density of $4E2/cm^2$), then it will significantly affect the fabrication yield of light emitting devices to an extent beyond estimated.

Figure 40:
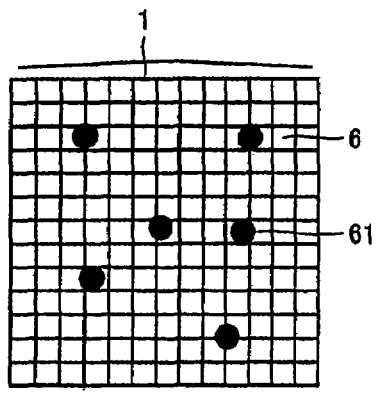
FIG. 40 is an illustration showing dislocation bundles in the GaN substrate transferred to an epitaxial layer.
Figure 41:
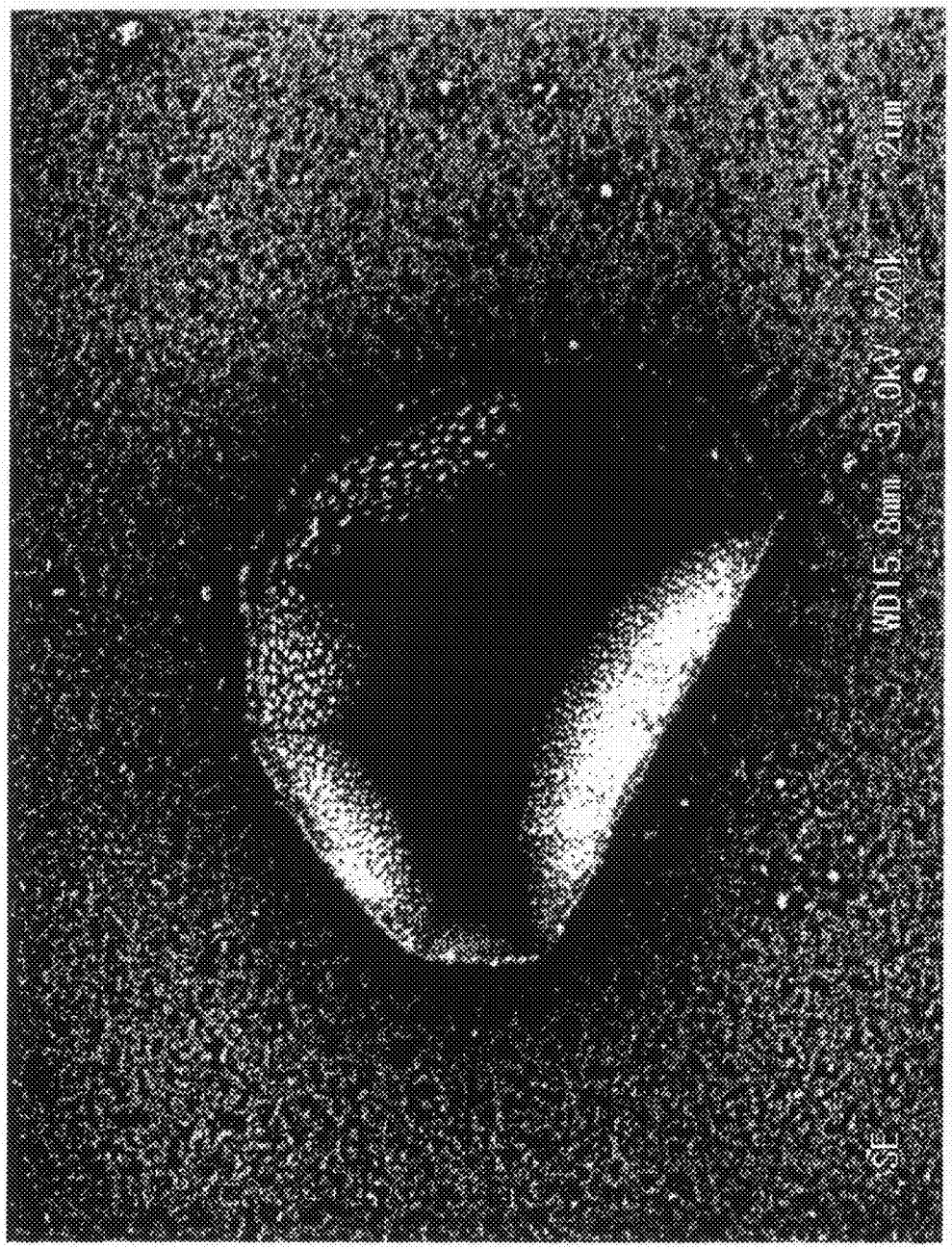
FIG. 41 is an illustration showing a dislocation bundle transferred to an epitaxial layer to be a hole-shape recess.

Dislocation bundles in the GaN substrate as aforementioned are transferred to p-type GaN layer 6 which is an epitaxial film and appear on the epitaxial layer as bundles 61, as illustrated in FIG. 40. Therefore, the dislocation bundles density substantially corresponds to the bundle density. These bundles 61 are hole-shaped recesses as illustrated in FIG. 41 depending on the film forming condition of the epitaxial film. The density of hole-shaped recesses drastically affects the fabrication yield, in the case of p-down-mounted light emitting devices including a GaN substrate as the emitting surface.

The employed test samples were as follows.

(Inventive Example S2)

A GaN substrate in which there is a single dislocation bundles per area of 500 μm×500 μm on average was employed. This corresponds to a dislocation density of $4E2/cm^2$. The other conditions are the same as those of Inventive Example S1.

(Comparative Example T3)

As the comparative example, a GaN substrate in which there is a single dislocation bundle per area of 10 μm×10 μm on average was employed. This corresponds to a dislocation density of $1E6/cm^2$. The other conditions are the same as those of Inventive Example S2.

(Experiments and Results)

A plurality of light emitting devices were constructed from the respective above GaN substrates on an actual production basis. A current of 20 mA was applied to the respective test samples and the yield of light emitting devices capable of generating light outputs equal to or higher than 8 mW was determined. As a result, the yield was 95% in the case of Inventive Example S2 and the yield was 50% in the case of Comparative Example T3. Namely, when the dislocation bundle density is equal to or lower than $4E2/cm^2$, yields which allows actual fabrication may be achieved. However, the dislocation bundle density exceeds the above density, it becomes impossible to actually fabricate light emitting devices continuously on a commercial basis.

Light emitting devices which were not capable of generating a light output of 8 mW were disassembled and the chip were taken out therefrom and inspected. The electrodes were removed from the chips taken out by using a proper acid solution and the chips were inspected from the p-type semiconductor layer side. As a result, there were observed a plurality of examples in which the epitaxial layer was not formed in the area of the GaN substrate where dislocation bundles distributed. In the areas where dislocation bundles distributed, hole-shaped recesses with diameters of about 1 μm were observed The above hole-shaped recesses were not found in light emitting devices capable of generating light outputs equal to or higher than 8 mW.

Further, in the step corresponding to the fabrication step (a7) of Inventive Example A of the first embodiment, a current of 20 mA was applied to the aforementioned test samples. The driving voltages of the light emitting devices including above hole-shaped recesses were all lower than 1 V. This is because the layers in the p-electrode side and the layers in the n-electrode side were electrically short-circuited since hole-shaped recesses were embedded with the electrode, and as a result currents did not spread through the active layer and sufficient amounts of currents were not supplied, which resulted in lower light output.

Eleventh Embodiment

Figure 42:
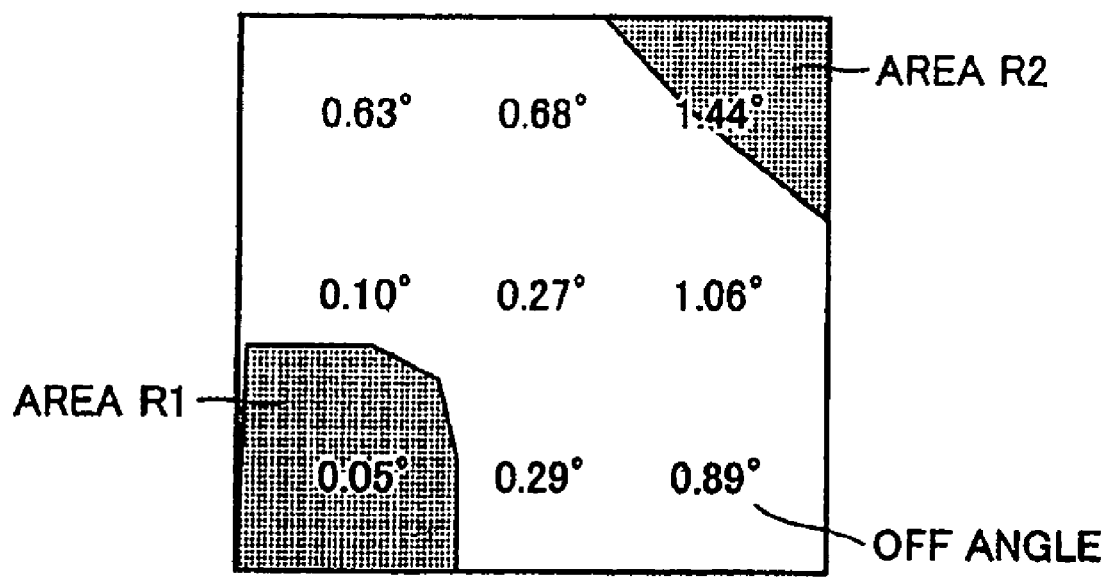
FIG. 42 is an illustration showing an off-angle distribution with respect to the c-plane of a GaN substrate of 20 mm×20 mm.
Figure 43:
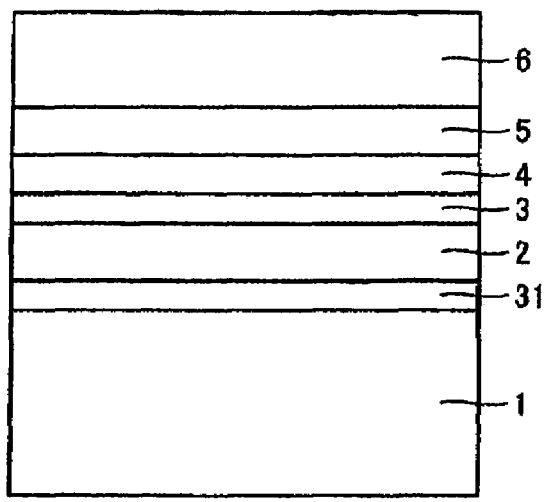
FIG. 43 is an illustration showing a construction in which a buffer layer is placed between the GaN substrate and the AlGaN clad layer according to an eleventh embodiment.

An eleventh embodiment is characterized in that an n-type AlGaN buffer layer and an n-type GaN buffer layer are placed between the GaN substrate and the n-type AlGaN clad layer 3. In general, substrates have warpage and GaN substrates have particularly large warpage. Therefore, in a GaN substrate, the off angle significantly varies within the substrate surface, as illustrated in FIG. 42. FIG. 42 illustrates an exemplary off-angle distribution with respect to the c-plane of a GaN substrate of 20 mm×20 mm. When an epitaxial film is formed on this GaN substrate and then the GaN substrate is divided into light emitting devices and then the light outputs are determined, the light emitting device formed at the area R1 placed at a corner and having an small off-angle of 0.05° level and the light emitting device formed at the area R2 having a large off-angle of 1.5° level can not generate light outputs of 8 mW or higher for an applied current of 20 mA. This is due to that the crystallinity of the epitaxial film formed on the GaN substrate is not high. Therefore, as illustrated in FIG. 43, by placing an n-type AlGaN buffer layer 31 having a lattice constant which is middle of those of GaN substrate I and AlGaN clad layer 3 between both the layers, the difference of lattice constant was alleviated. More specifically, it is characterized in that n-type AlGaN buffer layer 3 is placed at the aforementioned place.

The following test samples were employed.

(Inventive Example S3)

In the GaN substrate employed, as illustrated in FIG. 42, in the surface of 20 mm×20 mm, the off-angle with respect to the c-plane continuously varied from an area with an off-angle of 0.05° to an area with an off-angle of 1.5°. This GaN substrate had a resistivity of 0.01 Ω·cm, a dislocation density of $1E7/cm^2$, and a thickness of 400 μm. By using the GaN substrate having an off-angle distribution, light emitting devices were fabricated from respective positions of the above substrate of 20 mm×20 mm, according to the fabrication processes (a1) to (a11) of Inventive Example A of the first embodiment. At this time, as illustrated in FIG. 43, an $Al_{0.15}Ga_{0.85}N$ buffer layer having a thickness of 50 nm was placed between GaN substrate 1 and n-type GaN buffer layer 2.

(Comparative Example T4)

A GaN substrate in which in the surface of 20 mm×20 mm the off-angle with respect to the c-plane continuously varied from an area with an off-angle of 0.05° to an area with an off-angle of 1.5° was employed. This GaN substrate had a resistivity of 0.01 Ω·cm, a dislocation density of $1E7/cm^2$, and a thickness of 400 μm. A plurality of light emitting devices were fabricated from respective positions, according to the fabrication processes (a1) to (a11) of Inventive Example A of the first embodiment. In Comparative Example T4, an n-type GaN layer was formed in contact with GaN substrate 1 and an $Al_{0.15}Ga_{0.85}N$ buffer layer was not placed between the GaN substrate and the n-type GaN buffer layer.

(Experiments and Results)

Figure 44:
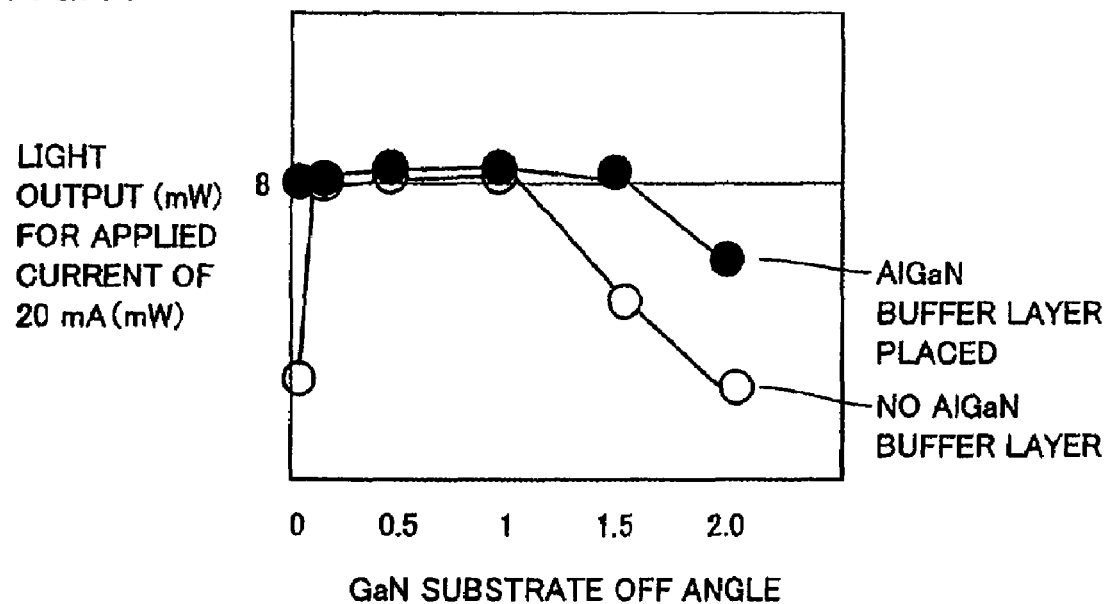
FIG. 44 is an illustration showing the results of widening the off-angle range which allows generating an light output of 8 mW or more.

When a current of 20 mA was applied to the light emitting devices, Inventive Example S3 generated light outputs equal to or higher than 8 mW at the areas of 0.05° to 1.5° including the aforementioned areas R1, R2 (see FIG. 44). However, in Comparative Example T4, only the light emitting devices formed at the areas with an off-angles of 0.10 to 1.0° generated light outputs equal to or higher than 8 mW. At the areas with off-angle levels of 0.050° and 1.5°, the light outputs were lower than 8 mW.

This is because even though a GaN substrate in which the off angle significantly varies is employed, an epitaxial layer having an excellent crystallinity may be formed by placing an $Al_{0.15}Ga_{0.85}N$ buffer layer as described above, according to Inventive Example S3.

Eleventh Embodiment (2)

An eleventh embodiment (2) of the present invention is characterized in that by placing an n-type AlGaN buffer layer and an n-type GaN buffer layer between the GaN substrate and n-type AlGaN clad layer 3, hole-shaped recesses illustrated in FIG. 41, which are formed when the epitaxial film is formed on dislocation bundle areas in the GaN substrate as the tenth embodiment, are eliminated.

(Inventive Example S2-2)

A GaN substrate with a diameter of 2 inch in which there is a single dislocation bundle per area of 10 μm×10 μm was employed, similarly to Comparative Example T3. This corresponds to a dislocation density of $1E6/cm^2$. As illustrated in FIG. 43, an $Al_{0.15}Ga_{0.85}N$ buffer layer with a thickness of 50 nm was placed between GaN substrate 1 and n-type buffer layer 2. The other conditions were the same as those of Inventive Example S2.

(Experiments and Results)

After forming the epitaxial layer, the wafer surface at the epitaxial layer side was observed by a differential interference microscope and a SEM (scanning electron microscope). As a result, it was observed that there was no hole-shape recess as illustrated in FIG. 41. An edge of about 5 mm was removed from the perimeter of the GaN substrate with a diameter of 2 inch, and the remaining GaN substrate was all constructed into light emitting devices. Light emitting devices were taken out with a ratio of one out of 50 light emitting devices and a current of 20 mA was applied to the light emitting devices. The yield of light emitting devices capable of generating a light output of equal to or higher than 8 mW was determined. This result was a yield of 100%. It is considered that when fabricating more devices an yield which is below 100% because of other fabrication factors than hole-shape recess and near 100% may be achieved. However, from the above yield test result focused on hole-shape recesses, a yield of 100%, which is specifically desirable, was obtained.

Twelfth Embodiment

A twelfth embodiment is characterized in that a p-type AlGaN layer having an increased conductivity is placed outside of MQW4/p-type AlGaN clad layer 5/p-type GaN layer 6 and an Ag electrode layer having a high reflectivity is placed on the entire surface as the p-electrode. Therefore, there is no other metal electrode provided in consideration of work function. This construction has a high reflectivity at the down-side bottom, and therefore light absorption which would occur in the case of using other metal electrodes may be reduced and light emission efficiency may be increased.

The test samples were as follows.

Figure 45:
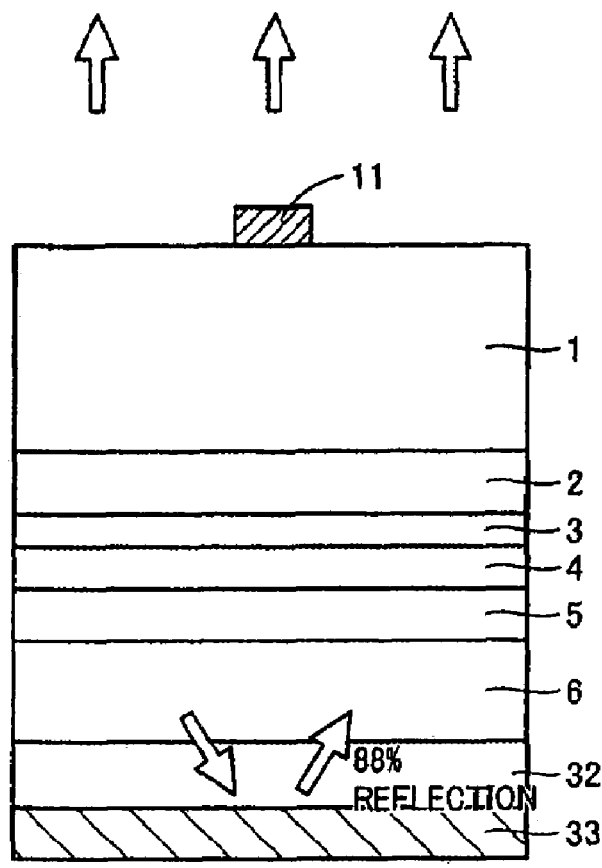
FIG. 45 is an illustration showing a light emitting device according to a twelfth embodiment.

(Inventive Example S4 (see FIG. 45))

Similarly to Inventive Example A, the following laminate construction was fabricated on the Ga surface, which is a first surface, of a GaN substrate.

/MQW4/Mg-doped p-type $Al_{0.2}Ga_{0.8}N$ layer 5 being a clad layer/Mg-doped p-type GaN layer 6/an Mg-doped InGaN layer 32 with a thickness of 5 nm/

The above laminate construction was characterized in that it had Mg-doped InGaN layer 32 with a thickness of 5 nm in contact with Mg-doped p-type GaN layer 6. Also, while in Inventive Example A according to the first embodiment an Ni/Au electrode layer was formed in process step (a7), the process step of (a7) was not performed and instead of this an Ag electrode layer 33 with a thickness of 100 nm was formed.

(Comparative Example T5)

In the construction of Inventive Example A of the first embodiment, an Ag electrode layer with a thickness of 100 nm was formed in contact with the Ni/Au electrode layer.

(Experiments and Results)

In Inventive Example S4, there was p-type InGaN layer 32 in contact with p-type GaN layer 6, and therefore the acceptor level was low. Therefore, the carrier concentration increased and even though Ag reflective film 33 having a work function which was not significantly large was placed in contact with p-type InGaN layer 32 as the p-electrode, the contact resistance between Ag reflective film 33 and p-type InGaN layer 32 did not become significantly large. Comparison was made between the driving voltage of the light emitting device of Inventive Example S4 and the driving voltage of the light emitting device of Comparative Example T5. The difference therebetween was lower than 0.05 V and significant difference was not found.

Inventive Example S4 generated an light output of 11.5 mW when a current of 20 mA was applied, while Comparative Example T5 generated 9.6 mW. Inventive Example A generated 8 mW.

As previously described, Inventive Example S4 generated a higher light output because light traveling from the light emitting layer to the p-semiconductor layers side was reflected at the Ag layer with a reflectivity of 88% since there was no Ni/Au electrode layer and the light was not absorbed at an Ni/Au electrode layer. On the other hand, in Comparative Example T5, the light reflectivity at the p-electrode layer was: the absorption of 70% ×Ni/Au×the reflectivity of Ag×the re-absorption of 70% =44% and was low. As a result, in Inventive Example S4, the light output derived to the outside was 1.2 time that of Comparative Example T5.

Further, while in the present embodiment an Ag film was employed as the p-electrode, any material may be employed as long as the material has a high reflectivity and not-significantly-high contact resistance with p-type InGaN layer 32. For example, Al, or Rh may be employed.

Thirteenth Embodiment

Figure 46:
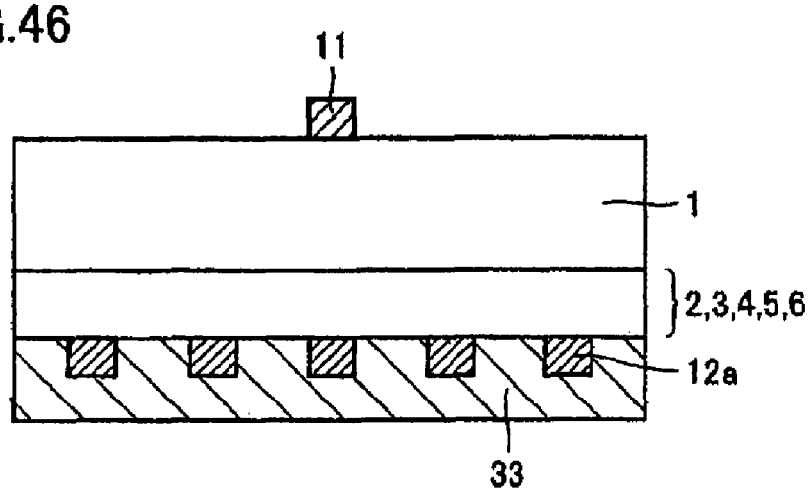
FIG. 46 is a cross sectional view focused on the p-electrode of the light emitting device according to a thirteenth embodiment.
Figure 47:
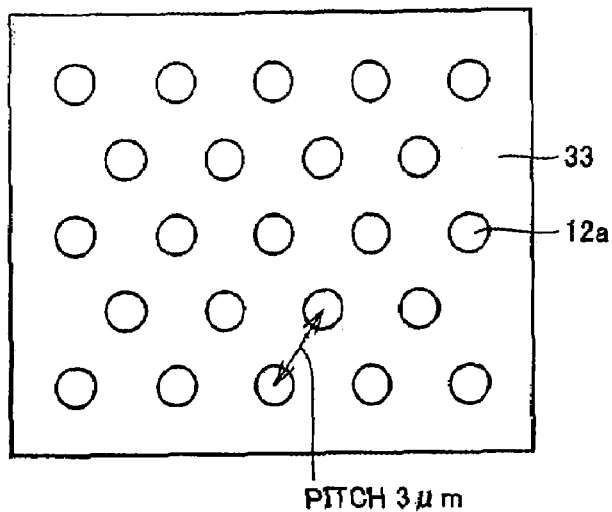
FIG. 47 is a plan view of the penetratively viewed p-electrode of the light emitting device according to the thirteenth embodiment.

A thirteenth embodiment is characterized in that as the p-electrode Ni/Au layers having a small contact resistance with the p-type GaN layer are discretely placed and an Ag film is applied so as to fill the gaps to increase the light output. FIG. 46 is a cross sectional view focused on the p-electrode. Ni/Au electrode layers 12a are placed with a predetermined pitch on the down-side bottom surface of the epitaxial layer. Further, an Ag layer 33 is placed to fill therebetween and cover the down-side bottom surface of the epitaxial layer and Ni/Au electrode layers 12a. FIG. 47 is a plan view of the p-electrode viewed through the upper part of the p-electrode.

The discrete Ni/Au electrode layers 12a generally have a pitch of 3 μm. The pitch of 3 μm is based on that the diameter of the range of current spread is 6 μm at best in the typical p-type GaN layer and the p-type AlGaN clad layer due to their resistivities. Namely, by setting the pitch to 3 μm, currents from a discrete electrode reaches the adjacent electrodes. In order to flow currents through the electrode layer without generating discontinuity, the pitch may be set to below 3 μm. However, if the pitch is excessively small, the effective amount of extracted light will be decreased by the discretely placed Ni/Au electrode layers.

Figure 48:
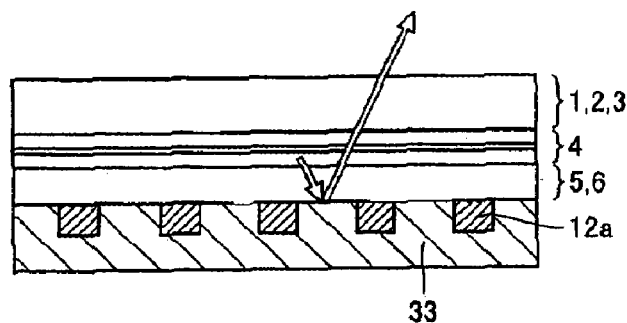
FIG. 48 is an illustration showing the light emission and reflection of Inventive Example S5 according to the thirteenth embodiment.

For example, when the area ratio of the discrete Ni/Au electrodes is 20%, light reflectivity (calculation)=the reflectivity of 88% ×the area ratio of 80% +the reflectivity of 40% ×the area ratio 20% =78% (calculation) is obtained, according to the construction of the p-electrode illustrated in FIGS. 47 and 48. Based on this calculation, the p-electrode with the above construction was actually fabricated and the light output was determined. The test samples were as follows.

(Inventive Example S5)

Inventive Example S5 was fabricated according to the same fabrication processes as those of Inventive Example A of the first embodiment. However, in the fabrication step (a7) of the p-electrode, an Ni layer with a thickness of 4 nm was formed in contact with the p-type GaN layer and an Au layer with a thickness of 4 nm was formed on the entire surface thereof. Then, patterning was performed using a resist mask to form discretely distributed Ni/Au electrodes (see FIGS. 46 and 47). Then, this was heat-treated in the atmosphere of an inert gas to change the contact resistance to 5E-4 Ω·cm². Then, an Ag layer was formed on the entire surface to fill the gaps of the Ni/Au electrodes and cover the Ni/Au electrodes to form a reflective electrode. The area of the discretely-placed Ni/Au layers on the p-type GaN layer was 20% and the area of Ag was 80%. Further, the pitch of Ni/Au electrode layers 12 was 3 μm (see FIG. 48).

(Comparative Example T6)

A laminate construction was formed on a GaN substrate according to the same fabrication processes as those of Inventive Example A of the first embodiment. As the p-electrode, Ni/Au layers were placed on the entire surface in contact with the p-type GaN layer according to the fabrication step (a7) and this was heat-treated. Then, unlike the construction of Inventive Example A, an Ag layer was formed on the entire surface in contact with the Ni/Au layer (see FIG. 49).

Figure 50:
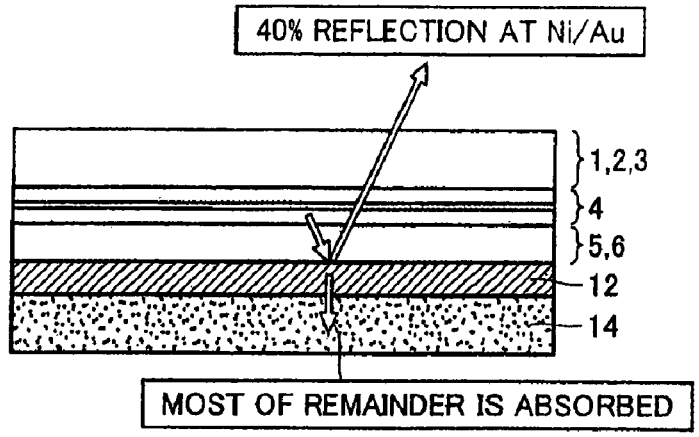
FIG. 50 is an illustration showing the light emission and reflection of Inventive Example A for comparison.

For comparison, the reflection behavior of light proceeding to the down side in the same light emitting device as Inventive Example A was shown in FIG. 50.

(Experiments and Results)

Figure 49:
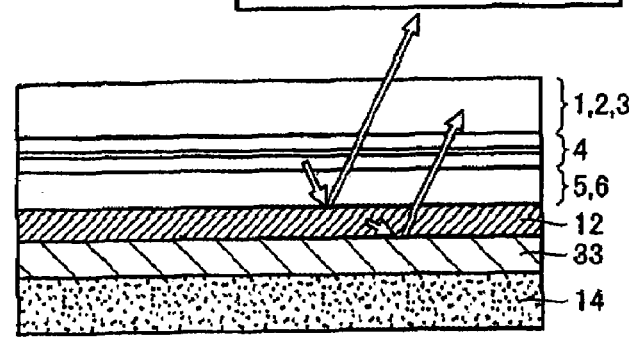
FIG. 49 is an illustration showing the light emission and reflection of Comparative Example T6 according to the thirteenth embodiment.

A current of 20 mA was applied to the respective light emitting device fabricated as described above and the light outputs were determined. Inventive Example S5 generated a light output of 11.5 mW, while Comparative Example T6 generated a light output of 9.6 mW. Further, the ratio of the light which was reflected at the p-electrode and then emitted from the emitting surface, of the light proceeding from the active layer to the mounting side (down side), reached 86% (see FIG. 48). On the contrary, the ratio of Comparative Example T6 was 67% (FIG. 49). On the other hand, the above ratio of Inventive Example A was 40% (FIG. 50).

In Inventive Example S5, the Ag which occupies 80% of the p-electrode reflects 80% of the light proceeding to the down side with a reflectivity of 88% and the Ni/Au layers which occupy 20% of the p-electrode reflect 20% of the light with a reflectivity higher than 40% (which is not simply a reflectivity of 40%). As a result, the above ratio of Inventive Example S5 was 86%. In Comparative Example T6, the light is further reflected by the Ag layer placed at the down side of the Ni/Au layers and therefore the above ratio becomes larger than that of Inventive Example A by the amount of the reflected light.

It goes without saying that Comparative Example T6 belongs to the Inventive Example in the broadest sense. It is defined as a comparative example for convenience in order to explain the present embodiment.

The above Ni/Au electrode layers may be substituted with Pt electrode layers or Pd electrode layers. Further, the reflective electrode Ag layer may be substituted with a Pt layer or a Rh layer.

Similarly, when the area ratio of the Ni/Au electrodes is 10%, the light output is 11.8 mW when 20 mA is applied and when the area ratio of the Ni/Au electrodes is 40%, the light output is 10.6 mW when 20 mA is applied. Thus, depending on the area ratio, Inventive Example S5 generates an light output higher than that of Comparative Example T6. However, it has been proven from experiments of the inventors that when the area ratio of the Ni/Au electrodes is lower than 10% and is 2%, the light output of Inventive Example S5 is only 9.6 mW, which is equivalent to that of Comparative Example T6, and there is generated significant light emission unevenness around the Ni/Au electrodes.

Fourteenth Embodiment

Figure 51:
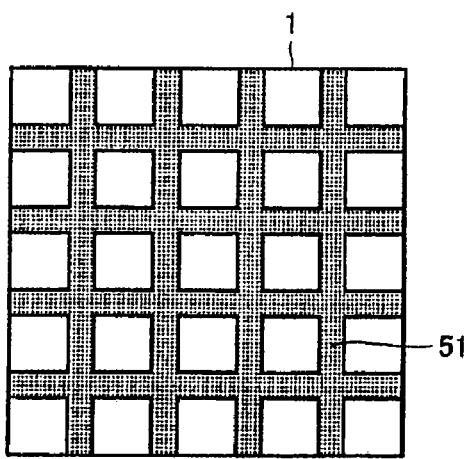
FIG. 51 is an illustration showing the main surface of a GaN substrate in which plate-shape crystal inversion domains appear in a lattice shape in a fourteenth embodiment of the present invention.
Figure 52:
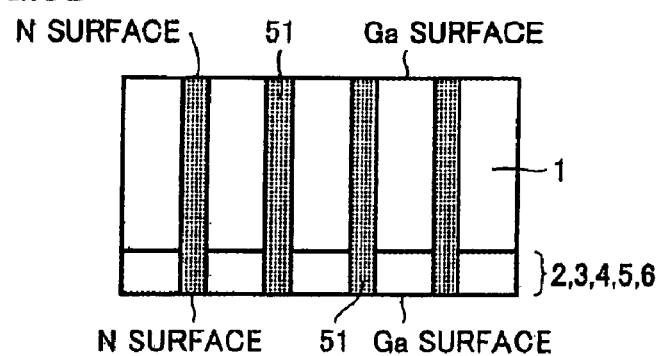
FIG. 52 is cross sectional view of the GaN substrate illustrating the plate-shape crystal inversion domain of FIG. 51.

A fourteenth embodiment of the present invention is characterized in that a plurality of parallel plate-shape crystal inversion domains propagated from the GaN substrate to the epitaxial layer are removed and p-electrodes are placed at the respective gap areas of the plate crystal inversion domains. In the GaN substrate, plate-shape crystal inversion domains are distributed in parallel with the thick-wise direction of the GaN substrate and appear in a stripe shape on the main surface of the GaN substrate and the plate crystal inversion domains propagate to the epitaxial layers 2, 3, 4, 5 and 6. In FIGS. 51 and 52, plate-shape crystal inversion domains are placed in a lattice shape on the main surface. In fabricating a nitride semiconductor substrate, areas where dislocation bundles (=core) are concentrated have a crystal arrangement which is inverted with respect to the surrounding crystal arrangement. Therefore, plate-shaped crystal inversion domains and dislocation bundles are the same in that the crystal arrangement is inverted with respect to that of the surrounding areas. The difference between the both is that in the case of dislocation bundles, dislocations are concentrated into a string shape or thick-line shape and therefore the crystal inversion domain has a string shape, while in the case of plate-shaped crystal inversion domains, the crystal inversion domains have a plate shape. Namely, in the case of plate-shaped crystal inversion domains, dislocations are distributed with a higher density in a plane-shape area with a thickness.

Figure 53:
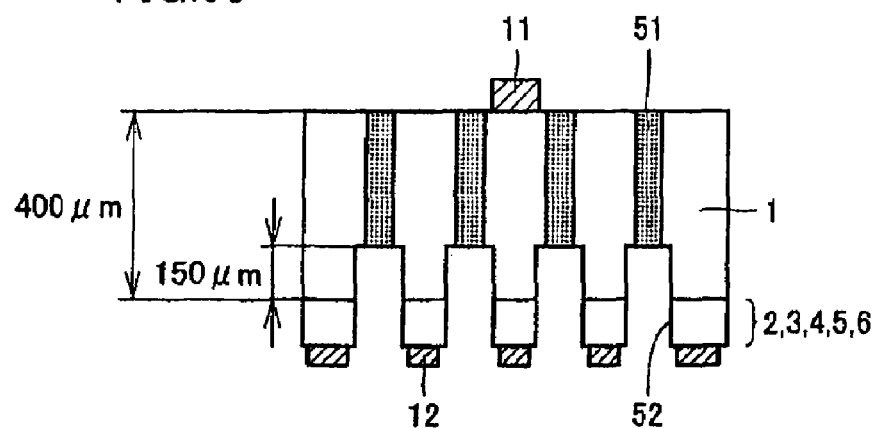
FIG. 53 is cross sectional view illustrating Inventive Example S6 of the fourteenth embodiment of the present invention.

The present embodiment is characterized in that crystal inversion domains in the epitaxial layers are completely removed and also crystal inversion domains in the GaN substrate are removed to a predetermined depth in the first main surface side, and then the respective epitaxial layers are isolated and p-electrodes are provided on the respective isolated epitaxial layers (see FIG. 53). The plate-shape crystal inversion domains may be lattice-shape inversion domains in which plate-shape crystal inversion domains intersect one another on the main surface or may be parallel arrangement in which plate-shape crystal inversion domains are distributed in alignment in a fixed direction on the main surface, as will be described later.

(Inventive Example S6)

In the GaN substrate illustrated in FIGS. 51 and 52, the first main surface at the epitaxial layer side has a surface orientation of (0001) surface or c-plane. The crystal inversion domains, which are symmetric with respect to the first main surface, are (000-1) surface or -c plane and are grown with the c-axis inverted. In the c-plane the surface is a Ga surface in which Ga atoms are arranged, while in the crystal inversion domains the surface is an N surface in which N atoms are arranged. In Inventive Example S6, a GaN substrate in which crystal inversion domains with a width of 30 μm are arranged with a pitch of 100 μm in a lattice shape on the first main surface was employed. The crystal inversion domains propagate to the epitaxial films formed on the GaN substrate.

A laminate construction was formed using the above GaN substrate according to the same fabrication processes as those of Inventive Example A (see steps (a1) to (a6) of Inventive Example A). In the step for forming the p-electrode, the following process was performed instead of (a7). Namely, by using a mask pattern which covers only the crystal inversion domains propagated to the p-type GaN layer as illustrated in FIG. 52, p-electrode layer was formed on the c-plane areas at the mask gaps, and then the mask pattern was removed.

Subsequently, the semiconductor substrate was held within 8N (normality)-KOH at 80° C. with the entire second main surface (back side) of the above GaN substrate covered with a mask to remove the crystal inversion domains on the first main surface by etching through the epitaxial layers such as the p-type GaN layer to the inside of the GaN substrate and thus slots 52 were formed. The plate-shape crystal inversion domains 51 were dislocation-concentrated areas having a high dislocation density and therefore easily etched out by KOH. The etching depth into the GaN substrate was to the position at a depth of 150 μm inside the GaN substrate from the interface between the epitaxial layers and the GaN substrate. Then, the mask was removed and an insulator film was deposited so as to fill slots 52 (FIG. 53).

(Tests and Test Results)

The above Inventive Example S6 was constructed into a light emitting device and a current of 20 mA was applied. The light emitting device generated a light output of 9.6 mW. This light output is 1.2 times the light output of 8 mW of Inventive Example A.

Figure 54:
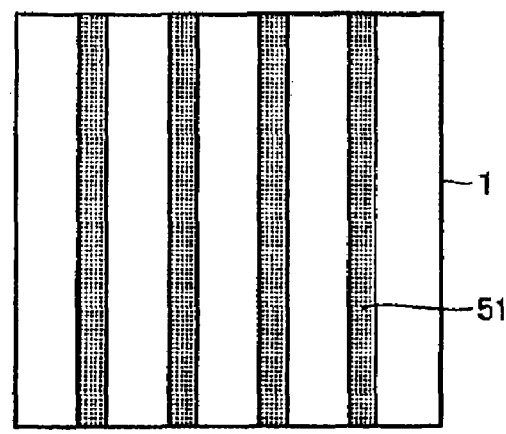
FIG. 54 is a plan view illustrating plate-shape crystal inversion domains in a parallel placement different from FIG. 51, which is included in the fourteenth embodiment of the present invention.
Figure 55:
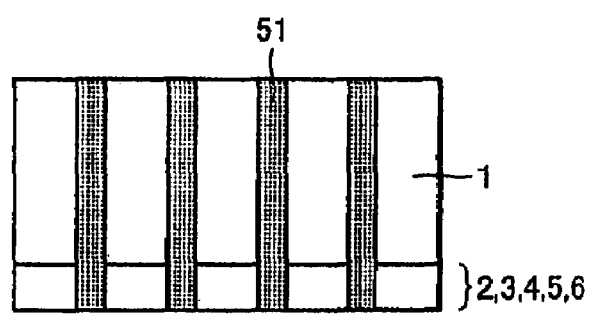
FIG. 55 is cross sectional view of FIG. 54.

As previously described, while in Inventive Example S6, the plate-shape crystal inversion domains were arranged in a lattice shape, the plate-shape crystal inversion domains are not required to be a lattice shape and may be plate-shape crystal inversion domains arranged only in parallel along a fixed direction on the main surface of the GaN substrate, as illustrated in FIG. 54 (plan view) and FIG. 55 (cross sectional view). Further, even in the case where a nitride semiconductor substrate in which dot-shaped (plane-shaped or small-circle-shaped, in actual) crystal inversion domains regularly exist, it is possible to obtain light outputs larger than that of Inventive Example A similarly to Inventive Example S6, depending on the size or depth of the etching holes.

Fifteenth Embodiment

A fifteenth embodiment of the present invention is characterized in that a fluorescence plate 46 is placed opposite to GaN substrate I above the semiconductor chip and the semiconductor chip is sealed with a resin 15. There is novelty in the construction in which a fluorescence plate is placed opposite to the GaN substrate forming the light emitting surface in a p-down-mounted construction. Test samples employed are Inventive Examples S7 and S8 and a Comparative Example T7.

(Inventive Example S7)

Figure 56:
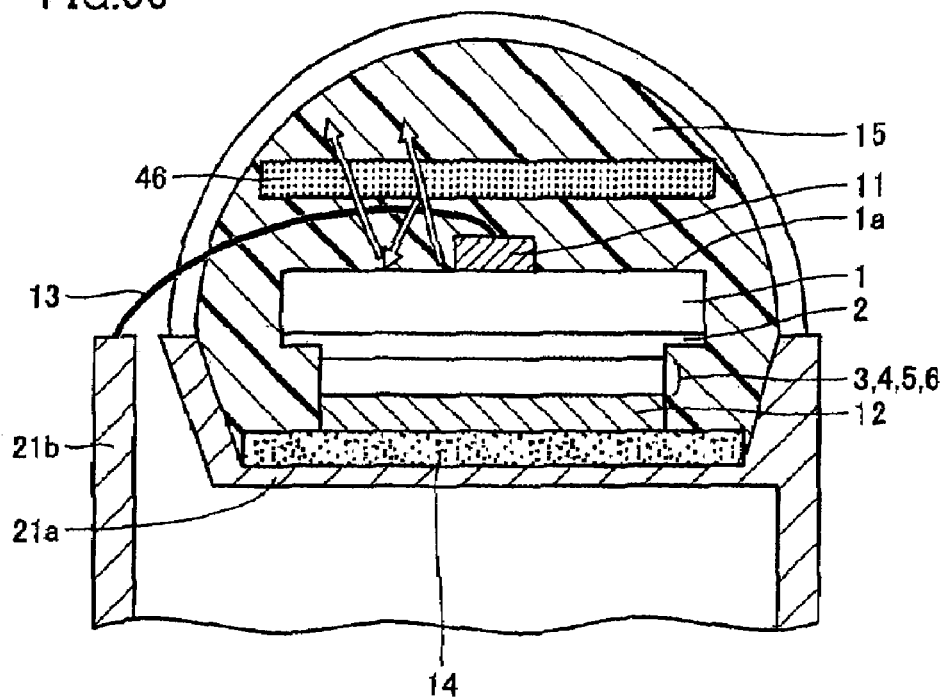
FIG. 56 is a cross sectional view showing the light emission and reflection of Inventive Example S7 according to a fifteenth embodiment.

Inventive Example S7 was basically fabricated according to the fabrication processes of Inventive Example F illustrated in the third embodiment. As illustrated in FIG. 56, above a p-down-mounted chip, a fluorescence plate 46 is placed opposite to the back side of the GaN substrate 1 and the chip was sealed with an epoxy resin 15 to form a white light emission device.

The above fluorescence plate 46 was fabricated by the following fabrication method. A bulk ZnSSe crystal in which I (iodine) had been diffused by halogen transport method and this bulk ZnSSe crystal was heated in the atmosphere of Zn and Cu to diffuse Cu into the ZnSSe. Then, this bulk ZnSSe crystal was polished to a thickness of 0.5 mm using a coarse polishing machine and was cut into a shape which could be accommodated in the lead frame. The roughness of the surface and the backside of the fluorescence plate was Rmax=1 μm.

(Inventive Example S8)

Figure 57:
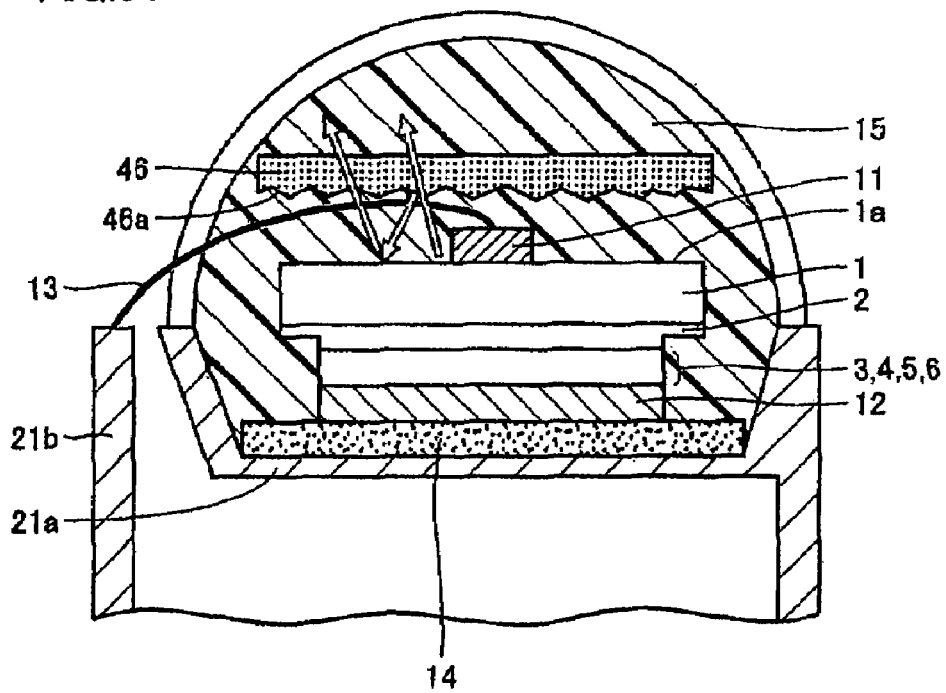
FIG. 57 is a cross sectional view showing the light emission and reflection of Inventive Example S8, which is another embodiment of the fifteenth embodiment.

In Inventive Example S8, projections and depressions were formed on the surface 46a of the above fluorescence plate 46 which faces the GaN substrate (see FIG. 57). The height of the projections and depressions was 2 μm and the average pitch of the projections and depressions was 5 μm. Other structures were the same as those of Inventive Example S7.

(Comparative Example T7)

Figure 58:
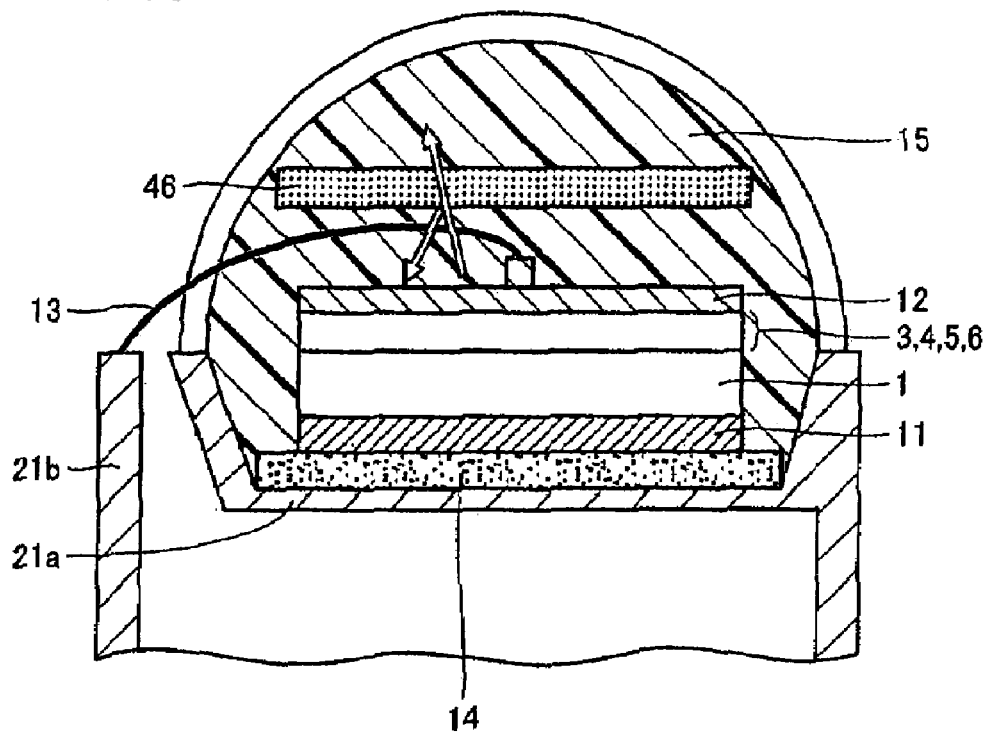
FIG. 58 is a cross sectional view showing the light emission and reflection of Comparative Example T7 according to the fifteenth embodiment.
Figure 59:
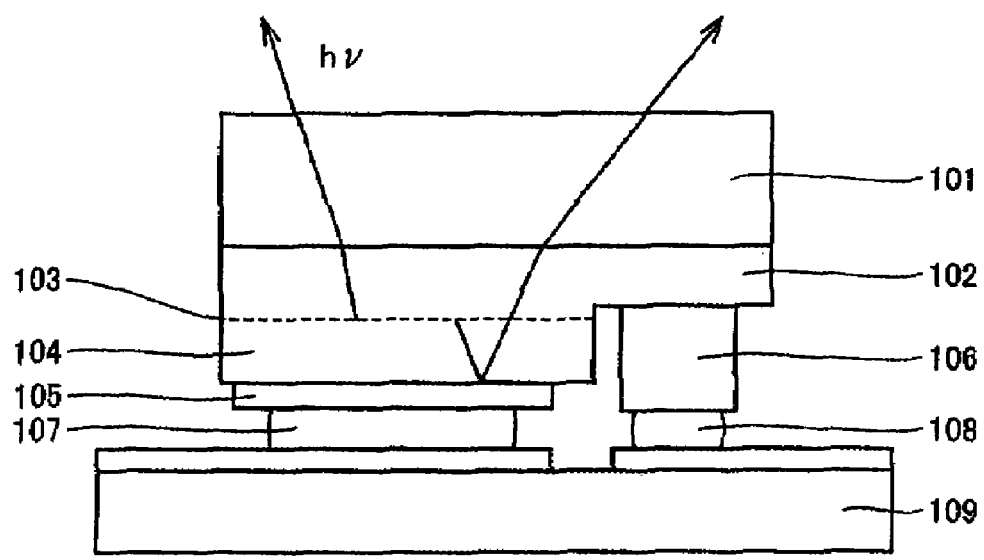
FIG. 59 is an illustration showing a conventional LED.

As illustrated in FIG. 58, above a p-top-mounted chip, a fluorescence plate 46 was placed opposite to the chip and this chip was sealed with an epoxy resin 15 to form a white light emission device.

(Tests and Test Results)

When a current of 10 A was applied to the light emitting devices constructed from the above GaN substrate, the following luminances of light emission were obtained. Inventive Example S7 generated a luminance of 800 lm and Inventive Example S8 generated a luminance of 880 lm, which were both high luminances. On the other hand, the luminance of Comparative Example T7 was 504 μm. The above results show that placing a fluorescence plate opposite to the GaN substrate in a p-down mounted construction ensures higher luminance than placing a fluorescence plate in a p-top-mounted construction. It has been proven that the luminance may be further increased by making the surface of the fluorescence plate which faces the GaN substrate to be a rough surface.

Next, embodiments of present invention, some of which overlap with the aforementioned embodiments, will be enumerated.

The above GaN substrate has been n-typed by oxygen doping and the oxygen concentration is within the range of oxygen atoms $1E17/cm^3$ to $2E19/cm^3$ and the thickness of the GaN substrate is from 100 μm to 600 μm.

By setting the oxygen concentration to $1E17/cm^3$ or more, the resistivity of the GaN substrate may be increased and currents introduced from the p-electrode may be sufficiently spread through the GaN substrate. Thus, the width of the active layer may be sufficiently utilized to cause light emission. Also, by setting the oxygen concentration to $2E19/cm^3$ or less, a transmittance equal to or higher than 60% with respect to light with a wavelength of 450 nm may be ensured and thus the transmittance of the GaN substrate which forms the emitting surface may be increased to ensure the light output. The above oxygen concentration range effectively works particularly in the case where the thickness of the GaN substrate is from 100 μm to 600 μm in a p-down-mounted construction.

Also, the above oxygen concentration is within the range of oxygen atoms $5E18/cm^3$ to $2E19/cm^3$ and the thickness of the GaN substrate is within the range of from 200 μm to 400 μm. Further, the both sides of the rectangular surface which emits light at the second main surface may be equal to or smaller than 10 mm.

With this construction, light emission may be caused through the entire light emitting surface and also sufficient light outputs may be obtained.

Also, the above oxygen concentration may be within the range of oxygen atoms $3E18/cm^3$ to $5E18/cm^3$ and the thickness of the GaN substrate may be within the range from 400 μm to 600 μm. Further, the both sides of the rectangular surface which emits light at the second main surface may be equal to or smaller than 3 mm. Also, the above oxygen concentration may be within the range of oxygen atoms $5E18/cm^3$ to $5E19/cm^3$ and the thickness of the GaN substrate may be from 100 μm to 200 μm. Further, the both sides of the rectangular surface which emits light at the second main surface may be equal to or smaller than 3 mm.

By properly setting the oxygen concentration and the chip size according to the thickness of the GaN substrate as described above, a proper GaN substrate may be set according to the chip size in view of performance (entire surface uniform light emission, light emission efficiency). Further, in view of the fabrication cost, setting of the most desirable conditions may be achieved.

A GaN substrate in which dislocation bundles are distributed on the first main surface with a density of $4E6/cm^2$ or less on average may be employed. Dislocation bundles are generated by discretely concentrating dislocations, which have been unavoidably generated during formation of the GaN substrate, in a string shape to distribute them along the substrate thick-wise direction in order to increase the crystallinity of most area of the above GaN substrate.

With this construction, light emitting devices having light outputs equal to or higher than a predetermined value may be fabricated with a high fabrication yield.

The above dislocation bundles may be distributed on the first main surface with a density of $4E2/cm^2$ or less on average and the both sides of the rectangular surface which emits light at the second main surface may be within the range of 200 μm to 400 μm.

In the case where miniaturized light emitting devices as above include dislocation bundles, degradation of their characteristics is unavoidable and this will directly lead to reduction of the yield. By reducing the density of dislocation bundles as described above, the reduction of the yield may be kept within a practically-accessible range.

Further, between the above GaN substrate and the n-type $Al_xGa_{1-x}N$ layer ($0 \leq x \leq 1$), an n-type AlGaN buffer layer may be placed in contact with the GaN substrate and an n-type GaN buffer layer may be placed in contact with the n-type AlGaN buffer layer. Further, an n-type $Al_xGa_{1-x}N$ layer ($0 \leq x \leq 1$) may be placed in contact with the n-type GaN buffer layer.

In the case of aforementioned hetelo-epitaxial laminate construction, an n-type AlGaN buffer layer and an n-type GaN buffer layer may be placed between the GaN substrate and the n-type $Al_xG_{1-x}N$ layer ($0 \leq x \leq 1$) which is a clad layer of the active layer.

By providing the n-type AlGaN buffer layer as well as the n-type GaN buffer layer between the above GaN substrate and the clad layer, a hetelo-epitaxial laminate construction with an excellent crystallinity may be formed.

Particularly, the above laminate construction may be advantageously employed in the case where the GaN substrate includes areas with an off-angle of 0.10° or less and areas with an off-angle of 1.0° or greater.

With this construction, even when the GaN substrate has warpage and the off-angle varies as described above, a heteloepitaxial laminate construction with an excellent crystallinity may be formed by providing the n-type AlGaN buffer layer as well as the n-type GaN buffer layer between the above GaN substrate and the clad layer.

Dislocation bundles may be distributed in the above GaN substrate and the dislocation bundles may be made not to be transferred to the epitaxial layers placed on the aforementioned n-type AlGaN buffer layer and the n-type GaN buffer layer placed in contact with the n-type AlGaN buffer layer.

With this construction, the fabrication yield may be significantly increased, even when a GaN substrate having a high dislocation bundles density is employed. Namely, by placing the n-type AlGaN buffer layer and the n-type GaN buffer layer as described above, dislocation bundles in the epitaxial laminate construction including the light emitting layer may be substantially removed. Namely, by the above n-type AlGaN buffer layer and the n-type AlGaN buffer layer, dislocation bundles may be terminated at the GaN substrate or near the layer thereon.

A p-type GaN buffer layer placed at the down side in contact with the above p-type $Al_xGa_{1-x}N$ layer ($0 \leq x \leq 1$) and a p-type InGaN contact layer placed in contact with the p-type GaN buffer layer may be provided.

With the aforementioned construction, the p-type InGaN contact layer with an excellent electrical conductivity may be placed as an underlayer on which the p-electrode is placed. Thus, the necessity of selecting the material of the p-electrode by placing prime importance on the work function may be reduced. Therefore, the material of the p-electrode may be selected by placing prime importance on the reflectivity, etc.

The Mg concentration of the aforementioned p-type InGaN contact layer may be within the range of Mg atoms $1E18/cm^3$ to $1E21/cm^3$.

With the above construction, the electrical conductivity may be sufficiently ensured and currents introduced from the p-electrode may be sufficiently spread through the entire epitaxial films.

A p-electrode layer constituted by an Ag layer may be provided in contact with the above p-type InGaN contact layer.

With the above construction, the reflectivity at the mounting portion or light emitting device bottom portion may be increased to reduce the light loss, thereby increasing the light output.

The above GaN substrate includes plate-shape crystal inversion domains extending continuously in the thick-wise direction and within the GaN substrate surface. The plate-shape crystal inversion domains in the GaN substrate surface and plate-shape crystal inversion domains propagated to the n-type and p-type nitride semiconductor layers formed on the GaN substrate may be removed from the p-type nitride semiconductor layers side through the n-type nitride semiconductor layers to a position inside of the GaN substrate. In contact with the left p-type nitride semiconductor layers, p-electrodes may be provided on the respective p-type nitride semiconductor layers.

With this construction, the light extracting surface may be widened, thereby increasing the light output.

In the aforementioned construction, the plate-shape crystal inversion domains may be removed to a position inside of the GaN substrate by KOH solution.

When removing the plate-shape crystal inversion domains by KOH solution, there is no need for a photo mask, and there is a merit that this process may be performed concurrently with the process for non-mirror-surface finishing the second main surface of the nitride semiconductor substrate. Therefore, by using KOH solution, the fabrication cost of the aforementioned construction may be reduced.

A first p-electrode placed discretely over the surface of the p-type nitride semiconductor layer in contact with the p-type nitride semiconductor layer and a second p-electrode formed from Ag which fills the gaps of the first p-electrode and covers the p-type nitride semiconductor layer and the first p-electrode may be provided.

With this construction, currents introduced from the p-electrode may be sufficiently spread within the surface and the reflectivity may be increased to increase the light output.

The coverage ratio of the discretely-placed first p-electrode on the surface of the p-type nitride semiconductor layer may be within the range of 10% to 40%.

With this construction, the electrical conductivity may be ensured and introduced currents may be sufficiently spread through the surface. In the case where the above coverage ratio is lower than 10%, it is impossible to flow currents through the epitaxial layers without generating discontinuity. Also, in the case where the above coverage ratio is higher than 40%, the adverse influence of the discretely-placed p-electrode on the light extraction efficiency becomes significant.

A fluorescence plate may be placed opposite to the second main surface of the nitride semiconductor substrate apart from the above the nitride semiconductor substrate.

By placing the fluorescence plate directly above the nitride semiconductor substrate constituting the light emitting portion in a p-down-mounted construction, light reflected at the fluorescence plate backside is reflected again at the nitride semiconductor substrate surface and then proceeds toward the fluorescence plate side. As a result, the light output may be increased.

The surface of the above fluorescence plate which faces the second main surface of the nitride semiconductor substrate may be subjected to a projection/depression forming process.

With the above construction, the light extraction efficiency may be further increased.

The above nitride semiconductor substrate may be utilized as a ground member for discharging the electrical power of transient voltages and static discharge to the ground.

In order to protect the light emitting device against transient voltages and static discharge applied between the nitride semiconductor substrate and the down-mounted p-type $Al_xGa_{1-x}N$ layer side, the nitride semiconductor substrate having a high electrical conductivity may be utilized as a ground member for discharging the high voltages to the ground. Consequently, there is no need to provide protection circuits such as electrical power branch circuits including Zener diodes in order to address the above transient voltages and static discharge. Transient voltages and static discharge are main factors of circuit failure for III-nitride semiconductors. When the nitride semiconductor substrate has a high electrical conductivity as described above, it may be utilized as a ground member to significantly reduce the fabrication processes and the fabrication cost.

The above light emitting device may cause light emission by applied voltages of equal to or lower than 4 V. Namely, by employing a nitride semiconductor substrate with a high electrical conductivity and therefore low electrical resistance, sufficient currents for light emission may be injected into the light emitting layer by applying low voltages to cause light emission. Consequently, less number of batteries must be mounted and this contributes to reduction of the size, weight and cost of an illumination apparatus equipped with the light emitting device. Further, this is effective in saving electrical power consumption.

The thickness of the above nitride semiconductor substrate may be 50 μm or larger.

With this construction, when currents are flowed from a dot-shaped or small-area n-electrode, electrons spread as they proceed from the surface of the GaN substrate or n-type nitride semiconductor substrate toward the inside. Therefore, it is desirable that the GaN substrate or n-type nitride semiconductor substrate has a large thickness. In the case where the thickness of the above substrate is smaller than 50 μm, when the n-electrode area is small, electrons will not sufficiently spread when they reach the active layer of a quantum well construction and accordingly there will be areas generating no light and areas generating insufficient lights in the active layer. By setting the thickness of the above substrate to equal to or greater than 50 μm, even when the n-electrode area is reduced by the low electrical resistance, currents will sufficiently spread in the substrate and the light emitting area in the active layer may be sufficiently widened. More preferably, the thickness is 75 μm or greater. However, if the thickness is too large, the absorption at the substrate becomes significant and therefore, it is desirable that the thickness is equal to or smaller than 500 μm.

The electrode may be provided on the second main surface of the above nitride semiconductor substrate with an opening ratio of 50% or more.

With this construction, the light emission efficiency at the second main surface may be increased. The higher the opening ratio, the smaller the amount of light absorbed at the n-electrode and thus the larger the light output. Therefore, the opening ratio is preferably 75% or more, and more preferably is 90% or more.

The contact area between the electrode provided on the above nitride semiconductor substrate and this nitride semiconductor substrate may be 0.055 $mm^2$ or more.

With this construction, a linear current-light output characteristic may be obtained to about 70 A with a 8 mm square-semiconductor chip, without being affected by heat generation at the electrode.

The cross section area of the bonding wire connecting the above electrode and the lead frame may be 0.002 $mm^2$ or more.

With this construction, the light emitting device may be operated to a current of 2 A without being affected by heat generation at the wire.

The cross section area of the bonding wire connecting the above electrode and the lead frame may be 0.07 $mm^2$ or more.

With this construction, the light emitting device may be operated to a current of about 70 A without being affected by heat generation at the wire.

The electrodes may be placed at two or more corners of the nitride semiconductor substrate and the sum of the contact areas between the electrodes and the nitride semiconductor substrate may be 0.055 $mm^2$ or more. Further, the sum of the cross section areas of the bonding wires connecting the electrodes placed at the corners and the lead frame may be 0.002 $mm^2$ or more.

With this construction, there will be hardly obstruction for light in the light extraction of the semiconductor chip.

The sum of the cross section areas of the bonding wires connecting the electrodes placed at the corners and the lead frame may be 0.07 mm² or more.

With this construction, there will be hardly obstruction in the light extraction and the light output efficiency may be increased.

The light emitting area in the above second main surface may be 0.25 mm² or more.

With this construction, by arranging a predetermined number of the above light emitting devices, they may be substituted for an wider range of existing illumination apparatuses. In the case where the light emitting area is smaller than 0.25 mm², the number of the light emitting devices employed becomes excessively large and they can not be substituted for existing illumination apparatuses. In the above embodiments of the present invention, the light emitting area is desired to be larger within the range where currents sufficiently spread in the nitride semiconductor substrate. This means that the lower the electrical resistance the wider the light emitting area may be made. For example, the resistivity of the nitride semiconductor substrate is 0.01 ohm-cm, the light emitting area may be set to about 8 mm×8 mm as Inventive Example F.

The light emitting area of the second main surface of the above nitride semiconductor substrate may be a size equal to or larger than 1 mm×1 mm. The light emitting area of the second main surface of the above nitride semiconductor substrate may be a size equal to or larger than 3 mm×3 mm. Further, The light emitting area of the second main surface of the above nitride semiconductor substrate may be a size equal to or larger than 5 mm×5 mm.

As described above, by widening the area of the light emitting surface, the number of light emitting devices mounted in an illumination apparatus may be reduced. Thus, reduction of the number of process steps, the number of components and the electrical power consumption may be realized. For conformation, a size equal to or larger than 1 mm×1 mm means a size including 1 mm×1 mm.

The above light emitting devices, including light emitting devices formed on an AlN substrate, may be formed to have a heat resistance of 30° C./W or less.

The light emission efficiency of a light emitting device is degraded due to temperature increases. Further, if excessive temperature increases are caused, the light emitting device will be damaged. Therefore, the temperature resistance or heat resistance of light emitting devices are an important design factor. Conventionally, the heat resistances have been set to about 60° C./W (see the above patent literature 1). However, by setting the heat resistance to 30° C./W or less as previously described, the light emission efficiency will not significantly decrease or the light emitting device will not be damaged even when sufficient electrical power is supplied to the light emitting device. The above reduction in the heat resistance to half was realized by using a GnN substrate with a low resistivity as described above.

Further, in the above light emitting device, the temperature of the portion at which the temperature increases most largely in continuous light emitting conditions may be 150° C. or lower.

With this construction, the temperature of the portion at which the temperature increases most largely, namely the temperature of the light emitting layer, may be 150° C. or lower and thus a sufficiently high light emission efficiency may be ensured. Further, the life may be largely extended as compared with conventional light emitting devices.

Preferably, the thickness of the n-type nitride semiconductor layer is 3 μm or less.

The n-type nitride semiconductor layer is formed on the nitride semiconductor substrate by epitaxial growth. If it is made too thick, it will take longer time to perform film growing processes and also the material cost will be increased. By setting the thickness of the n-type nitride semiconductor layer to 3 μm or less as previously described, significant cost reduction may be achieved. More preferably, it is 2 μm or less.

A non-mirror-surface finishing may be applied to the area of the second main surface of the above nitride semiconductor substrate which is not coated with the electrode.

With this construction, it may be prevented that light generated at the light emitting layer is reflected at the second main surface, namely the emitting surface, and thus confined within the substrate, which results in lowered efficiency. It goes without saying that the non-mirror-surface finishing may be applied to the side surfaces of the laminate construction. The above surface which has been non-mirror surface finished is a surface which has been non-mirror surface finished by using a potassium hydroxide (KOH) solution, sodium hydroxide (NaOH) solution, or ammonia ($NH_3$) solution or other alkali solutions.

By the above non-mirror-surface finishing, a surface with large projections and depressions may be efficiently obtained. The Ga-surface side is not etched.

The above surface which has been non-mirror surface finished may be a surface which has been non-mirror surface finished by using at least one of sulfuric acid ($H_2SO_4$) solution, hydrochloric acid (HCl) solution, phosphoric acid ($H_2PO_4$) solution, hydrofluoric acid (HF) solution or other acid solutions.

Also, the above surface which has been non-mirror surface finished may be a surface which has been non-mirror surface finished by using RIE. Thus, by dry processing, a non-mirror surface with an excellent dimension accuracy may be obtained. Also, by either RIE which is dry etching or wet etching using alkali solution in combination with photolithography technique, a predetermined projections/depressions pitch may be obtained.

The electrode formed on the above p-type nitride semiconductor layer may be formed from a material with a reflectivity of 0.5 or more.

With this construction, light absorption at the mounted surface side may be prevented and the amount of light reflected toward the second main surface of the above substrate may be increased. Preferably, the resistivity is higher and is 0.7 or more.

A fluorescence member may be placed to cover the second main surface of the above nitride semiconductor substrate. Also, the nitride semiconductor substrate may include at least one of impurities or defects which generate fluorescence.

With the above construction, a white LED may be constructed.

The light emitting device of the present invention may include two or more above light emitting devices and these light emitting devices may be connected in serial.

With the above construction, an illumination apparatus including a plurality of the above high efficiency light emitting devices mounted on a lead frame, etc., may be obtained by employing a high voltage power supply. For example, batteries for automobile are about 12 V and therefore the light emitting devices of the present invention may be serially connected in four or more stages to cause light emission.

Also, the light emitting device of the present invention may include two or more above light emitting devices and these light emitting devices may be connected in parallel.

With the above construction, an illumination apparatus constituted by the above high efficiency light emitting devices may be obtained by employing a high voltage power supply.

The light emitting device may further include other light emitting devices of the present invention and a power supply circuit for causing the light emitting devices to generate light emission and in the power supply circuit, two or more parallel sections in which two or more light emitting devices are connected in parallel are connected in serial.

With this construction, it is possible to match the capacity of the illumination apparatus and the capacity of the power supply while satisfying the light emission conditions of the individual light emitting devices. Also, the above power supply circuit may include a parallel/serial switching portion in the case where the capacity of the illumination apparatus is to be variable and the wiring applied to the light emitting devices may be switched by the parallel/serial switching portion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting apparatus comprising:
   a GaN substrate which is a nitride semiconductor substrate;
   an n-type $Al_xGa_{1-x}N$ layer (x is in the range of from 0 to 1) which is an n-type nitride semiconductor layer at a first main surface side of said GaN substrate;
   a p-type $Al_xGa_{1-x}N$ layer (x is within the range of from 0 to 1), at said first main surface side, placed more distantly from said GaN substrate than said n-type $Al_xGa_{1-x}N$ layer; and
   a light emitting layer, at said first main surface side, placed between said n-type $Al_xGa_{1-x}N$ layer and said p-type $Al_xGa_{1-x}N$ layer, wherein
   said GaN substrate includes plate-shape crystal inversion domains extending continuously in a plane shape in the thick-wise direction and a single direction within the GaN substrate surface, the plate-shape crystal inversion domains within the GaN substrate surface and plate-shape crystal inversion domains propagated to said n-type and p-type nitride semiconductor layers formed on said GaN substrate are removed from said p-type nitride semiconductor layers side through said n-type nitride semiconductor layers to a position inside of said GaN substrate, and in contact with the left p-type nitride semiconductor layers, p-electrodes are provided on the respective p-type nitride semiconductor layers.

2. The light emitting apparatus according to claim 1, wherein
   said plate-shape crystal inversion domains are removed to a position inside of said GaN substrate by KOH solution.

* * * * *